(12) United States Patent
Hurwitz

(10) Patent No.: US 10,859,605 B2
(45) Date of Patent: Dec. 8, 2020

(54) CURRENT SENSOR AND A METHOD OF MANUFACTURING A CURRENT SENSOR

(71) Applicant: Analog Devices International Unlimited Company, Limerick (IE)

(72) Inventor: Jonathan Ephraim David Hurwitz, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 425 days.

(21) Appl. No.: 15/453,100

(22) Filed: Mar. 8, 2017

(65) Prior Publication Data
US 2017/0356935 A1 Dec. 14, 2017

Related U.S. Application Data

(63) Continuation-in-part of application No. 15/179,249, filed on Jun. 10, 2016, now Pat. No. 10,416,195.

(51) Int. Cl.
*G01R 15/18* (2006.01)
*G01R 3/00* (2006.01)
*G01R 19/12* (2006.01)

(52) U.S. Cl.
CPC ............ *G01R 15/181* (2013.01); *G01R 3/00* (2013.01); *G01R 19/12* (2013.01)

(58) Field of Classification Search
CPC . G01R 1/20; G01R 1/22; G01R 1/203; G01R 15/146; G01R 19/0007;
(Continued)

(56) References Cited

U.S. PATENT DOCUMENTS 5,414,400 A * 5/1995 Gris ................. G01R 15/181
336/174
6,018,239 A * 1/2000 Berkcan ............... G01R 15/181
324/127
(Continued)

FOREIGN PATENT DOCUMENTS

DE 102007046054 4/2008
EP 1183543 3/2002
(Continued)

OTHER PUBLICATIONS

"Base-PCB Rogowski Coil, Shanghai Pinyan M&C Technology Co. Ltd.", [online]. (c) 2016 Media Data Systems Pte Ltd. [retrieved on Aug. 9, 2016]. Retrieved from the Internet: <URL: http://www.globalsources.com/si/AS/Shanghai-Pinyan/6008845472268/pdtl/Base-PCB-Rogowski-coil/1052501247.htm>, (2016), 3 pgs.
(Continued)

*Primary Examiner* — Tung X Nguyen
*Assistant Examiner* — Robert P Alejnikov, Jr.
(74) *Attorney, Agent, or Firm* — Schwegman Lundberg & Woessner, P.A.

(57) ABSTRACT

The present disclosure provides an improved Rogowski-type current sensor. The current measurement coil, and the compensation coil are provided on the same board. The measurement coil and the compensation coil are arranged such that they at least partially overlap by virtue of each repeatedly changing side of the board. This arrangement makes the current sensor far better at rejecting interference than certain other PCB Rogowski type coil arrangements.

37 Claims, 36 Drawing Sheets

(58) Field of Classification Search
CPC .... G01R 15/181; G01R 19/0092; G01R 3/00; G01R 19/12
USPC ................................................ 324/126, 127
See application file for complete search history.

(56) References Cited

U.S. PATENT DOCUMENTS

| | | | |
|---|---|---|---|
| 6,313,623 | B1 | 11/2001 | Kojovic et al. |
| 6,313,727 | B1* | 11/2001 | Gabriel ................ G01R 15/181 336/174 |
| 6,414,475 | B1 | 7/2002 | Dames et al. |
| 6,624,624 | B1 | 9/2003 | Karrer et al. |
| 6,677,850 | B2 | 1/2004 | Dames |
| 6,734,661 | B2 | 5/2004 | Colby et al. |
| 7,227,442 | B2 | 6/2007 | Skendzic |
| 7,307,410 | B2 | 12/2007 | Shiokawa et al. |
| 7,902,812 | B2 | 3/2011 | Kojovic |
| 8,890,509 | B2 | 11/2014 | Dames et al. |
| 10,416,195 | B2 | 9/2019 | Hurwitz et al. |
| 10,739,384 | B2 | 8/2020 | Tang et al. |
| 2004/0178875 | A1 | 9/2004 | Saito |
| 2007/0114992 | A1 | 5/2007 | Muniraju et al. |
| 2007/0152651 | A1* | 7/2007 | Shiokawa ............ G01R 15/181 324/76.11 |
| 2007/0290695 | A1* | 12/2007 | Mahon ................. G01R 15/181 324/713 |
| 2009/0230948 | A1 | 9/2009 | Kojovic |
| 2014/0167740 | A1* | 6/2014 | Gilbert ................ G01R 15/181 324/127 |
| 2014/0266269 | A1 | 9/2014 | Ausserlechner et al. |
| 2015/0204914 | A1* | 7/2015 | Fujii .................... G01R 15/181 324/207.17 |

FOREIGN PATENT DOCUMENTS

| | | |
|---|---|---|
| EP | 1183543 | 4/2003 |
| EP | 1793234 | 6/2007 |
| WO | 2007016832 | 2/2007 |
| WO | 2007061832 | 5/2007 |
| WO | 2014201937 | 12/2014 |
| WO | 2017211599 | 12/2017 |

OTHER PUBLICATIONS

"PCB based B-Field Probe", EEVblog Electronics Community Forum [online]. [retrieved on Aug. 9, 2016]. Retrieved from the Internet: <URL: EEVblog Electronics Community Forum>, (2016), 3 pgs.

"Pulse Electronics Sidewinder(r)—Current Sensor", (2016), 6 pgs.

"Taehwatrans Current Transformer Specification, Model No. TMR120L", (2016), 1 pg.

"Taehwatrans Current Transformers Catalog", (2-13), 52 pgs.

Artero, J. A., et al., "Influence of External Currents in Sensors Based on PCB Rogowski Coils", [online]. [archived Feb. 9, 2014]. Retrieved from the Internet: <URL: https://web.archive.org/web/20140209110025/http://icrepq.com/full-paper-icrep/274-artero.pdf>, (2014), 1-4

Lisowiec, Aleksander, et al., "Air core transducer with increased measurement sensitivity", Przeglad Elektrotechniczny, R. 91, Nr. 4, (2015), 33-35.

Murgatroyd, P. N., et al., "Geometrical Properties of Rogowski Senors", IEEE Colloquium on Low Frequency Power Measurement and Analysis, (1994), 9 pgs.

Ripka, Pavel, "Electric current sensors: a review", Meas. Sci. Technol., 21, (2010), 1-23.

Votzi, et al., "Low-Cost Current Sensor for Power Capacitors Based on a PCB Rogowski-Coil", Paper 103, PCIM Europe May 17-19, 2011, Nuremberg, Germany, (2011), 621-626.

"International Application Serial No. PCT EP2017 062778, International Search Report dated Oct. 6, 2017", 7 pgs.

"International Application Serial No. PCT EP2017 062778, Written Opinion dated Oct. 6, 2017", 10 pgs.

"U.S. Appl. No. 15/179,249, Non Final Office Action dated Aug. 28, 2018", 23 pgs.

"U.S. Appl. No. 15/179,249, Examiner Interview Summary dated May 30, 2019", 3 pgs.

"U.S. Appl. No. 15/179,249, Final Office Action dated Mar. 21, 2019", 18 pgs.

"U.S. Appl. No. 15/179,249, Notice of Allowance dated Jun. 13, 2019", 10 pgs.

"U.S. Appl. No. 15/179,249, Response filed May 21, 2019 to Final Office Action dated Mar. 21, 2019", 10 pgs.

"U.S. Appl. No. 15/179,249, Response filed Jan. 24, 2019 to Non Final Office Action dated Aug. 28, 2018", 11 pgs.

"U.S. Appl. No. 15/179,249, Restriction Requirement dated Feb. 26, 2018", 11 pgs.

"U.S. Appl. No. 15/179,249, Response filed Apr. 16, 2018 to Restriction Requirement dated Feb. 26, 2018", 8 pgs.

"European Application Serial No. 20188058.0, Extended European Search Report dated Sep. 7, 2020", 7 pgs.

\* cited by examiner

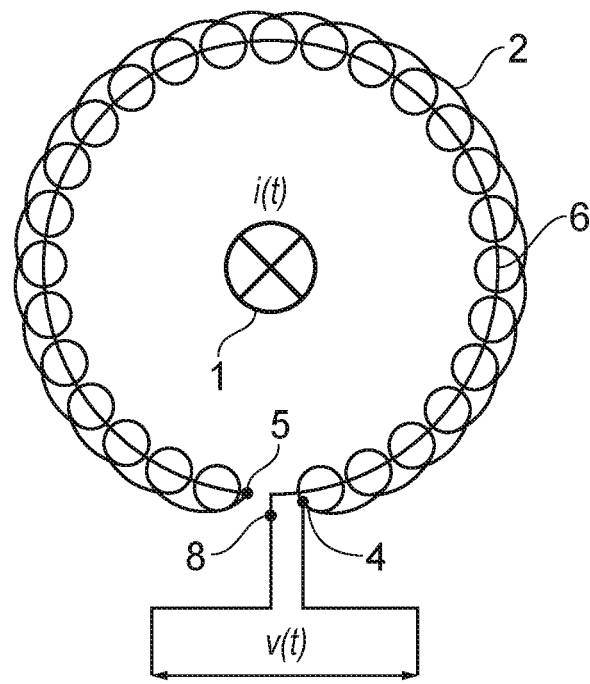
FIG. 2
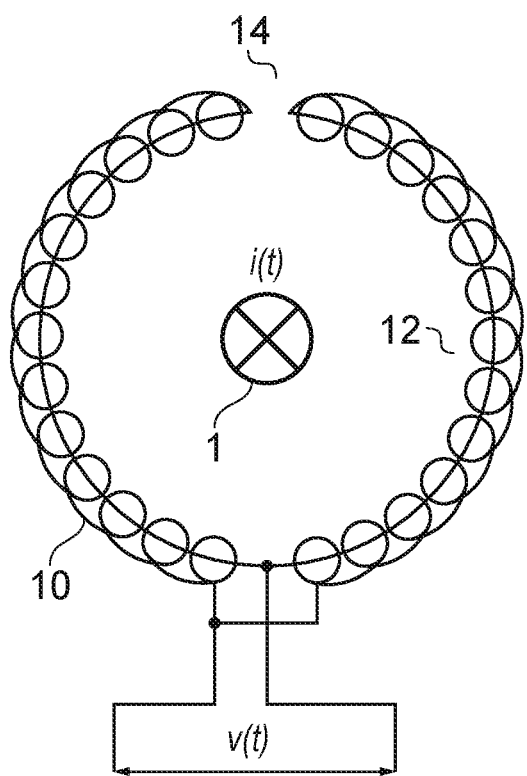 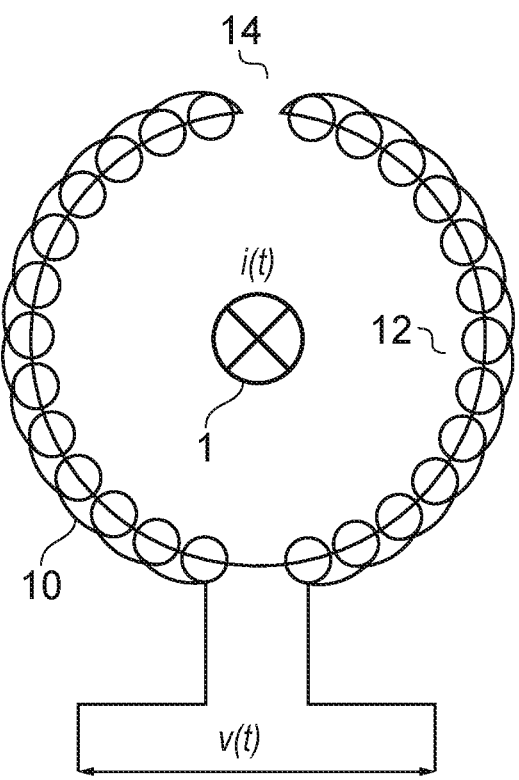
FIG. 3a          FIG. 3b

CURRENT SENSOR AND A METHOD OF MANUFACTURING A CURRENT SENSOR

RELATED APPLICATIONS

This application claims the benefit of priority of U.S. patent application Ser. No. 15/179,249, which was filed on 10 Jun. 2016, the content of which is hereby incorporated by reference herein in its entirety.

TECHNICAL FIELD

The present disclosure relates to current sensors and methods of manufacturing current sensors.

BACKGROUND

A current sensor is an electrical device which detects and measures the electrical current passing through a conductor. Current sensors are required in many applications such as energy meters, electrical generators and circuit protection systems. There are two main types of current sensors. The first type introduces a "shunt" resistance into the circuit. This involves placing a resistor in series with the conductor, and measuring the voltage across the resistor. Shunts work well for currents under a few hundred amps. For higher currents, heating occurs in the shunt which makes accurate measurement more difficult to manage due to the change in the shunt resistance. Other factors, such as oxidation or variations in contact resistance can also detract from the use of shunts. Furthermore, because the shunt is electrically connected to the conductor, suitable isolation methods are required to interface the shunt with processing electronics. The second type of current sensor uses an electromagnetic transducer. Electromagnetic transducers work by detecting changes in the magnetic fields generated by the current carrying conductor. As such, there is no need for an electric connection with the conductor, and electromagnetic transducers are therefore naturally isolated from the conductor. This is a desirable feature of such transducers.

Two main types of magnetic field transducer are used for current sensing. The first type uses a highly permeable magnetic core. Such devices are susceptible to tampering, because if a permanent magnet is brought into close proximity with the device, its output can be manipulated. This is because the permanent magnet causes the permeable core to saturate, which renders the transducer substantially insensitive to the time-varying currents it should be detecting. Magnetic cores are also susceptible to gain and phase changes as a function of the current being measured. This can be undesirable. The second type of electromagnetic transducer consists of a conductive helical measurement coil formed as a toroid. Such coils are commonly referred to as Rogowski coils. A benefit of Rogowski coils is that they do not contain a magnetic core, and as such are immune to tampering using permanent magnets. One problem with Rogowski coils is that they are susceptible to interference from nearby current carrying conductors. To address this Rogowski coils include a so-called compensation conductor. One end of the compensation conductor is passed through the measurement coil to form a loop within the helical measurement coil. The helical measurement coil is for detecting currents in a conductor encircled by the toroid. The compensation conductor is used to form an opposing loop for cancelling the effect external fields generated by conductors passing close to the Rogowski coil. However, even with a compensation conductor, Rogowski coils can be subject to interference from adjacent current carrying conductors if the compensation conductor is positioned poorly.

SUMMARY OF THE DISCLOSURE

With the rapid rise in more sophisticated energy meters that report energy usage to a central network (so called smart meters), there is an increased demand for accurate and interference resistant current sensors. Furthermore, there is a drive towards producing such sensors using printed circuit board (PCB) technology and to utilize mass production surface mount technology (SMT) in order to drive down costs. Several examples of PCB Rogowski type coils are available. However, these PCB Rogowski type coils tend to suffer from poor performance, as the designers introduced compromises in the design of the Rogowski coil in order to accommodate transferring the coil onto a PCB arrangement. For example, resistance to external interference is reduced, largely because of an absence of any sort of compensation conductor, or the use of sub-optimal compensation conductor arrangements. For example, the compensation conductor may be provided as a loop outside of the measurement coil or in a plane offset from the central plane of the measurement coil.

The present inventors have recognized, among other thingsw, that there is a desire for an improved Rogowski-type current sensor which can manufactured on a printed circuit board, and preferably on a double layer board, i.e. one having two conductive layers. In this context "printed circuit board" should be construed broadly to include substrates carrying conductive regions which may be etched, deposited, printed, transferred or otherwise formed. Printing may include the use of additive (3D) printers.

According to a first aspect of the present disclosure an improved Rogowski-type current sensor is provided. The current measurement conductor and the compensation conductor are provided on the same substrate. The current measurement conductor is formed into a measurement coil. Preferably the measurement conductor advances between adjacent turns of the measurement coil along an advancement path. Advantageously the effective path of the compensation conductor is substantially coincident with the advancement path of the measurement conductor. The shape of the compensation coil may be substantially the same as the shape of the advancement path of the measurement conductor. The substrate may be a printed circuit board.

The measurement coil and the compensation conductor are arranged such that their paths may at least partially overlap. Advantageously the compensation conductor is formed on the same surfaces as the measurement coil. The compensation conductor may run adjacent the advancement path of the measurement coil in an interwoven or helical like fashion. This arrangement makes the current sensor of the present disclosure far better at rejecting interference than prior art PCB arrangements.

Preferably the measurement coil is formed using a two sided board, i.e. a board which has two etchable conductive layers, one on each major surface of the board. Thus the use of expensive multilayer boards can be avoided. However, in some variations where a target conductor carrying the current to be measured makes a plurality of passes through the Rogowski-type coil or when the electronic circuits associated with the Rogowski-type coil benefit from the provision of extra layers, for example to include a communications function, then it may be advantageous to use a board having more than two layers. The designer would still have the option to use only two layer or to use more than two layers.

A two layer board may be provided by securing two single layer boards together with suitable connections between the boards.

The circuit board may have at least one aperture formed therein such that at least one current carrying conductor can pass through the Rogowski type current sensor to have the current therein measured. Additionally and/or alternatively one or more current carrying paths may be provided by conductive paths formed within the substrate (circuit board or circuit boards) carrying the Rogowski type current sensor.

In some embodiments as single current carrying conductor may make several passes through the Rogowski coil type current sensor. If a current conductor makes N passes through the Rogowski coil type current sensor then an N fold increase in output voltage is observed. This is equivalent to placing N Rogowski coil type sensors in series. In other embodiments two conductors carrying different phases of a supply, for example in a three wire single phase supply, may be arranged to pass though the Rogowski type current sensor with the "direction" of traversal being reversed between the conductors to account for the fact that one of the phases is notionally 180 degrees apart with respect to the voltage measured across the phases. The three wire single phase supply is commonly used in North America for light commercial and residential applications. In such an arrangement the conductor (line) voltages are 110 or 120V with respect to ground and 220 or 240V with respect to each other. In other embodiments an outward conductor may convey current to a device, such as a relay or circuit breaker, and a return conductor may carry the same current back from the relay. In such a system the outward and return conductors may be arranged to pass though the Rogowski type current sensor with the direction of current flow through the aperture of the sensor being in such a way that the magnetic fields from the conductors are additive to as to increase the magnitude of the sensed signal. Alternatively each conductor may be associated with a respective Rogowski type current sensor and the signals form the sensors can be combined in an additive or subtractive way, as appropriate, to achieve greater sensitivity or combine signals in the appropriate manor.

Preferably a first surface of the board has a first plurality of measurement coil tracks formed thereon. The tracks may have substantially linear (straight) major portions extending between first and second end portions. The major portions are preferably (but not necessarily) arranged in a pattern such that extensions of the axis of each major portion of a co-operating group of tracks pass through a common point or common axis. In an embodiment the major portions are arranged radially around an aperture, or around the path of the current carrying conductor as it passes through the sensor. Where the current carrying conductor makes a plurality of passes though the sensor or where multiple conductors pass through the sensor then the major portions may be arranged radially about an effective mid-point of the current carrying paths. For ease of reference in this disclosure the first surface will be referred to as an upper or top surface of the board, and tracks will be referred to as upper radial elements.

Preferably a second surface of the board has a second plurality of measurement coil tracks formed thereon. The tracks may have substantially linear major portions extending between first and second end portions. The major portions are preferably (but not necessarily) arranged in a pattern such that extension of the axis of each major portion of a co-operating group of tracks pass through a common point or through the common axis. In an embodiment the major portions are arranged radially around the aperture, or around the path of the current carrying conductor as it passes through the sensor. Where the current carrying conductor makes a plurality of passes though the sensor or where multiple conductors pass through the sensor then the major portions may be arranged radially about an effective mid-point of the current carrying paths. For ease of reference the second surface will be referred to as a lower or bottom surface and the tracks will be referred to as lower radial elements.

The first end portion may be a radially innermost portion of each track and the second end portion is a radially outermost part of each track.

Preferably the major portions of tracks on the first side of the board align with the major portions of the tracks on the second side of the board. The extent to which the tracks can exactly match and overlay each other provides sensor performance improvement in respect of rejection of unwanted fields.

Although it is desirable that the major portions of the tracks on the first and second surfaces have substantially linear portions this is not a strict requirement of this disclosure. The matching of the track shapes on opposing sides of the board is more important, but it can be seen that forming tracks having major portions that are linear is a relatively easy way to obtain the desired registration between the tracks on opposing sides of the board.

The radial elements are connected using through board connections, such as vias formed in the board. The upper radial elements are arranged in a first plane, and the lower radial elements are formed in a second parallel plane. The upper radial elements are arranged so that they are aligned with the lower radial elements, such that a pair of radial elements form a radial plane that is perpendicular to the surface of the board. This symmetry ensures excellent sensitivity to currents in the conductor whilst enhancing rejection of unwanted signals.

Although circular measurement coil arrangements are preferred because of the high degree of symmetry, other shapes can be formed. Other shapes, such as rectangles can achieve a more efficient use of board space as they can be packed more densely than circles. Triangular, rectangular and polygonal shapes can be formed. Regular shapes are preferred, but to a first order, the path or shape of the measurement coil is not a factor in the response of the measurement coil. That said, it is believed that second and higher order effects are reduced with larger degrees of rotational symmetry in the measuring coil shape, leading naturally to the selection of circular forms for the Rogowski-like coil, or of measurement coil sections that can be combined to approximate a circular (or other shaped) coil.

In a second aspect the present disclosure provides a current sensing system, comprising at least one sensor according to the first aspect, the at least one sensor having an output, and a signal processing circuit coupled to the output, wherein the signal processing circuit is positioned on the circuit board.

In an embodiment the present disclosure provides a current sensing system, comprising: at least two sensors according to the first aspect, wherein each sensor or a part of each sensor is formed on the same board, and each of the at least two sensors is for sensing current in a different current carrying conductor.

The current carrying conductors may be first and second conductors in a single phase system, for example a 3 wire single phase system as used in the United States of America, or a single phase live and neutral configuration as found in Europe, or may be used to measure the current in the outward and return conductors of a load or a device or an element such as a disconnect relay. The provision of three sensors on a board is useful for monitoring current in three-phase systems. In some embodiments the outputs from the sensors may be separately processed by way of separate electronics, or shared electronics operating in a time multiplexed manner. In other embodiments the outputs of the sensors may be combined, for example by virtue of the sensors being wired in series, before being supplied to the measurement electronics.

Advantageously an embodiment of this disclosure provides a current sensing coil comprising: a double-sided substrate having an aperture therein for a target conductor carrying a current to be measured to pass though the substrate or having an inbuilt current flow path provided to carry the current to be measured; a first set of elements formed on a first side of the substrate around the aperture or current flow path; a second set of elements formed on a second side of the substrate around the aperture or current flow path; and a plurality of vias formed in the double-sided substrate and arranged to connect ends of the first set of radial elements to respective ends of the second set of radial elements; wherein each element on the first side of the substrate is aligned with a respective element on the second side of the substrate such that the pair of respective elements form a plane which is orthogonal to the surfaces of the substrate, the double sided substrate further carrying a compensation conductor passing adjacent linking structures that connect radial element to an angularly offset adjacent element and where the distance of the innermost ends of adjacent elements to aperture or current flow path varies.

Preferably the elements are radial elements that extend radially from the aperture or the current flow path.

It is thus possible to increase the number of radial elements as beyond the number which could be formed if all the vias were formed at the same radius.

Preferably the linking structures that advance the measurement coil around the aperture are only formed at one radius or around the edge of a regular geometric shape. In some embodiments the linking structures are formed at the second (radially outermost) end of the radial elements.

In a further aspect of this disclosure there is provided a measurement circuit for use with a Rogowski type current sensor, the measurement circuit including a temperature dependent gain correction to reduce the gain of the measurement circuit as the temperature rises. The decrease in gain is selected to match the increase in output from the Rogowski type coil sensor resulting from thermal expansion of the measurement coil. A larger coil cuts more magnetic flux from the target conductor and hence has a larger output.

The gain reduction may be provided by forming an inverting amplifier. The gain of the amplifier can be controlled by a first resistance in a path from the Rogowski coil to the inverting input of the amplifier, and by the feedback resistance. The inventor realized that if the temperature coefficient of the feedback resistor was less than the temperature coefficient of the coil forming part of the first resistance then the gain of the amplifier could vary with temperature to mitigate the effects of the material forming or defining the thermal expansion of the measurement coil. Advantageously the first resistance is formed from at least two resistors, one being the metal used to form the Rogowski coil and the other or others being of the same material as the feedback resistor.

The inventor also realized that the amplifier would drive a load, such as an analog to digital converter. The temperature coefficient of the input resistance of the converter might change and this can interact with the output impedance of the amplifier and/or matching networks intermediate the amplifier and the analog to digital converter. Temperature variation at an attenuator between the amplifier and the amplifier and the Analog to digital converter can also be used to mitigate the effects of thermal expansion of the Rogowski type sensor.

Further features of the disclosure are provided in the appended claims.

BRIEF DESCRIPTION OF THE DRAWINGS

The present disclosure will now be described, by way of non-limiting example, with reference to the accompanying drawings, in which:

FIG. 2 is a schematic representation of a Rogowski coil with a compensation coil;

FIG. 3a shows a split Rogowski coil where the compensation coil is center tapped and the outputs of each of the two half measurement coils are combined; and FIG. 3b shows a split Rogowski coil where the compensation coil connects to a first end of each half measurement coil and a second end of each half measurement coil provides an output signal, the first ends of the measurement coils being adjacent each other, and the second ends being adjacent each other;

DETAILED DESCRIPTION OF EMBODIMENTS OF THE DISCLOSURE

Figure 1:
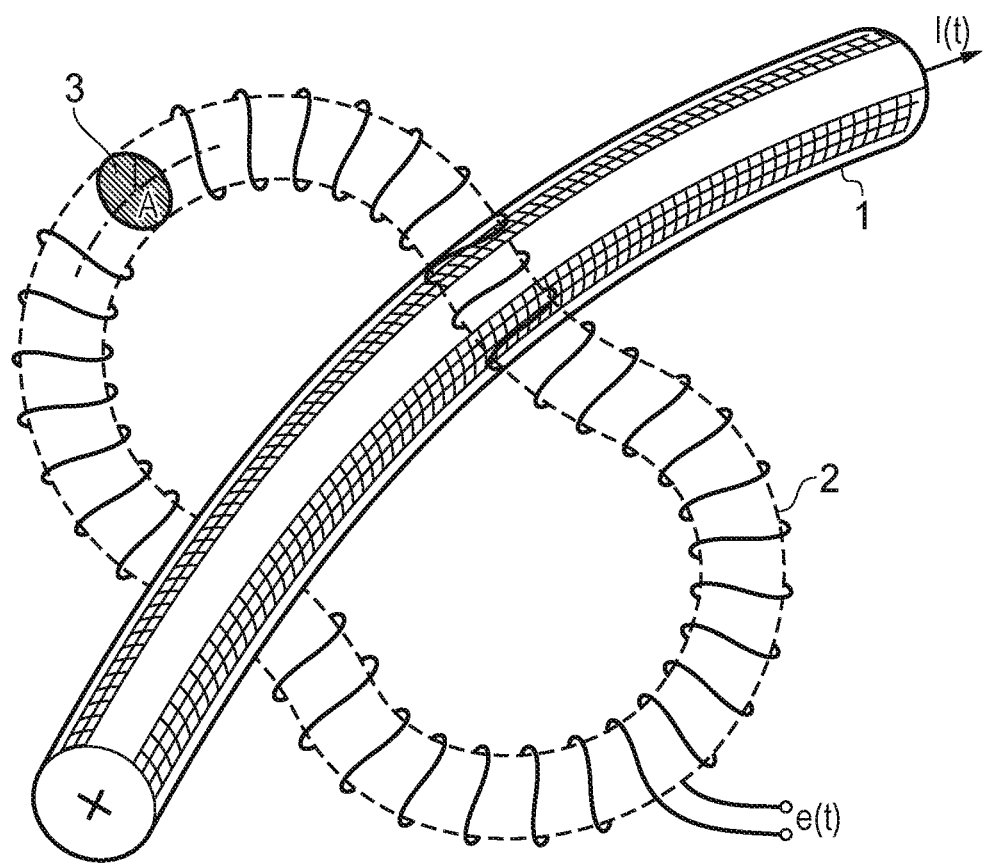
FIG. 1 is a schematic view of a Rogowski coil di/dt current sensor.

In an embodiment of the disclosure, a current sensor is provided using a single double sided circuit board (a board having tracks on only its opposing sides). The use of a single printed circuit board with only two conducive layers reduces cost and simplifies manufacture as the sensor can be on the same board that carries the processing electronics required to process the output of the sensor. Advantageously a toroidal current measurement coil is provided on the board. A compensation conductor is provided on the same board. The board includes an opening through which a current carrying conductor may pass. The compensation conductor is provided in association with the current measurement coil such that the average distance of the compensation conductor from the aperture is similar to the average distance of the coil advancement path formed between adjacent "turns" of the measurement coil. The compensation conductor may be formed in a number of different patterns, but typically is provided so that it is substantially formed within or adjacent the outer edge the coil. Preferably the shape of the compensation conductor is substantially the same as the shape of the advancement path of the measurement conductor. The arrangement provides a significant improvement in terms of interference rejection over the prior art PCB Rogowski coil arrangements in which the compensation wire is either omitted or provided outside the area defined by the coil.

Preferably the board is a two-sided board, and the measurement coil is formed on the upper and lower sides of the board. An upper set of measurement coil tracks is formed on the upper side, and a lower set of measurement coil tracks is formed on the lower side of the board. The measurement coil tracks are delimited by first and second end portions. The first end portion is provided proximal the aperture and the second end portion is provided distal the aperture. The upper and lower measurement coil tracks may be connected using vias formed in the board. In one embodiment, one end of the measurement coil is connected to the compensation conductor and the compensation conductor retraces the path of the measurement coil. Advantageously the upper measurement coil tracks are aligned with the lower measurement coil tracks, forming planes that are perpendicular to the surface of the board and which extend away in a radial fashion from the aperture. This is achieved by using connecting regions that extend in a different direction, which can be regarded as "kinks" at, for example, the second ends, i.e. the outer ends, of each measurement coil track in order to make an electrical connection with the vias. The kinks are formed within an edge space defined by the vias, and as such the lengths of the measurement coil tracks are not significantly compromised. The symmetry that results makes the coil substantially insensitive to currents when compared with the sub-optimal PCB coil arrangements shown in the prior art.

In view of the above, the present disclosure provides a PCB-based current sensing coil with good interference rejection and which accurately detects currents in the conductor passing through the aperture.

A Rogowski coil can take many forms, and it is worthwhile considering these such that terms used herein are not interpreted in an overly restrictive manner. Rogowski coils can be formed as flexible devices, for example in the form of a flexible tube that carries a helically wound measurement coil, and where the flexible tube is, in use, wrapped around a conductor carrying a current that is to be measured. The Rogowski coil need not have a predetermined shape. Nor need it be closed into a loop. In fact to a first order approximation the shape of the measurement coil is unimportant. Similarly to a first order approximation the shape of the turns of the measurement coil are unimportant but the area enclosed by each turn should be the same.

FIG. 1 schematically illustrates a known Rogowski coil where a current carrying conductor, which can be regarded as a target conductor 1, passes through a measurement coil 2 formed by a helically wound measurement conductor. The measurement coil 2 is wound as a helix around a former such that the helix encloses a cross-sectional area A designated by shaded region 3.

The progression of the measurement conductor used to form the measurement coil effectively forms a one turn coil in the plane of the measurement coil which is sensitive to magnetic fields from current carrying conductors other than the target conductor. The orientation of these other conductors may not be known and there may be several of them in close proximity. To address this parasitic coil formed by the advancement of the measurement conductor Rogowski coils are usually made with a compensation conductor. The compensation conductor is formed as a one turn compensation coil whose response is opposed to that the parasitic coil inadvertently formed by the measurement coil.

A Rogowski coil including a compensation conductor shaped to form a compensation coil is schematically illustrated in FIG. 2. The measurement coil 2 is formed as a nearly complete loop which has a circuit connection node 4 at one end of the measurement coil and which is attached at its other end, designated as node 5, to the compensation coil 6. The compensation coil 6 returns along the looped path formed by the measurement coil 2 to a second circuit connection node 8 physically close to node 4. A voltage V(t) is developed between nodes 4 and 8 in response to a changing current flowing in the conductor 1. It should be noted at a connection can also be made to node 5, for example to connect it to a reference voltage, if a differential output is required from the Rogowski coil of FIG. 2.

The Rogowski coil can also be provided in segments. Such an arrangement can be referred to as a "segmented Rogowski coil". FIGS. 3a and 3b show Rogowski coils provided as two half coils 10 and 12 that extend towards an opening 14. The opening may be arranged such that a target conductor can be passed through the opening 14. Thus such an arrangement can be clipped around the target conductor without the target conductor being disconnected. It can be seen that in such an arrangement the individual sensing coils and individual measurement conductors do not form a complete loop. The teachings of this disclosure apply to and include such segmented coils as well as complete Rogowski coils.

For sensitivity, the Rogowski coil benefits by enclosing a large volume A, as designated by item 3 in FIG. 1. However, it is also desirable to closely control the geometry of coils as although the coils are insensitive to shape and cross section to a first order, changes in shape and cross section can manifest themselves as higher precisions are required or as the space available to the coil reduces. Forming the Rogowski coil on a rigid circuit board would provide greater control of the coil shape. Additionally the use of printed circuit boards is widespread for supporting electronic components and there would be cost advantages to fabricating Rogowski coils on a printed circuit board and the shape of the coil would be much more reproducible from coil to coil.

In accordance with the teachings of this disclosure printed circuit boards can be used to form segmented Rogowski coils. Segmented Rogowski like coils may be provided on a plurality of circuit boards. Multiple boards can be secured together with suitable conductive contacts making connections between the boards. Such an approach may facilitate installation of a Rogowski type current sensor around an existing current carrying target conductor. The boards may be formed in an enclosure or a mechanical arrangement allowing them to clamp on to and substantially encircle the conductor with a minimal air gap between the boards after closure/attachment. A plurality of boards may be provided on two or more planes to facilitate this.

Figure 4:
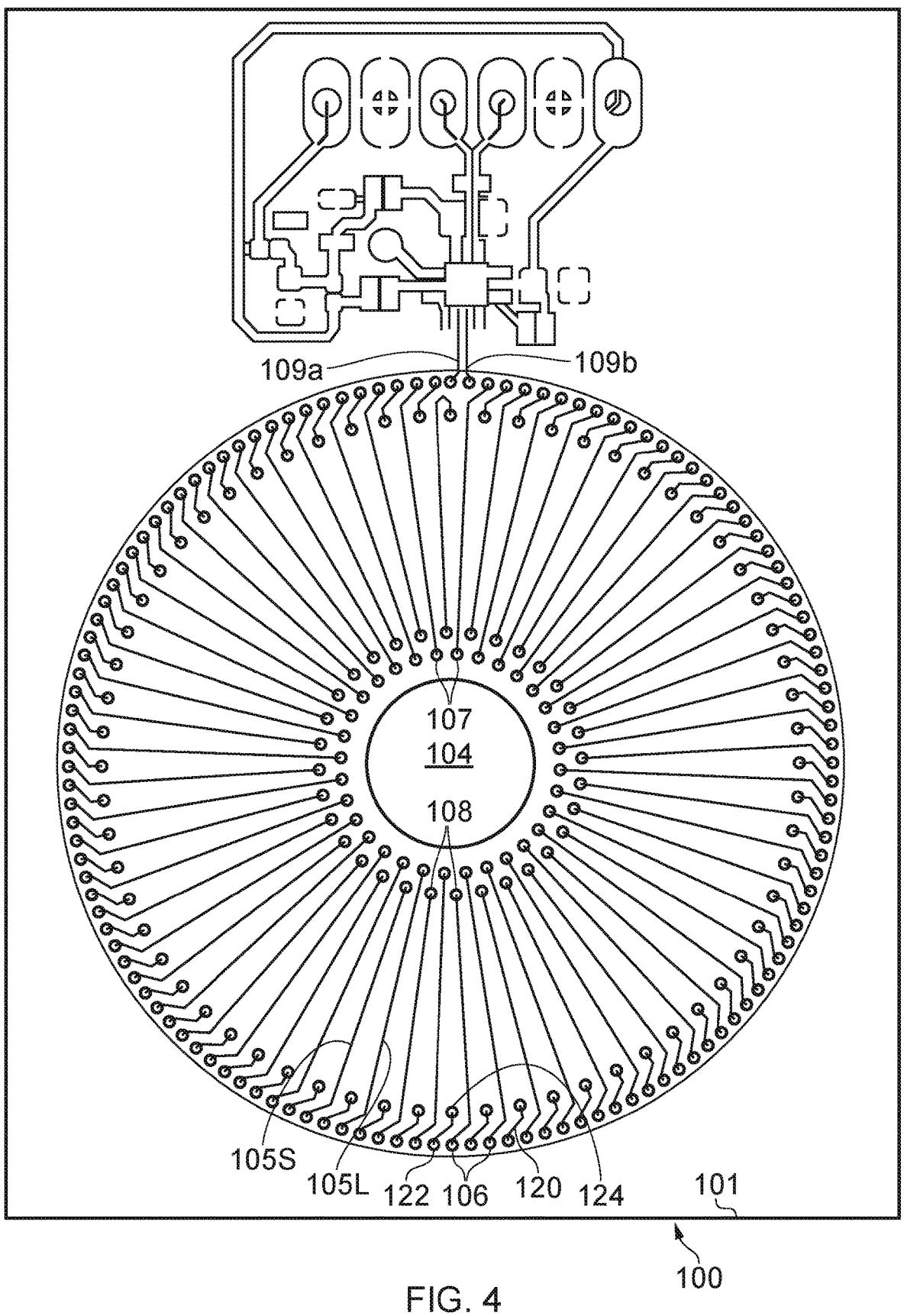
FIG. 4 shows a plan view of a track layout on a first side of a circuit board forming a Rogowski coil like sensor in accordance with the teachings of this disclosure.

FIG. 4 shows (not actual size) a top view of a circuit board for fabricating a Rogowski-like coil structure 100 having a measurement coil and a compensation coil in accordance with the teachings of this disclosure. The measurement and compensation coils are formed on circuit board 101 which in this embodiment is a printed circuit board (PCB).

A hole 104 is formed at the center of the board 101. The hole 104 is to allow a target conductor 1 to pass through the Rogowski coil 100. The diameter of the Rogowski coil may be around 35 mm, and the diameter of the hole 104 may be around 9 mm. However, depending on the application, the diameter of the Rogowski coil 101 may be in the range of 5 mm to 600 mm, and the diameter of the hole 104 may be in the range of 1 mm to 500 mm. The board 101 also has a thickness which may, for example, be 1.6 mm as this is a common thickness for circuit boards. The thickness of the board may be increased or decreased as appropriate. These dimensions are given for information only and should not be regarded as being limiting.

The measurement coil 100 is formed, in part, by a number of measurement coil tracks which in this embodiment are provided as radial elements. As there are a large number of radial elements, they have not been individually identified in FIG. 4, but are collectively referred to by reference 105.

As can be seen in FIG. 4, the measurement coil 100 includes a large number of closely spaced radial elements 105. The radial elements 105 are either long radial elements 105L or short radial elements 105S. These terms are relative. As can be seen in FIG. 4, the long and the short elements are arranged in an alternating arrangement. All of the radial elements 105 are connected to respective outer circumferential vias 106. The outer circumferential vias 106 are formed around the circumference of a circle which, advantageously is concentric with the hole 104. The outer circumferential vias 106 have a conductive lining and couple the radial elements on the top side of the measurement coil 100, to corresponding radial elements on the bottom side of the current sensing coil 100 by way of connection portions as will be described in greater detail with respect to FIG. 5. The long radial elements 105L are connected to respective first inner circumferential vias 107. The short radial elements 105S are connected to second inner circumferential vias 108. The first inner circumferential vias 107 are formed approximately 2 mm from the edge of hole 104, and the second inner circumferential vias 108 are formed approximately 4 mm from the edge of hole 104. These distances are given only by way of example and other distances may be used. Both sets of inner circumferential vias have a conductive lining and are arranged to couple the inner ends of the long and short radial elements on the first side of the board to corresponding long and short radial elements on the second side of the board to form the measurement coil 100.

As can be seen in FIG. 4, the first inner circumferential vias 107 present a physical limitation to the number of vias that can be formed on the circumference of the circle drawn through those vias. If all of the radial elements were of the same length, this inner circle would define the winding density of the device. By shortening every other radial element, it can be seen that an additional set of radial elements can be provided on the coil board 101, effectively doubling the number of radial elements, and doubling the winding density. As such, it is effectively the outer circumferential vias 106, together with further vias that will be described later in respect of the compensation conductor, that now define the number of radial elements that may be formed on the surface of the coil board 101, and hence the winding density of the measurement coil. This principle can be extended by providing more radial elements connecting to one or more further rings of vias formed near the vias 107 and 108. Similarly a further ring of vias near the vias 106 could be formed to allow the winding density to be further increased.

It should also be noted that the major portions of the radial elements are straight, and are ideally exactly aligned with the radii of the circle formed by the board 101. The radial elements may be within +/−5 or better still within +/−2 degrees of being exactly radial. Preferably, the radial elements may be within +/−1 degree of being exactly radial, or better still within ±0.5 degree or less. Further details of the geometry of the coils will be described below.

The measurement coil 100 is provided with external connections. As such, coil connections 109a and 109b are formed by breaking the repeating circular pattern of connections to allow a signal to be extracted from the measurement coil. One of these connections 109a and 109b can be connected to the compensation conductor.

It can also be seen that a plurality of conductors 120 which substantially copy the shape of an outermost end of the elements 105 are interposed between pairs of neighboring radial elements 105S and 105L. These conductors 120 extend between vias 122 and vias 124. The vias 122 are formed in the spaces between the vias 106, and in this example are at the midpoint between each neighboring pair of vias 106. The vias 124 are, in this example, formed at a smaller radius and in this example are offset by half of the pitch of the measurement coil 100. The conductors 120 can be regarded as being first conductors of the compensation conductor and serve to form the compensation coil 6.

In the above-described embodiment, the measurement coil 100 is circular. A symmetric coil is better at rejecting interference. As an alternative to a circular design, the coil may be triangular, square, rectangular, polygonal or elliptical. As with the circular design, it is important that the coil be substantially symmetrical, whatever its shape.

Figure 5:
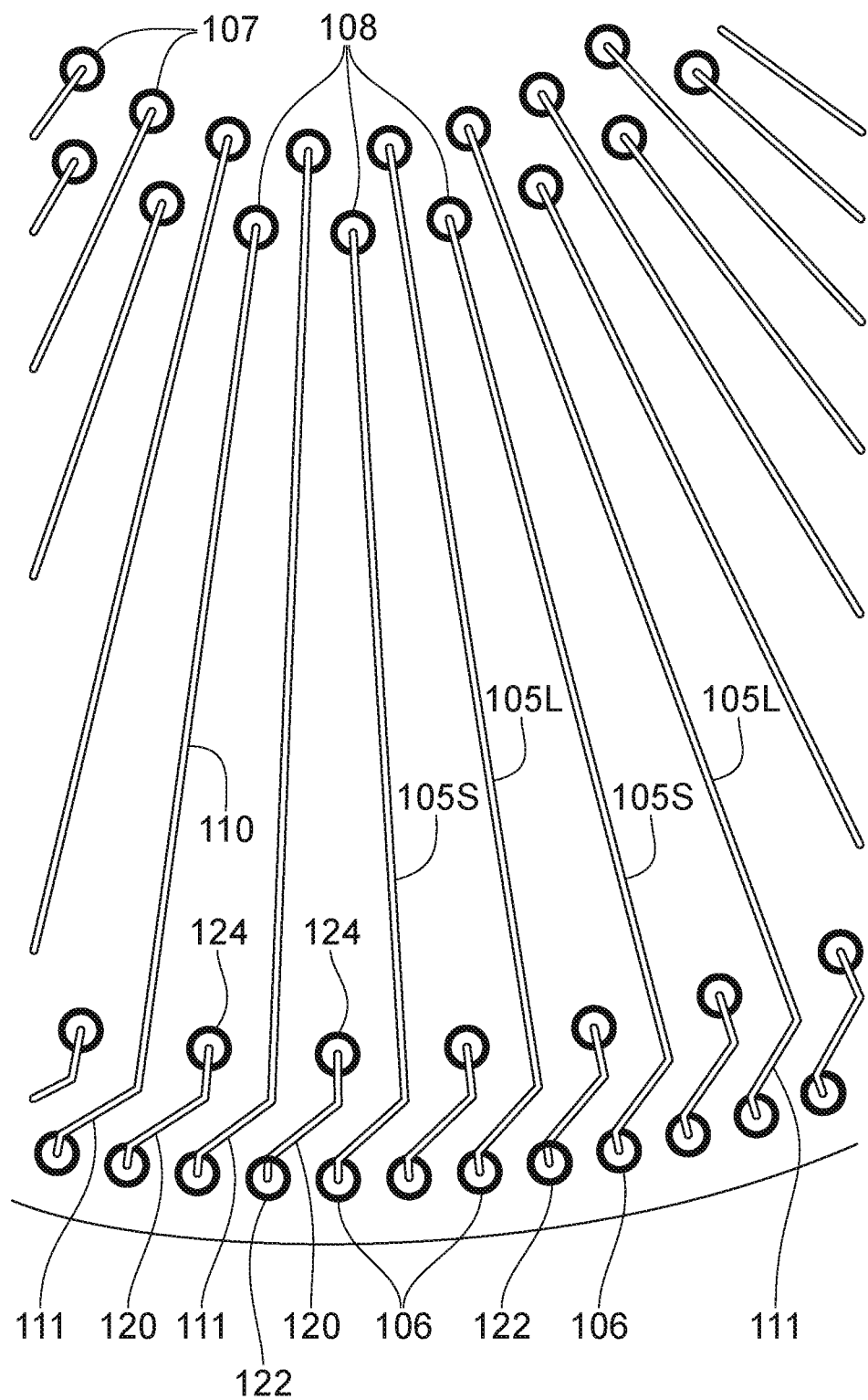
FIG. 5 shows part of FIG. 4 in greater detail.

FIG. 5 is a close-up of part of the measurement coil 100 showing a small number of radial elements 105. FIG. 5 highlights and clarifies the manner in which the radial elements 105 are coupled to their respective vias. All of the radial elements 105 are connected to their respective inner circumferential vias 107 and 108 such that the center point of each via is in line with a major portion of the radial element. This can clearly be seen in FIG. 5. The second (outer) ends of the radial elements 105 are not connected to the outer circumferential vias 106 in the same manner. Instead, each outer circumferential via 106 is offset and in this example is positioned at a midpoint between two immediately adjacent radial elements 105. Each radial element 105 extends to a point almost on the same circumference as, but generally slightly short of, a circle drawn through the midpoint of the outer circumferential vias 106. Each radial element 105 is then coupled to its respective outer circumferential via 106 by a connection portion, which in this example takes the form of a short non-radial conductive portion 111. A non-radial connection portion 111 may be referred to as a "kink" and the radial portion can be regarded as being a "major portion" 110 of the radial element 105. In one embodiment, the kinks 111 may be parallel to, or even formed on, a circle drawn through the center points of the vias 106. The designer is relatively free to choose the angle between the connection portions 111 and the local circumference of the circle formed through the vias 106.

The benefit of this feature, as will be seen below, is that the radial elements 105 on the top surface of the coil board 101 can be exactly aligned with corresponding radial elements on the bottom side of the coil board 101.

The kinks allow the windings of the coil to be advanced around the circle at or substantially adjacent the vias 106. Advancement is not required at the inner vias 107 and 108.

Figure 6:
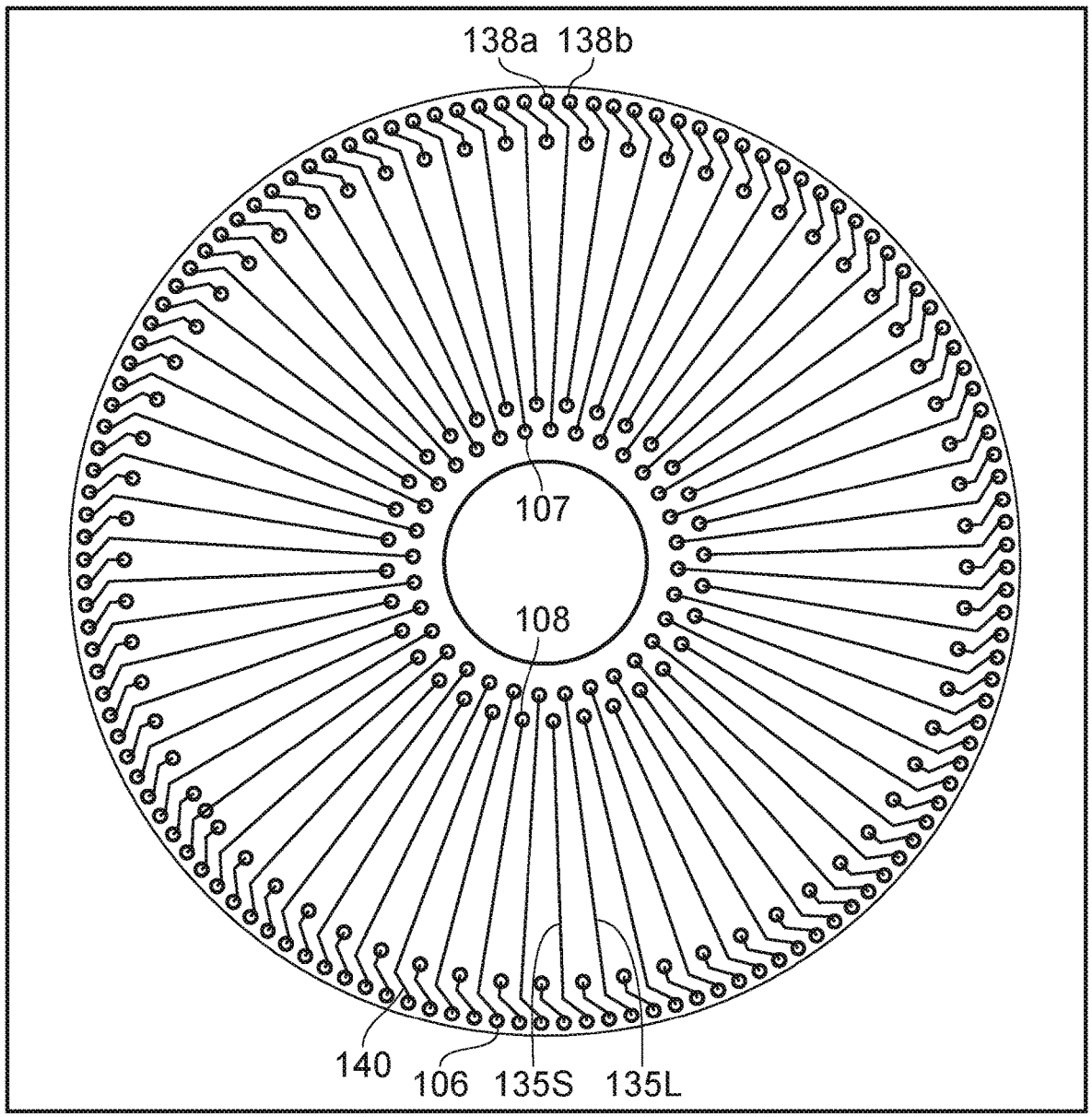
FIG. 6 shows a plan view of a track layout on a second side of the circuit board shown in FIGS. 4 and 5.

FIG. 6 shows the bottom side of Rogowski-type coil 100 as viewed from above. This is as if the viewer could see through the board and such an approach is often used in computer aided design to make it easier to see the relative position between components in a product. As can be seen, other than one of two minor differences, the arrangement of the measurement coil and the compensation coil of the Rogowski-type coil 100 is a mirror image to that of the top side. The bottom side of the board 101 includes lower radial elements 135, which include long radial elements 135L and short radial elements 135S. The lower radial elements 135 are connected to the vias 106, 107 and 108. In order to connect the lower radial elements to an external circuit, coil connection vias 138a and 138b are provided which attach to the coil connections 109a and 109b described with respect to FIG. 4 so as to facilitate connection to components mounted on the upper (first) side of the board.

As such, the structure formed by the upper radial elements 105 and the lower radial elements 135, as well as the vias 106, 107 and 108, is a measurement coil that progresses in a circumferential direction around the board 101 from coil connection 109a to coil connection 109b. This structure may be regarded as a modified-Rogowski coil. The progression occurs at the outer edge only in this embodiment. However without loss of generality the non-radial connective portion could be provided at the inner end of the coil or at an arbitrary distance along the radial conductors.

Similarly conductors 140 which are mirror images of the conductors 120, cooperate with the vias 122 and 124, and with the conductors 120 to form the compensation conductor. The conductors that form the outermost part of the radial conductors 105 and 135 form a path that is interwoven or wound/twisted with the path of the compensation coil. The conductors 140 can be regarded as being second conductors of the compensation conductor.

Figure 7:
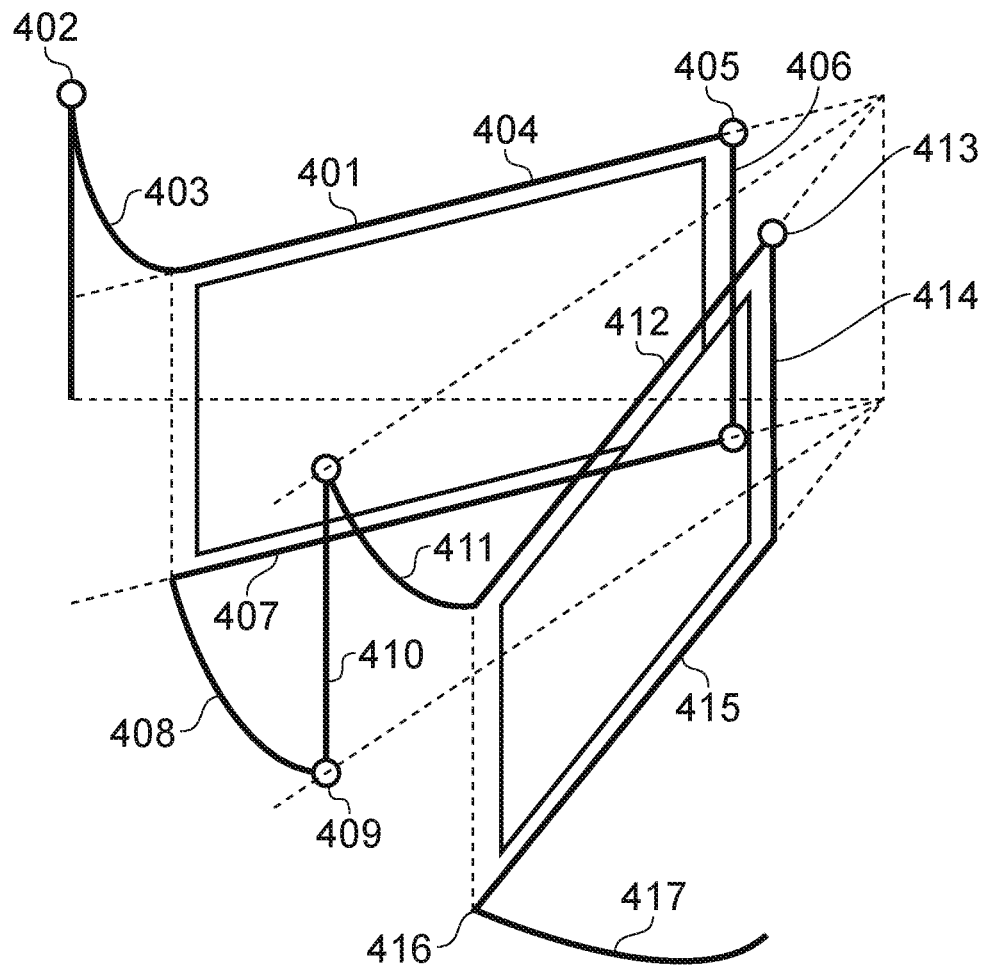
FIG. 7 shows the geometric arrangement of the measurement coil of FIGS. 4, 5 and 6.

FIG. 7 is provided to give a better understanding of the geometric relationship of the radial elements 105 and 135. This Figure is not drawn to scale. In FIG. 7, the continuous line 401 represents the conductive path formed by a combination of the upper radial elements 105, lower radial elements 135 and the vias 106, 107 and 108. In this example our tracing of the path begins at node 402, which represents an outer circumferential via 106. The path 401 traces along section 403, which corresponds to a non-radial connection portion 111. The path 401 then proceeds along section 404, which corresponds to a major portion 110 of an upper radial element 105L. Section 404 extends to node 405, which represents an inner circumferential via 107. Section 406 represents the conductive lining of inner circumferential via 107. From here, section 407 represents a major portion of a lower radial element 135L. Section 407 proceeds to section 408, which represents a further non-radial connection portion 111. The path then traverses through the board back to the top side by way of section 410 which corresponds to one of the vias 106. The path then proceeds along section 411 which corresponds to a non-radial portion before joining radial section 412 which corresponds to one of the shorter radial elements 105S. From here, the pattern repeats through nodes 413 and 416, and sections 414, 415 and 417.

As can be seen, sections 404 and 407 create a plane which is formed exactly on a radius of the circle formed on board 101 and which is orthogonal to the plane formed by a surface of the board 101. The benefit of this arrangement is that the winding planes that form the measurement coil are now properly aligned with the magnetic field from the target conductor rather than being slightly inclined with respect to it. It is believed that this causes sensitivity to currents flowing in a conductor passing through hole 104 to be increased when compared with similar coil arrangements in which the planes formed by the radial elements are not orthogonal to the surface of the board or not precisely formed on the radii of the circle formed by board 101. This is because the magnetic field generated by the current passing through the measurement coil is perpendicular to the plane of the windings. This also improves the sensor's rejection of external magnetic fields. The nodes 405 and 413 are at different distances from the center of the aperture, as shown by vias 107 and 108 in FIGS. 4 to 6. The winding advances around the toroid at regions 403, 408, 411 and 417 but not (in this embodiment) at the inner vias 405 and 413.

Figure 8:
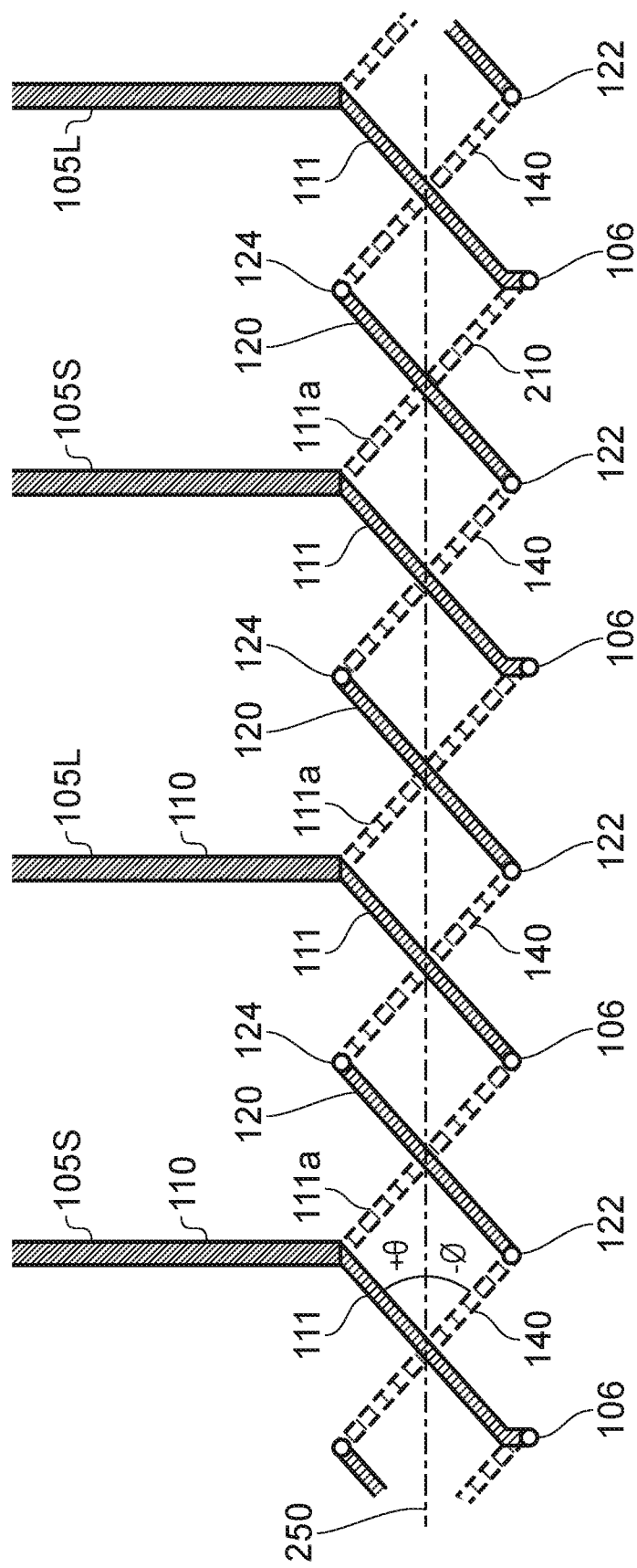
FIG. 8 is a schematic of a Rogowski type coil formed on a substrate in accordance with an embodiment of the disclosure.

FIG. 8 schematically shows a blown up portion of the edge of the measurement coil and the compensation conductor to illustrate how the patterns described with respect to FIGS. 4 to 6 cooperate to form a Rogowski coil like structure. For diagrammatic ease FIG. 8 has been drawn in a circular co-ordinate system such that the radius at the outer edge of the circle is represented in FIG. 8 as being linear. This can be regarded as equivalent to unwinding the sensor and laying it out in a straight line or alternatively as being a cross section through the edge of the Rogowski coil having a large diameter. Comparing FIG. 8 with FIG. 4, the conductive tracks 105S and 105L extend from the innermost vias to the outermost vias in alternating sequence along radial paths. Each track has a non-radial portion 111, or kink, formed at its radially outermost end which allows track to bend towards the interconnecting vias 106. The vias connect to the corresponding kink associated with the adjacent radial conductor in the direction of advancement of the coil, whereby the kink on the underside of the board is represented in phantom outline and designated 111a.

The compensation conductor is formed as a single turn coil by alternating tracks 120 and 140 formed on the upper and lower sides of the circuit board in the arrangement shown in FIG. 8. Additional vias are provided to allow the compensation coil to be formed. These additional vias are provided by a first set of compensation coil vias 120 formed on a radius which substantially corresponds to the edge of the major portions of the radial conductive elements and a second set of compensation coil vias 124 which, in this example, are formed at the same radius as the vias 106. The compensation conductor tracks 120 on the upper surface are, in this example, formed substantially parallel to the adjacent kinks 111 on the upper surface. The tracks 140 on the lower surface are formed substantially parallel to the adjacent kinks 111a on the lower surface of the board.

It can be seen by visual inspection of FIG. 8 that the kinks 111 extend substantially equidistantly of line 250 representing the effective circumference of the Rogowski like sensing coil. It can also be seen that the conductors 120 and 140 forming the compensation conductor also follow a path such that their average distance lies on the circumference 250. The effective path of the compensating coil can be adjusted by varying positions of the vias 124 and 126 inwardly or outwardly as desired in order to define the effective circumference of the compensation coil formed as a piecewise approximation to a circular path by interconnection of the tracks 120 and 140. If a non-radial connection portion is at an angle +θ with respect to the local part of the circumference of the measurement coil, the compensation conductor on the other side (e.g. second side) of the board is at an angle −φ, where θ and φ may be equal, as shown in respect of kink 111 and compensation conductor 140.

Figure 9:
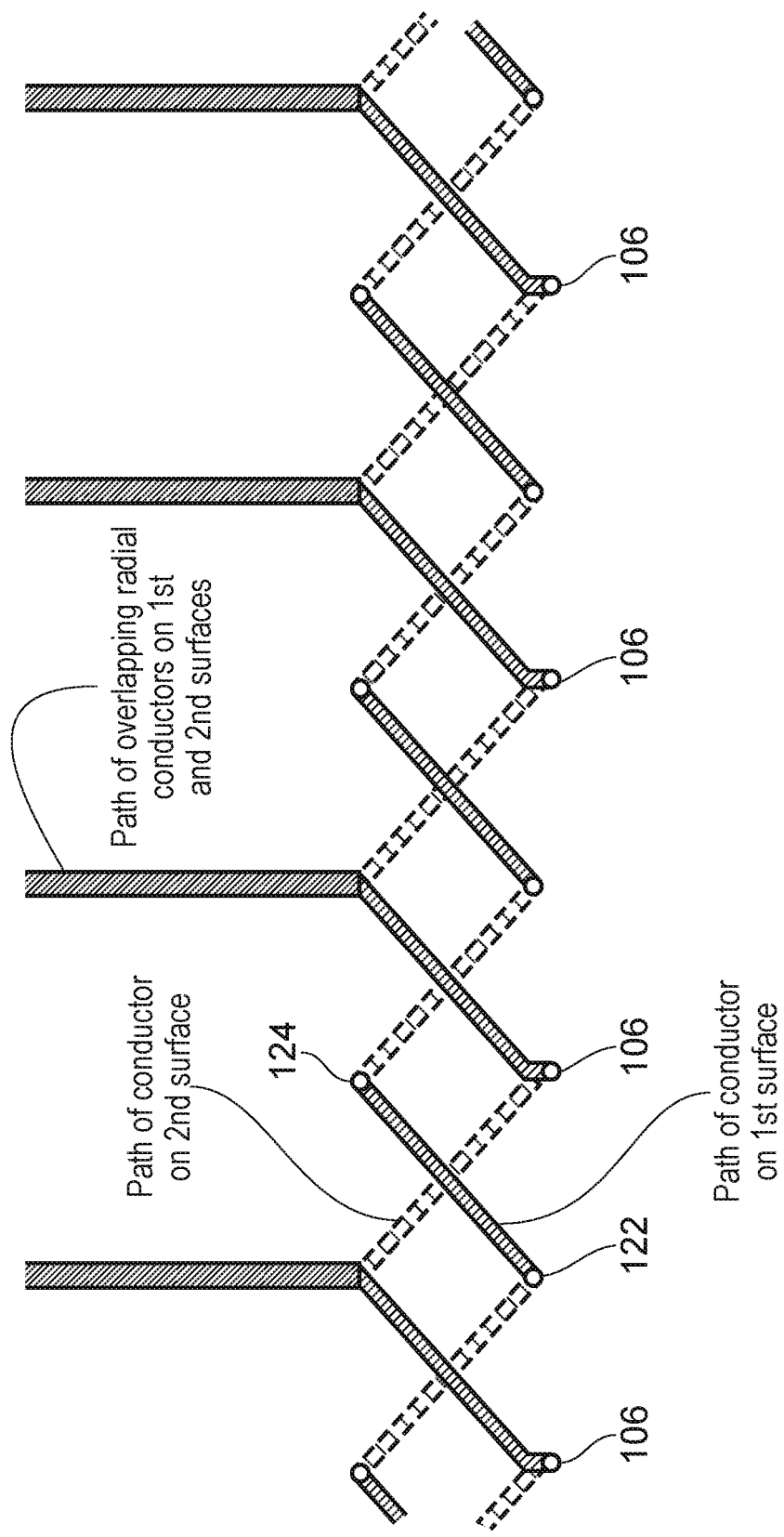
FIG. 9 is a further schematic representation of the circuit shown in FIG. 8.

For completeness, FIG. 9 represents the same arrangement as shown in FIG. 8 but where, for clarity, the blacked out areas represent the major positions of radial conductors 105 which are overlapping on both the first and second surfaces, i.e. upper and lower surfaces of the printed circuit board when viewed in the plane of FIG. 9.

Figure 10:
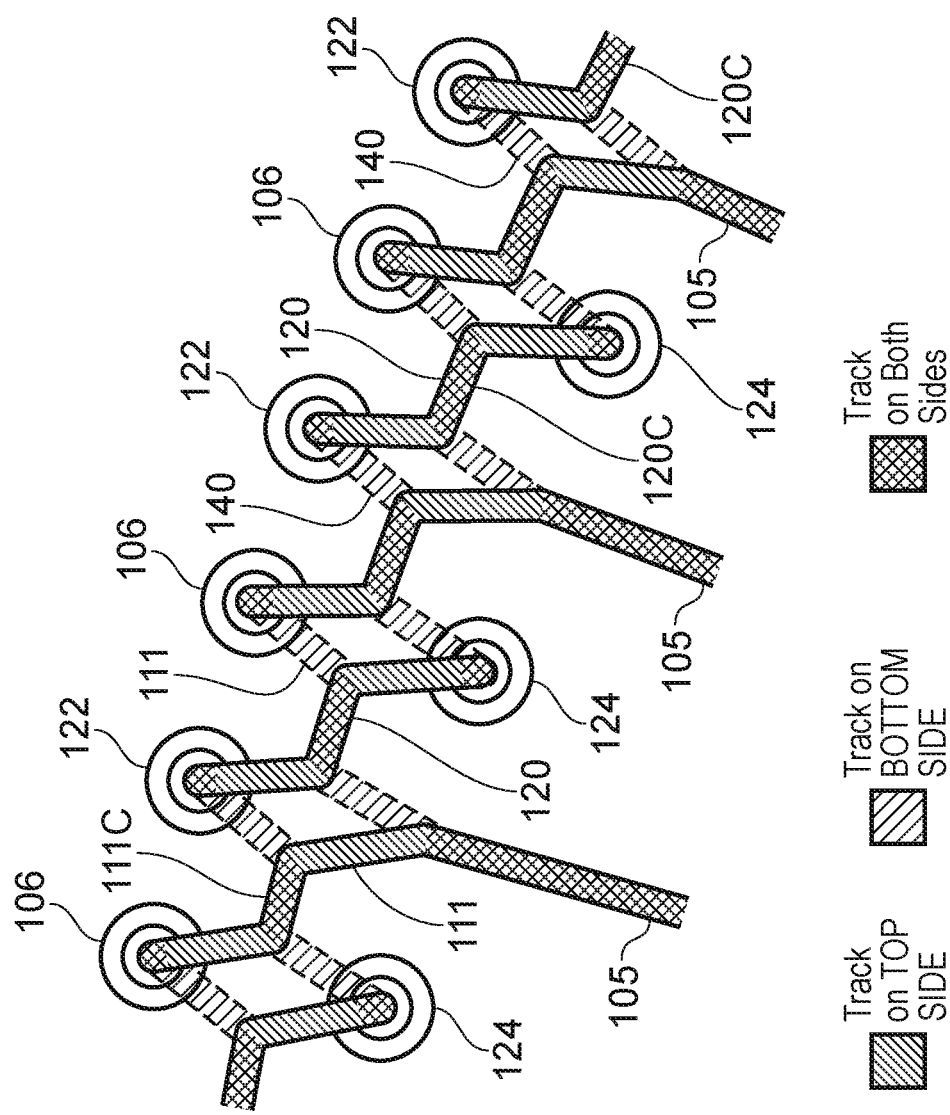
FIG. 10 is a schematic diagram of part of a circuit board in accordance with a second embodiment of the disclosure.

Other connection patterns are possible. FIG. 10 shows a view from an upper side of a board where the track positions on the lower side of the board have also been illustrated. Like parts described with respect to the earlier figures are given like reference numerals. It can be seen that the kinks 111 have been modified so as to have a central section 111c that is substantially perpendicular to the radial portion 105. The elements 120 and 140 of the compensation conductor are similarly shaped such that a central portion 120c of each of these elements runs parallel to and overlaps with the corresponding section 111c formed on the opposing side of the circuit board.

Figure 11:
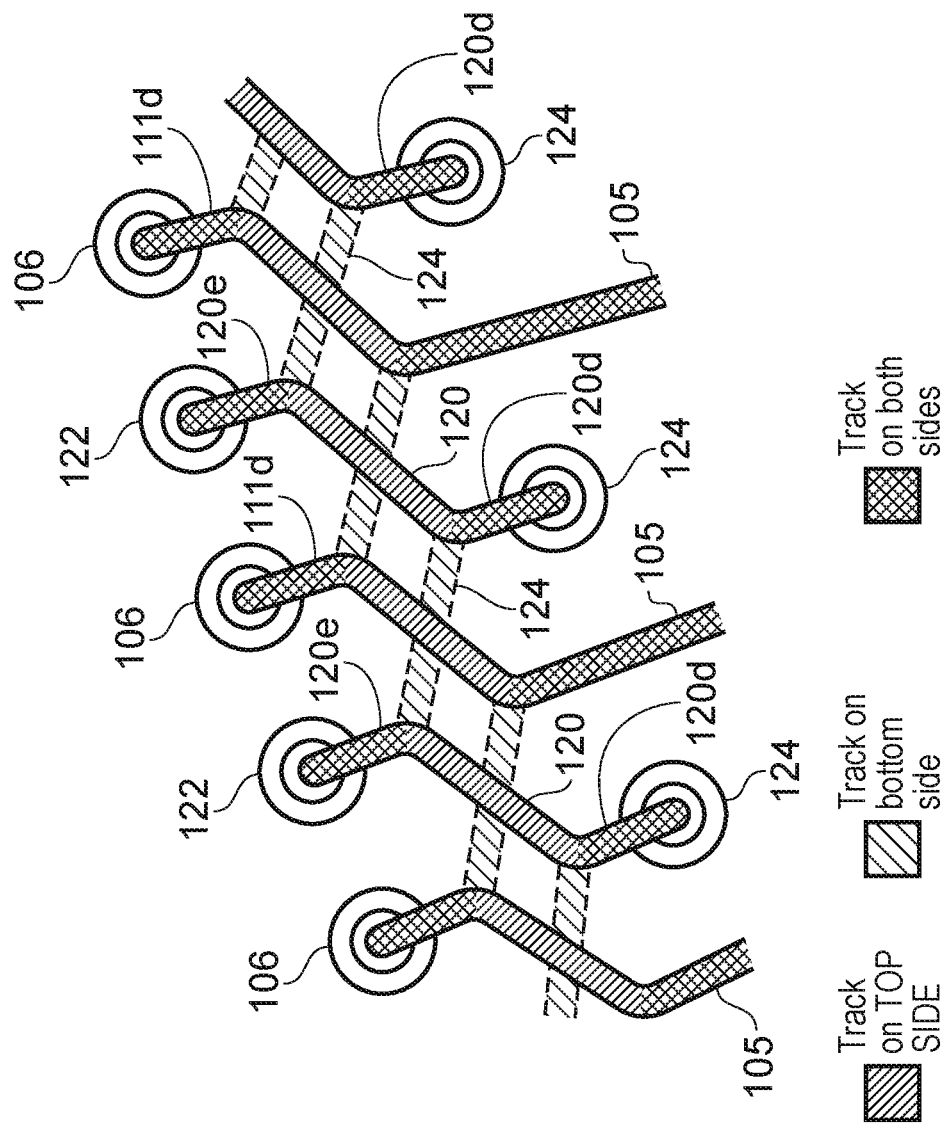
FIG. 11 is a schematic diagram of part of a circuit board in accordance with the first embodiment of this disclosure to show some features in greater detail.

FIG. 11 shows an equivalent diagram for the arrangement shown in FIGS. 4 to 6. A feature of the arrangement shown in FIG. 11 is that the non-radial connection portion or kink 111 terminates with a radially extending portion 111d to meet the via 106. The kinks on the underside of the board are similarly shaped. This configuration mimics the radial connection to the inner vias 107 and 108 to provide matching connections and current flow paths in the via at each end of the measurement coil conductors. Similarly the conductors 120 and 140 of the compensation coil have radial portions, of which portions 120d and 120e are illustrated in FIG. 11 such that their connections to the vias 122 and 124 mimic or repeat the shape of and direction of the measurement coil conductors in their end portions where they contact the vias 107, 107 and 108. This approach of making the connections to the vias substantially identical for the measurement and compensation conductors can be applied to other embodiments of Rogowski like coils.

Figure 12A:
FIG. 12a is a cross section through a circuit board in accordance with an embodiment of the disclosure.
Figure 12B:
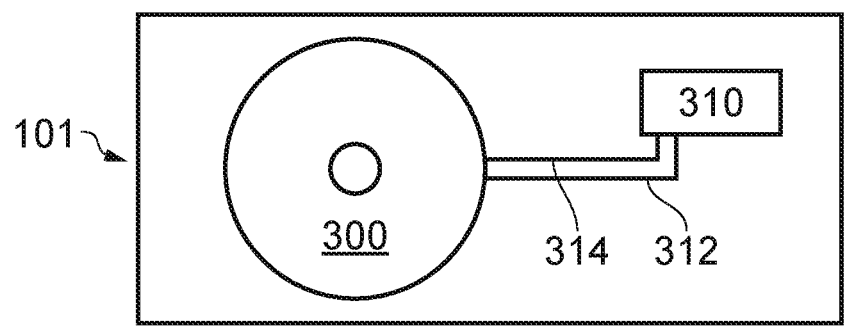
FIG. 12b is a plan view of the circuit board.

FIGS. 12a and 12b show the circuit board 101 in cross-section and plan-view respectively. From the cross-sectional view it can be seen that the Rogowski style sensing coil and the correction coil are formed in the circuit board in region 300 and are connected to electronic components, represented by item 310, mounted on the circuit board 101 by way of etched conductors 312 and 314 formed at the same time as the etching of the radial conductors 105L and 105S on the upper side and 135L and 135S on the lower side of the circuit board. Formation of the measurement coil 2 and compensation coil 6 of the Rogowski type sensor 101 such that they are effectively formed in a plane running along the center of the circuit board (in the case where the length of the conductors 200 and 210 are substantially equal on the upper and lower surfaces) and where the path of the compensation coil effectively follows the path of the linking "kinks" results in the enhanced rejection of interfering magnetic fields.

Figure 13:
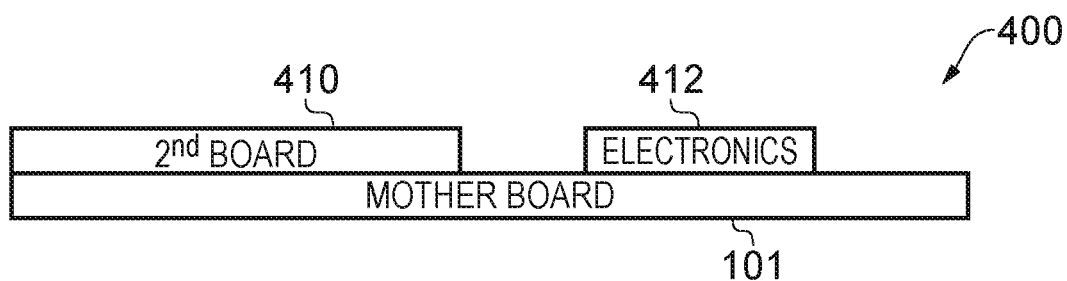
FIG. 13 is a side-view of a current sensor in accordance with an embodiment of the disclosure.

FIG. 13 shows a current sensor 400 in accordance with an embodiment of this disclosure. The sensor 400 has a circuit board 101 which can carry further Rogowski coils, formed on an additional circuit board 410. Thus the circuit board 101 can be regarded as acting as a motherboard for the further coil board 410 and electronic components 412. Adding another coil board effectively increases the number of turns and hence the sensitivity of the sensor. The additional coil can be formed like the Rogowski coil discussed with respect to FIGS. 4 to 11.

Figure 14:
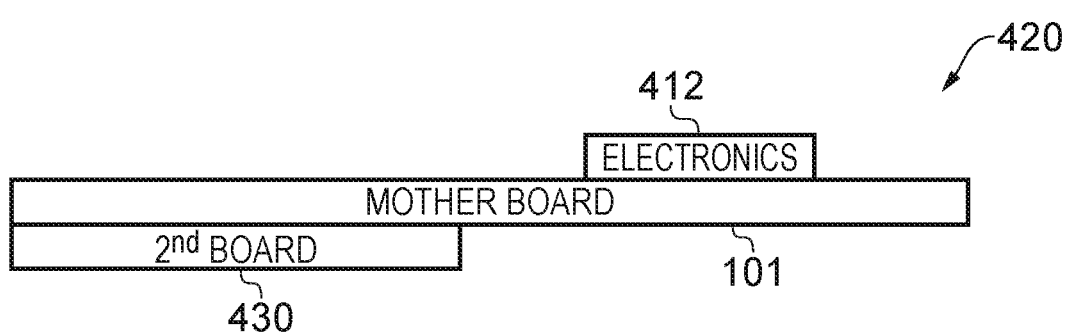
FIG. 14 is a side-view of a current sensor in accordance with an embodiment of the disclosure.

FIG. 14 is an alternative embodiment showing a current sensor 420. In this example, an additional board carrying a coil, and which can be regarded as being a coil board 430 is formed on the underside of the circuit board 101.

In each of the above cases the coils can be connected together in series before connecting to the electronics, or if desired each coil can connect to a respective input circuit and the coil outputs can be combined later.

The advantage of the arrangement shown in FIGS. 13 and 14 is that two symmetrically opposed single-ended outputs can be provided by the two current sensing coils, and as such a pseudo-differential output may be produced. This significantly improves the circuit's ability to reject common mode noise and also increases the size of the output for a modest increase in cost. The pseudo-differential arrangement can also help reject any electrostatic pickup from the voltage on the current carrying conductor to the sensor. It should be noted that a single coil can be split into two halves by center tapping it to achieve a similar pseudo-differential arrangement, but with reduced output compared to the two coil arrangements described above.

Figure 15:
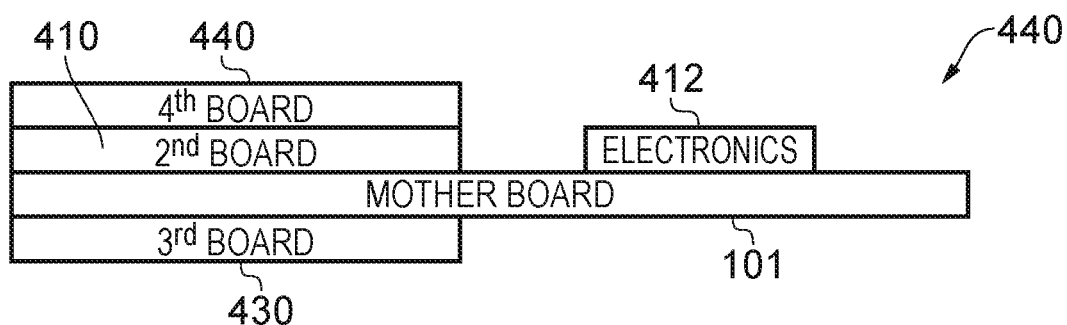
FIG. 15 is a side-view of a current sensor in accordance with an embodiment of the disclosure.

FIG. 15 shows a current sensor 440 in which four current sensing coils are provided. The sensor 440 includes a circuit board 101 which has a measurement coil and compensation wire formed therein, first coil board 410, second coil board 430, and a third coil board and electronics 412. This allows a differential output to be achieved by arranging the Rogowski style coils into two pairs of two coils. Alternatively the four Rogowski type sensors can be connected in series to provide a single ended output. In either case a fourfold increase in sensitivity compared to a single Rogowski type coil is achieved. For completeness it should be noted that odd numbers of Rogowski type coils can also provide a differential output as the center-most coil of the series connected stack of coils can itself be center tapped.

The boards 410, 430 and 440 can repeat the Rogowski type coil described herein before and suitably placed connection points or other pass though connections are provided to contact these boards with the mother board 101. Multiple numbers of boards beyond four can be connected to form more sensitive sensors if so desired.

The sensitivity of a Rogowski coil like sensor can be increased by increasing the volume or the turns density of the sensing coil (as effectively achieved by stacking two or more coils as described above). Additionally or alternatively the sensitivity can be increased by increasing the magnetic flux generated by the target conductor 1. This can be achieved by making the target conductor 1 make several passes through the aperture. The target conductor can loop round outside of the periphery of the measurement coil so as to return from a second side of the circuit board to a first side of the circuit board such that it can pass through the aperture 104 again. This can be repeated a plurality of times.

Figure 16:
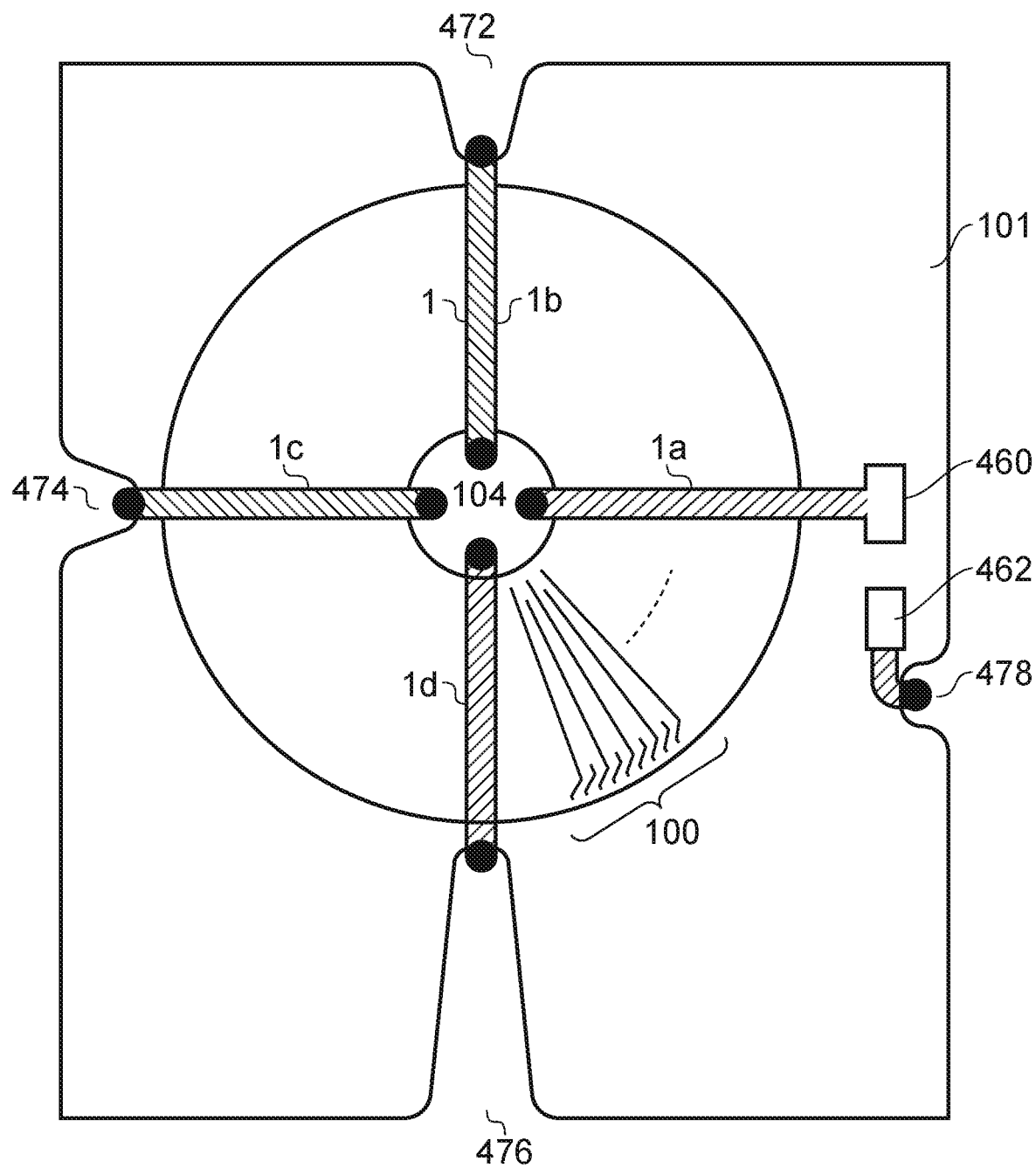
FIG. 16 is a plan view of an embodiment of this disclosure where the target conductor makes multiple passes though the Rogowski type current sensor.

FIG. 16 is a plan view of an embodiment of a Rogowski-type coil where the target conductor 1 is wound through the central aperture 104 four times so as to give a fourfold increase in sensitivity of the Rogowski coil, generally designated 100, and formed in accordance with the teaching discussed herein with respect to FIGS. 4 to 15. In the arrangement shown in FIG. 16 the target conductor 1 is provided as a flexible insulated wire that terminates at onboard connectors 460 and 462. A first segment 1a of the wire extends from the connector 460 along the upper surface of the board and passes through the aperture 104 it is then progressed towards a first cut out (alternatively a further aperture formed in the board) 472 where it is brought from the underside of the board to the topside of the board to form the conductive path designated 1b in FIG. 16. The conductor passes through the aperture 104 and is then directed towards recess 474 where it passes from the underside of the board to the topside of the board to form the element designated 1c. The target conductor passes through the aperture 104 once more and is then directed towards slot 476 where it is routed from the underside of the board to the topside of the board to form the segment 1d. The conductor passes through the aperture 104 again and is now routed towards cut out 478 where it is brought back to the first side of the board and then connected to the terminal 462. The terminals 460 and 462 may be clip type or screw type terminals to enable the coil board 100 to be connected in the current flow path that it is desired to monitor. Fewer or more turns of the target conductor may be made, as appropriate.

The provision of the multiple paths 1a to 1d as described in the context of a single insulating wire with respect to FIG. 16 can be reproduced by using circuit boards positioned above and below the coil board 101.

Figure 17:
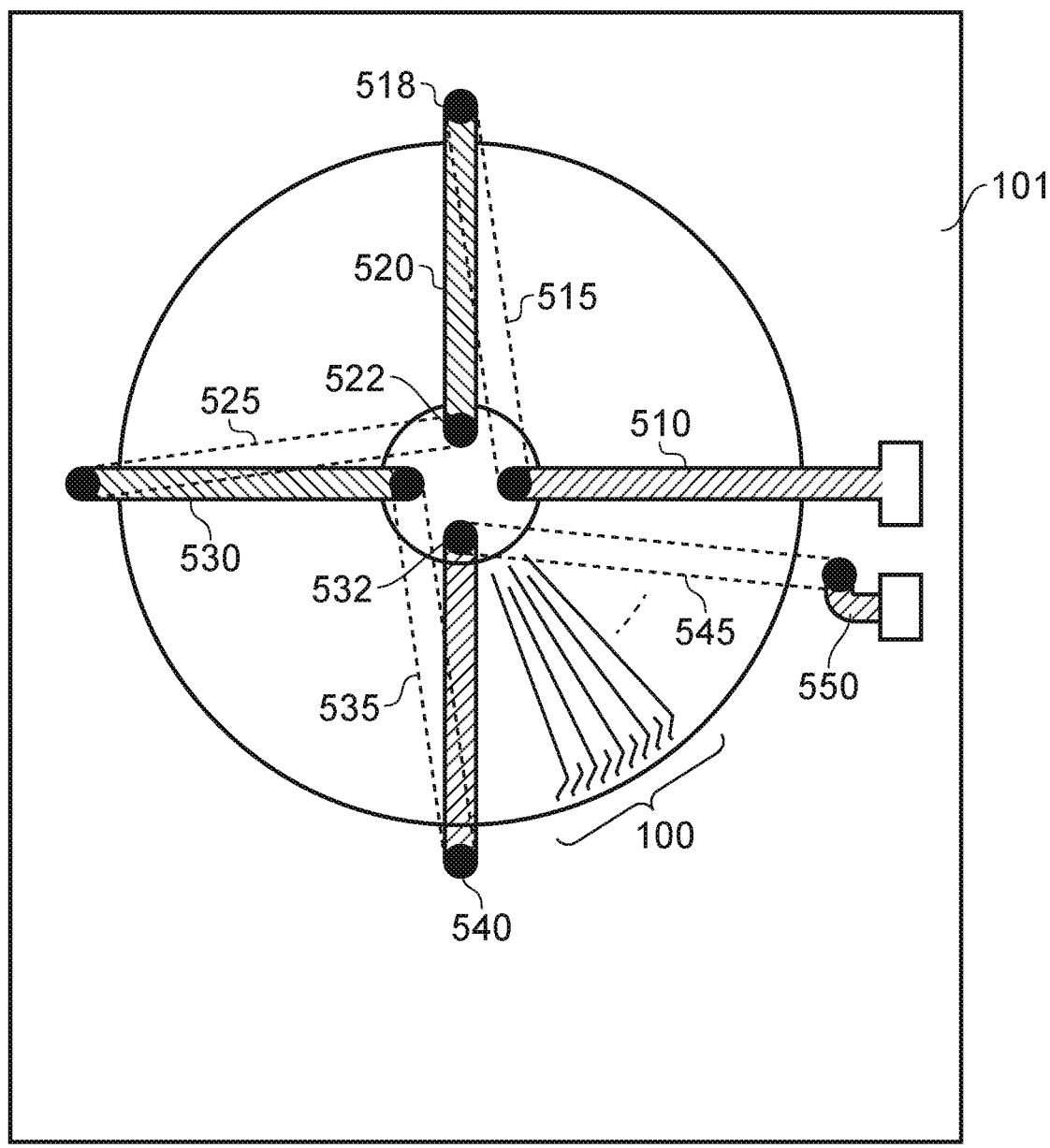
FIG. 17 shows an embodiment where the current flow path is provided in part by additional boards sandwiching the coil board.
Figure 18:
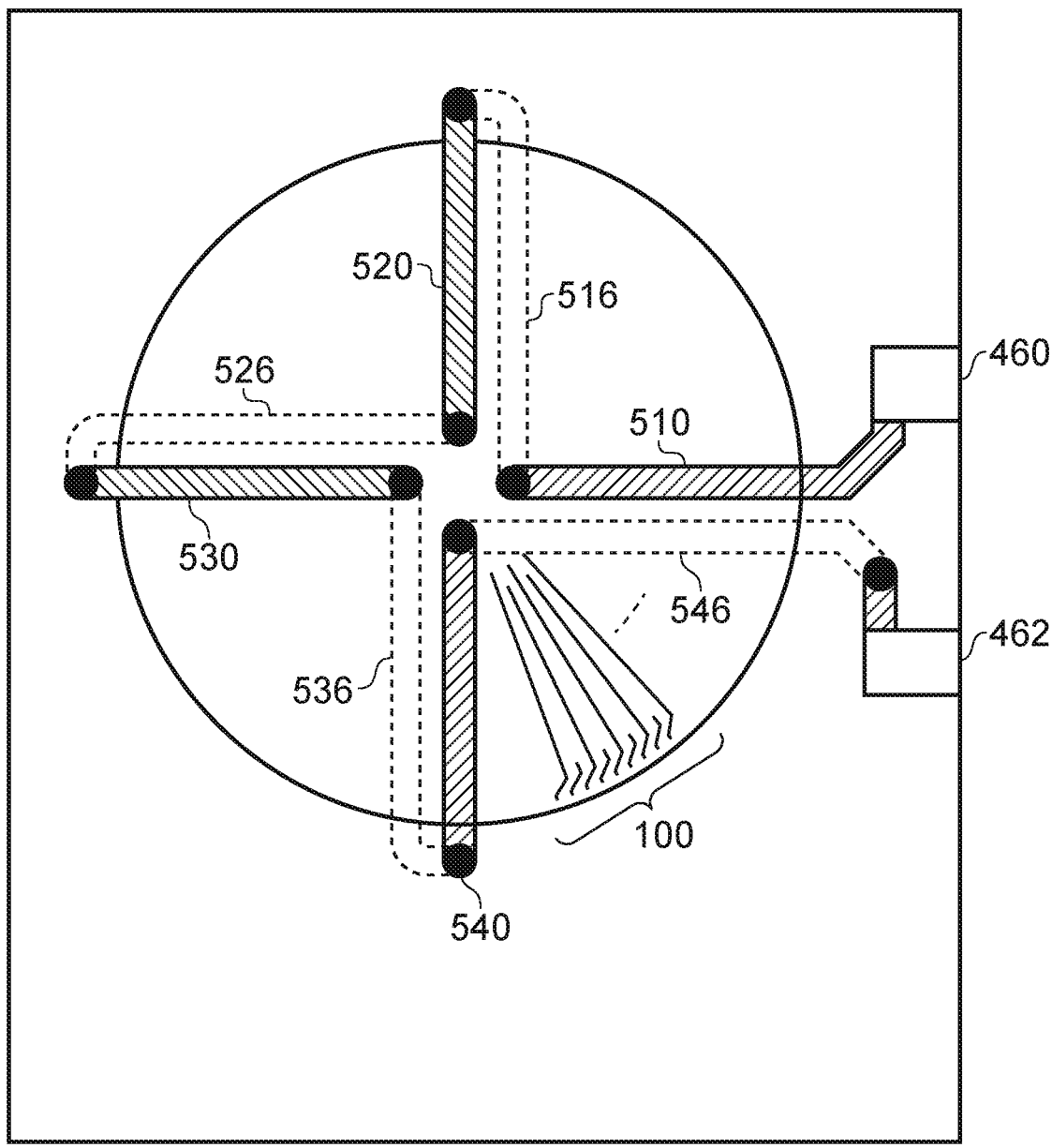
FIG. 18 shows a further current sensor in accordance with an embodiment of the disclosure based on the arrangement shown in FIG. 17.

FIG. 17 schematically illustrates such an arrangement. The conductors 510, 520, 530 and 540 are provided on an upper printed circuit board provided above a first side of the coil board 101. The conductors 515, 525, 535 and 545 shown in phantom are provided on a lower printed circuit board positioned below the second surface of the coil board 101. Connections between the upper and lower boards are made by way of through board connectors, for example in the form of vias, soldered pins, or even nut and bold style fasteners serving to provide both mechanical and electrical interconnection between the boards. The aperture 104 can be omitted and be replaced by the plurality of through board vias or connectors positioned in the region that would have been occupied by the aperture of the coil board. In the arrangement shown in FIG. 17 it can be seen that the directions of the conductors 510, 520, 530 and 540 on the upper board are not aligned with the directions of the conductors 515, 525, 535 and 545 on the lower board. This is not expected to be a problem but, if higher degrees of symmetry were required then the arrangement could be modified as shown in FIG. 18 where the paths of the conductors on the upper board remain unchanged but the paths of the conductors on the lowermost board are modified, and represented as conductors 516, 526, 536 and 546 such that the upper and lowermost conductors run in parallel paths. Minor modifications to increase the degree of symmetry could be made, for example by providing kinks at the end of the conductors 510, 516 and so on as they pass through the area previously occupied by the aperture such that the conductors on the lower board come into alignment with respective ones of the conductors on the upper board.

The multi-pass approach to increasing sensitivity can be combined with the multi-coil boards described herein before to achieve further increases in sensitivity.

Figure 19:
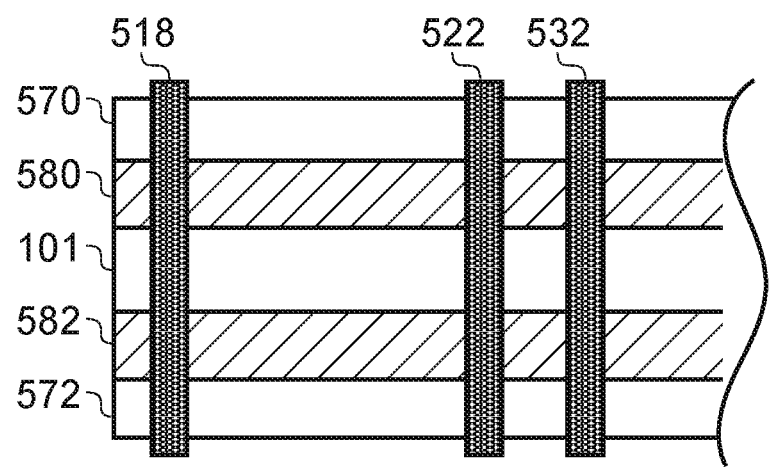
FIG. 19 is a cross section through the embodiment shown in FIG. 17.

FIG. 19 is a cross section through the embodiment shown in FIG. 17. The coil board 101 is sandwiched between an upper circuit board 570 and a lower circuit board 572. The upper circuit board carries the conductive tracks 510, 520, 530, 540 and may also carry the edge connectors 460 and 462. The lower circuit board 572 carries the conductors 515, 525, 535 and 545. Insulating layers 580 and 581 are provided to isolate the coil board 101 from the circuit boards 570 and 572 respectively. Metal conductors 518, 522 and 532 are shown passing between the top circuit board 570 and the lowermost circuit board 572. The conductors 518, 522 and 532 represent three of the eight through-board conductors shown in FIG. 17, with conductors 522 and 532 representing two of the four conductors passing through the center of the Rogowski style coil and conductor 518 representing one of the conductors that are necessary to allow the current to be looped around the outside of the Rogowski type coil. The conductor 518 represents the interconnection between the lowermost conductor 515 and the conductor 520 on the upper board, whereas conductor 522 represents the interconnection between conductors 520 and 525 and conductor 532 represents the interconnection between conductors 540 and 545 of FIG. 17. It will be appreciated that more than one coil board can be inserted between the circuit board layers 570 and 572 and thus the arrangement shown in FIGS. 13, 14 and 15 and extensions thereof can be applied to the arrangement shown here. The boards 570 and 572 do not need to have the same spatial extent as the coil board 101 and hence can be sized to be just slightly bigger than the pattern required to loop the current path around and through the Rogowski style measurement coil.

The multi-pass approach may also be implemented in multi-layer boards comprising four or more layers. In such an arrangement the outermost layers of the board can be used to form the current flow paths to carry the current to be measured while the innermost layers can be used to form the measurement and compensation coils.

A current sensor formed in accordance with any of the preceding embodiments may be connected to additional electronics to provide amplification and filtering functions. The following examples show various ways in which a sensor may be connected to additional integrated circuits or passive components.

Figure 20:
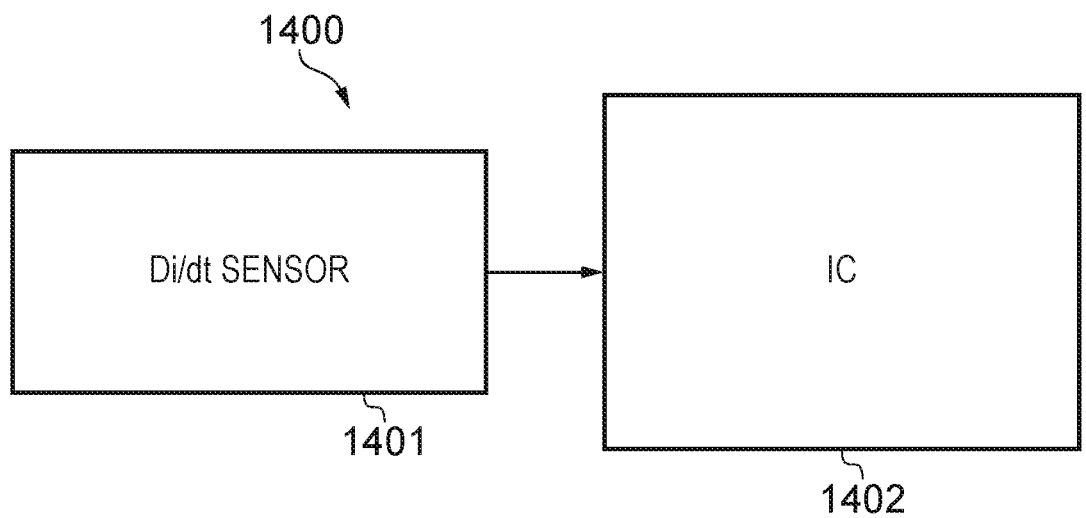
FIG. 20 is a system diagram of a current sensing system in accordance with an embodiment of the present disclosure.

FIG. 20 shows a current sensing system 1400 in which a current sensor 1401 may be coupled to an integrated circuit (IC) 1402. The integrated circuit may be an operational amplifier, a standalone analog-to-digital converter (ADC), a combination of an operational amplifier and an ADC, or a combination of multiple operational amplifiers and multiple ADCs. The integrated circuit can be carried on the board 101 or a further board.

Figure 21:
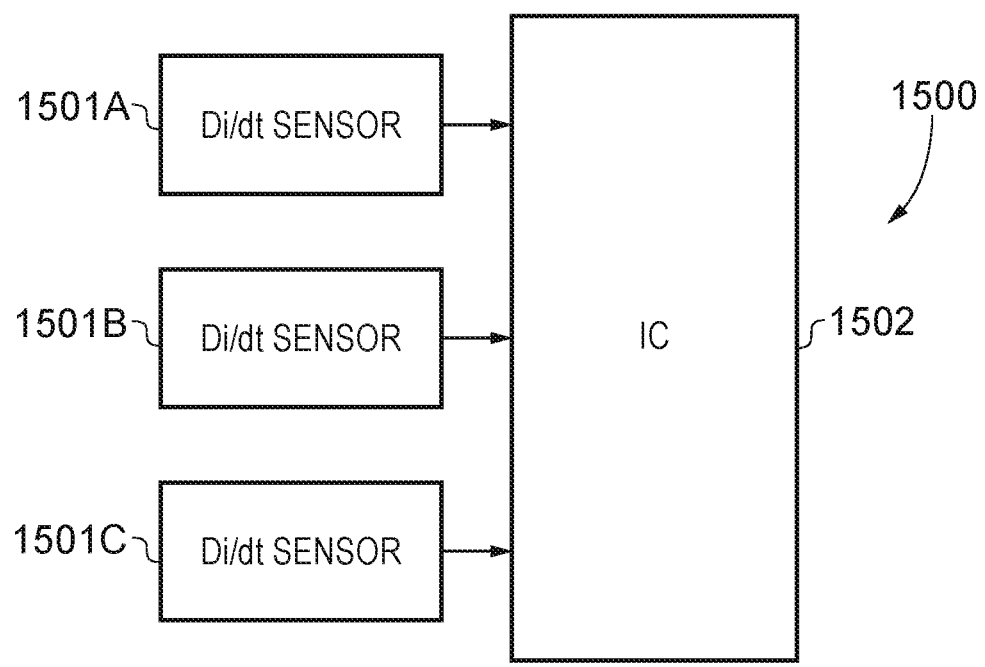
FIG. 21 is a system diagram of a current sensing system in accordance with an embodiment of the present disclosure.

FIG. 21 shows a current sensing system 1500 comprising multiple current sensors 1501A, 1501B, 1501C, each connected to the same IC 1502.

Figure 22:
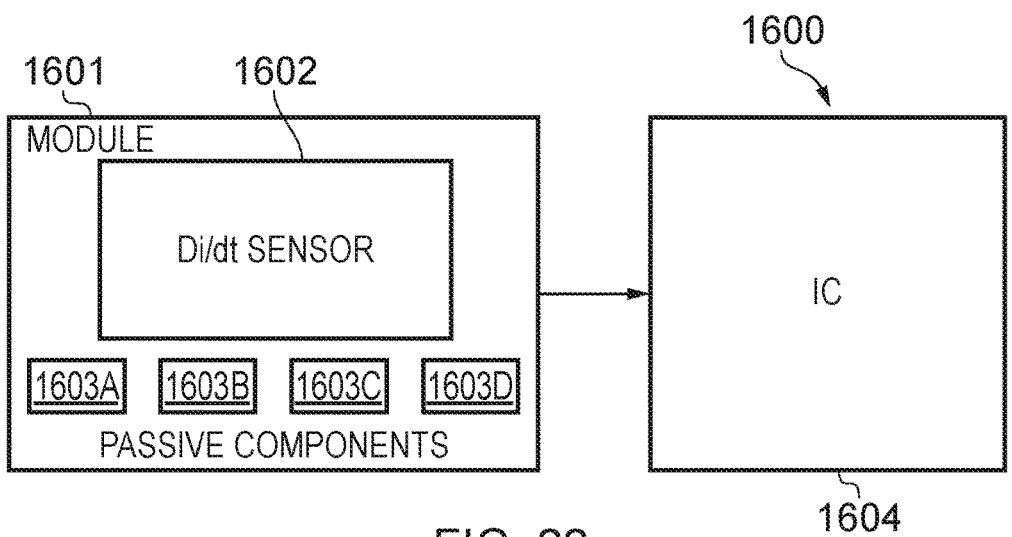
FIG. 22 is a system diagram of a current sensing system in accordance with an embodiment of the present disclosure.

FIG. 22 shows a current sensing system 1600 including a current sensing module 1601. The current sensing module includes a current sensor 1602 as well as a number of passive components 1603A, 1603B, 1603C and 1603D. The current sensing module 1601 may be coupled to an IC 1604.

Figure 23:
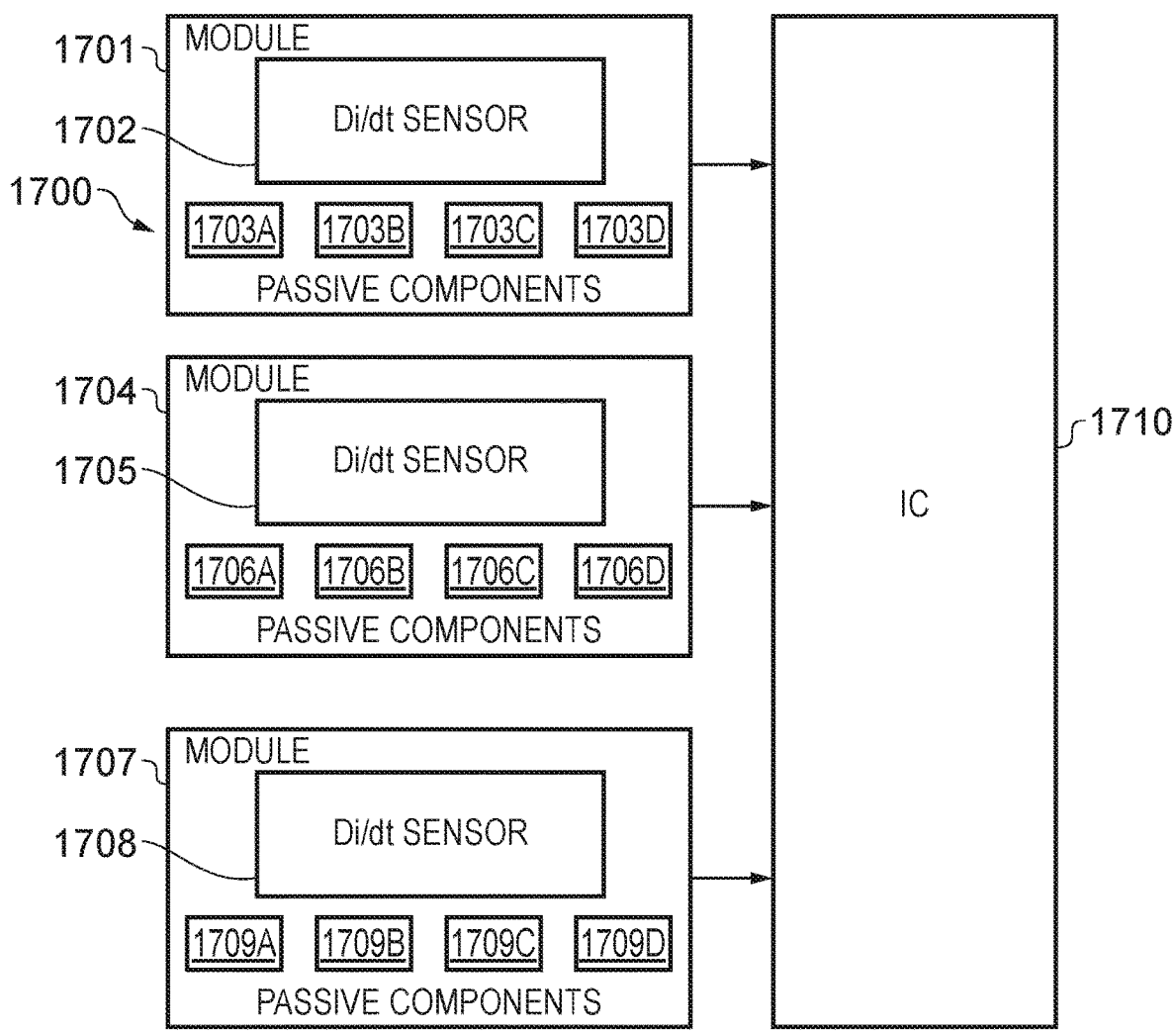
FIG. 23 is a system diagram of a current sensing system in accordance with an embodiment of the present disclosure.

FIG. 23 shows a current sensing system 1700. Current sensing system 1700 includes multiple modules 1701, 1704 and 1707. Module 1701 includes a current sensor 1702 and passive components 1703A, 1703B, 1703C and 1703D. Current module 1704 includes sensor 1705 and passive components 1706A, 1706B, 1706C and 1706D. Current sensing module 1707 includes current sensor 1708 and passive components 1709A, 1709B, 1709C and 1709D. Each module is connected to a single IC 1710 or to another circuit board.

Figure 24:
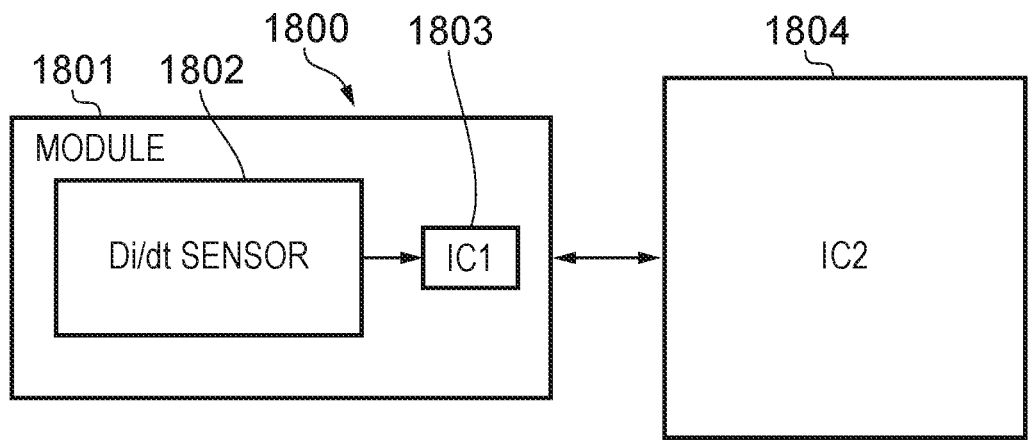
FIG. 24 is a system diagram of a current sensing system in accordance with an embodiment of the present disclosure.

FIG. 24 shows current sensing system 1800 which includes current sensing module 1801. Current sensing module 1801 includes a current sensor 1802 and an IC 1803. The current sensing module 1801 is coupled to integrated circuit 1804.

Figure 25:
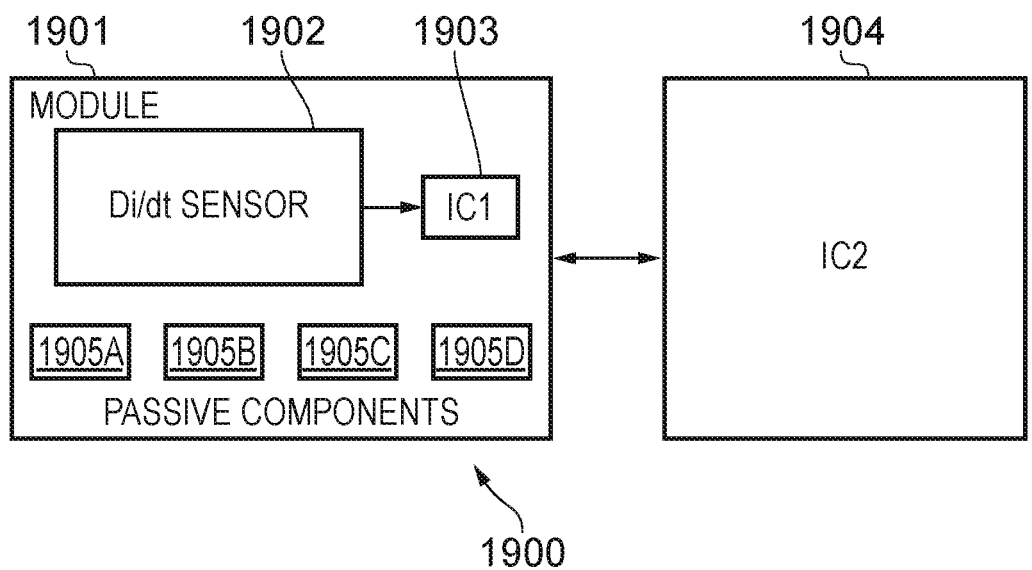
FIG. 25 is a system diagram of a current sensing system in accordance with an embodiment of the present disclosure.

FIG. 25 shows current sensing system 1900 which includes current sensing module 1901. Current sensing module 1901 includes a current sensor 1902 and an IC 1903. The current sensing module 1901 is coupled to integrated circuit 1904. The current sensing module 1901 also includes passive components 1905A, 1905B, 1905C and 1905D.

Figure 26:
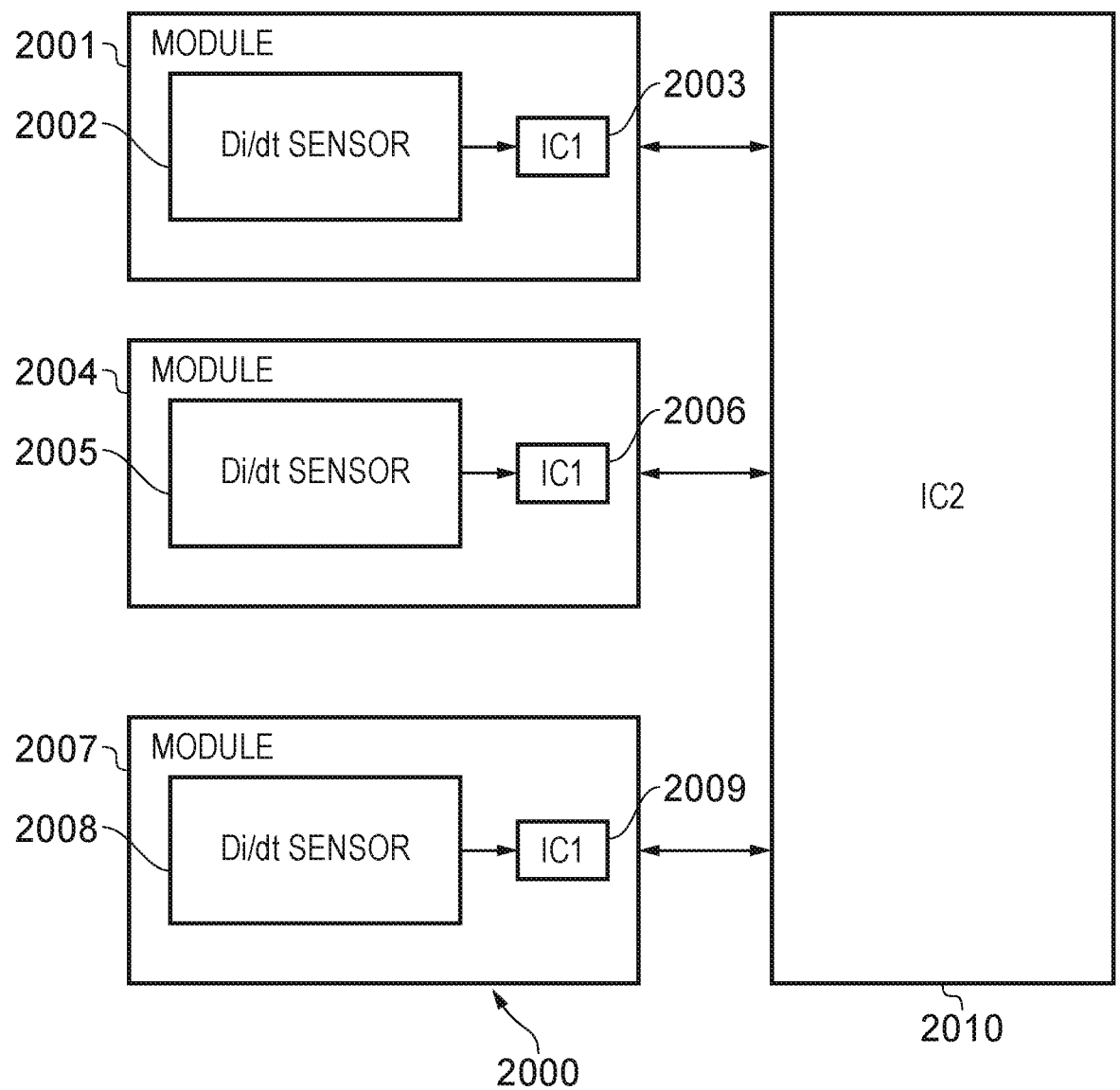
FIG. 26 is a system diagram of a current sensing system in accordance with an embodiment of the present disclosure.

FIG. 26 shows current sensing system 2000. Current sensing system 2000 includes multiple modules 2001, 2004 and 2007. Module 2001 includes a current sensor 2002 and IC 2003. Current module 2004 includes sensor 2005 and IC 2006. Current sensing module 2007 includes current sensor 2008 and IC 2009. Each module is connected to a single IC 2010 or another circuit board.

Figure 27:
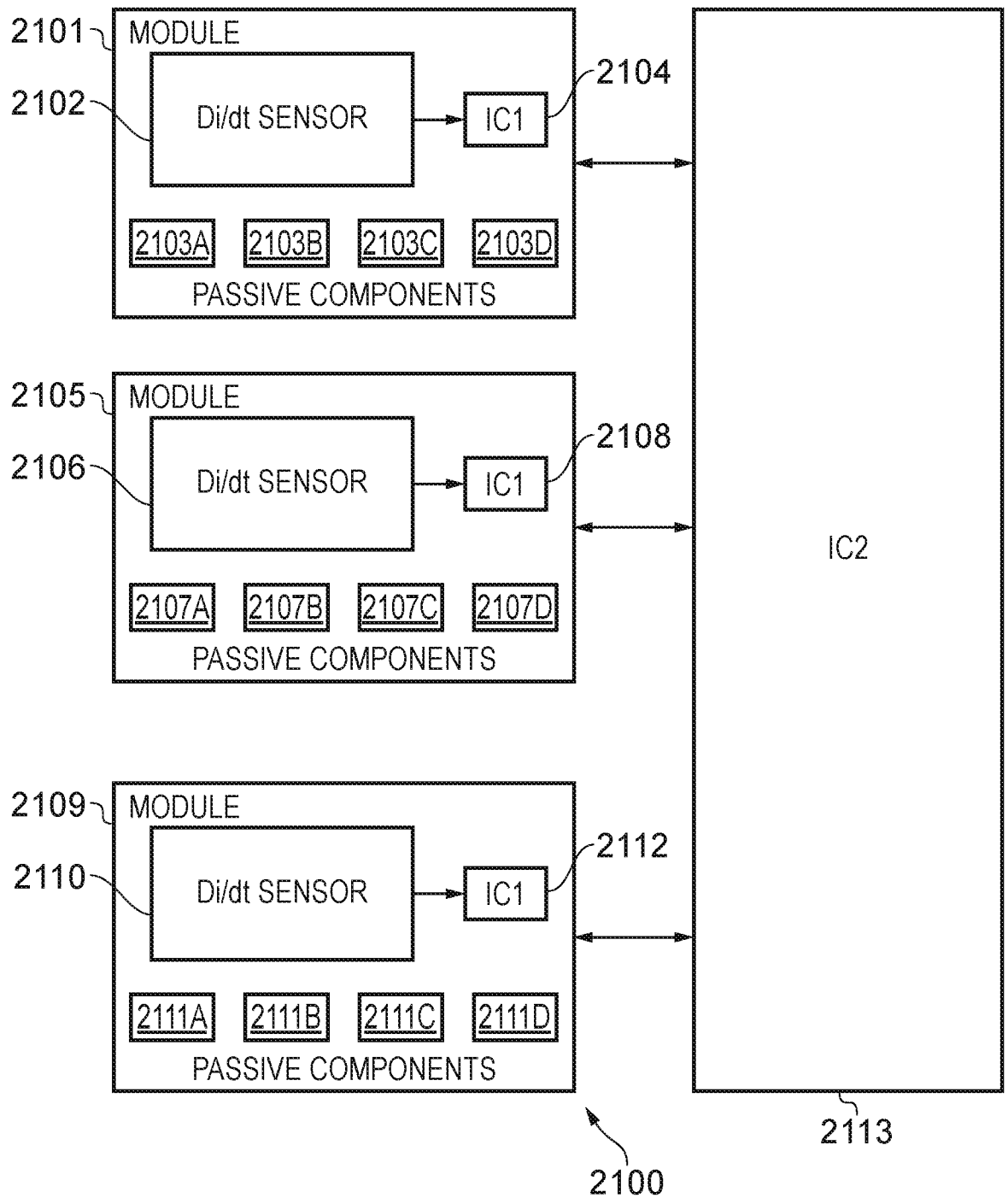
FIG. 27 is a system diagram of a current sensing system in accordance with an embodiment of the present disclosure.

FIG. 27 shows a current sensing system 2100. Current sensing system 2100 includes multiple modules 2101, 2105 and 2109. Module 2101 includes a current sensor 2102, passive components 2103A, 2103B, 2103C and 2103D and IC 2104. Current module 2105 includes sensor 2106, passive components 2107A, 2107B, 2107C and 2107D and IC 2108. Current sensing module 2109 includes current sensor 2110, passive components 2111A, 2111B, 2111C and 2111D and IC 2112. Each module is connected to a single IC 2113 or to another circuit board.

Figure 28:
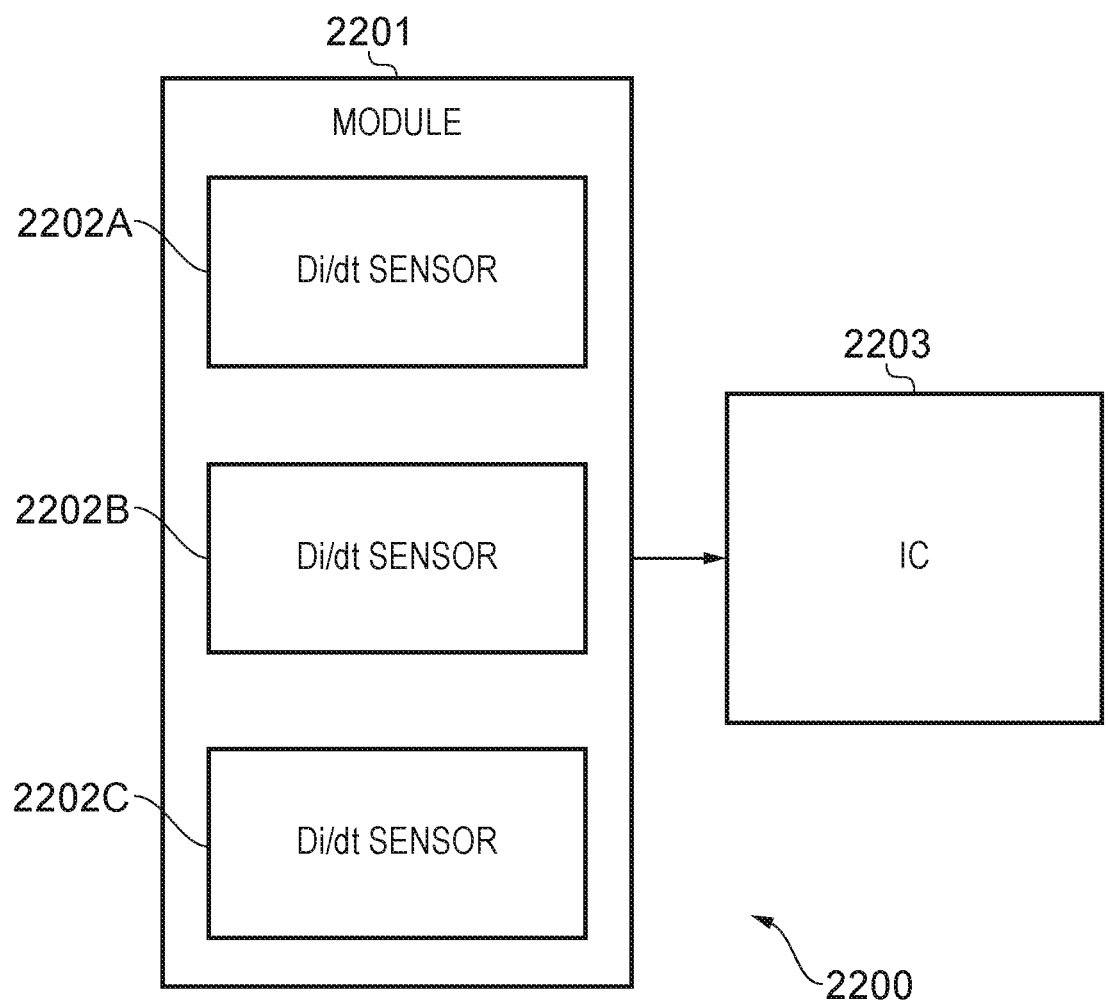
FIG. 28 is a system diagram of a current sensing system in accordance with an embodiment of the present disclosure.

FIG. 28 shows current sensing system 2200. Current sensing system 2200 includes a module 2101 having formed thereon sensors 2202A, 2202B and 2202C. Module 2201 is coupled to IC 2203. All of the components can be carried on a single circuit board.

Figure 29:
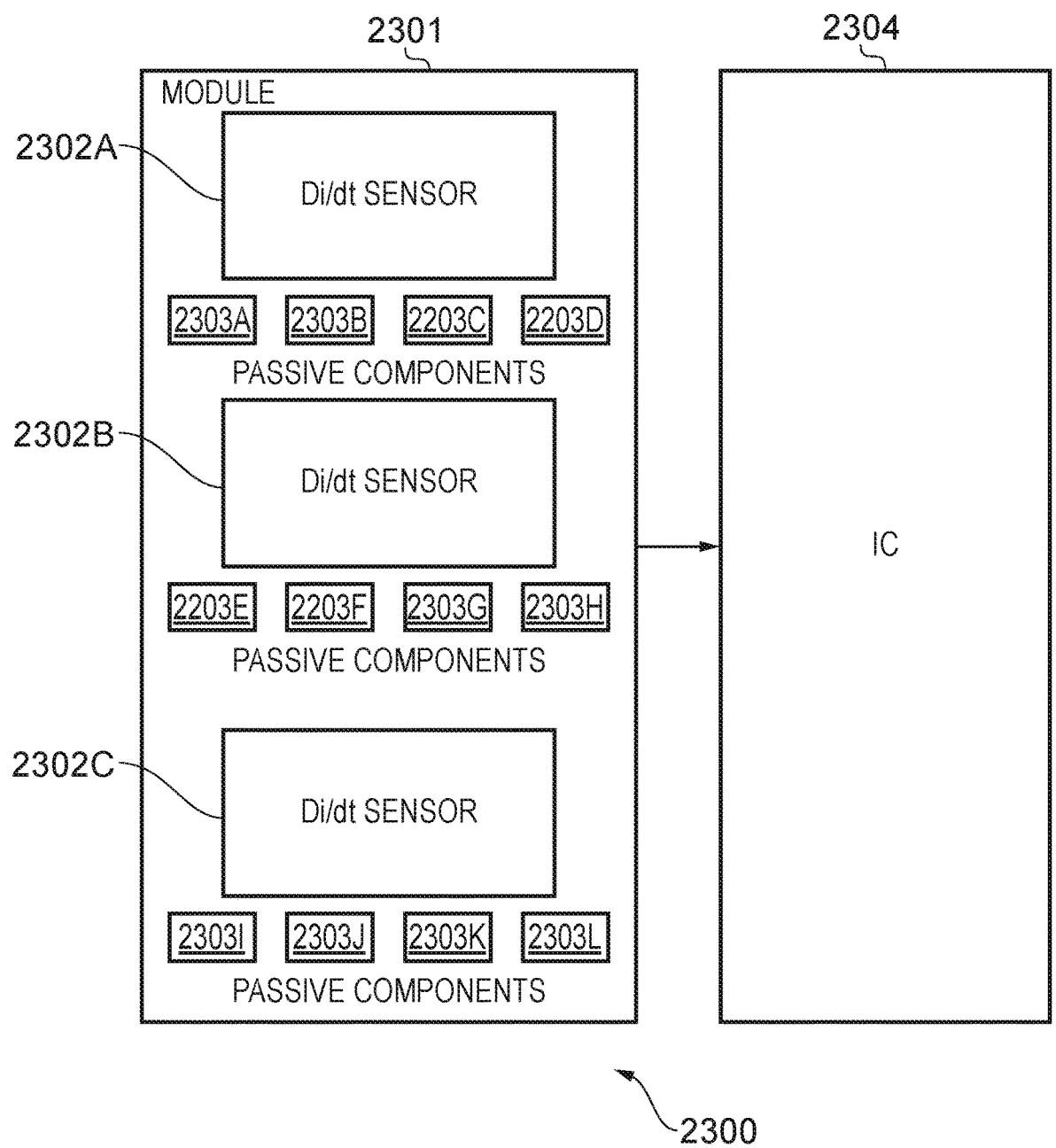
FIG. 29 is a system diagram of a current sensing system in accordance with an embodiment of the present disclosure.

FIG. 29 shows current sensing system 2300. The current sensing system 2300 includes a module 2301 having sensors 2302A, 2302B and 2302C formed thereon. The module also includes passive components 2303A to L. The module is connected to integrated circuit 2304. All of the components can be provided on a single two-layer circuit board.

Figure 30:
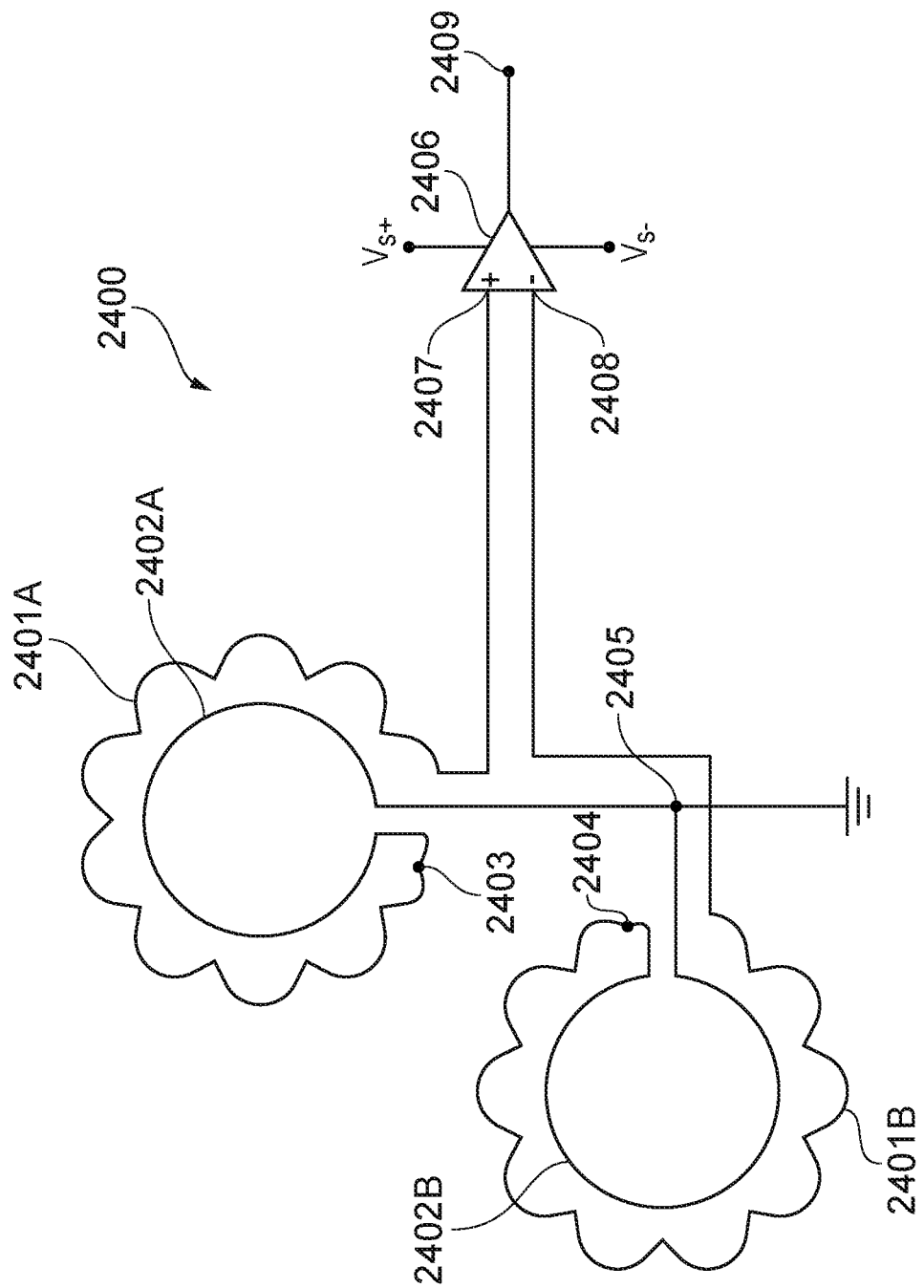
FIG. 30 is a circuit diagram showing the formation of a differential output circuit from a pair of Rogowski type current sensors.

FIG. 30 is a schematic diagram of a current sensor 2400 in accordance with an embodiment of the disclosure. FIG. 30 shows how the current sensing coils and the compensation coils may be connected together and to an amplifier. The sensor 2400 includes two current measurement coils 2401A, 2401B. Each measurement coil may take the same form as measurement coil 100 shown in FIG. 4, 5 or 6. The sensor 2400 also includes two compensation coils 2402A, 2402B. A first end of measurement coil 2401A is coupled to a first end of compensation coil 2402A at connection 2403. A first end of measurement coil 2401B is coupled to a first end of compensation coil 2402B at connection 2404. The second ends of the compensation coils 2402A, 2402B are coupled together at connection 2405. Connection 2405 is also coupled to ground. The current sensor 2400 also includes a differential amplifier 2406. A second end of measurement coil 2401A is coupled to the non-inverting input 2407 of amplifier 2406. A second end of measurement coil 2401B is coupled to the inverting input 2408 of the amplifier 2406. The amplifier 2406 generates an output at 2409. The differential amplifier 2406 amplifies any differential signals produced by the current measurement coils. The amplifier is effective at rejecting common mode noise.

It is thus possible to provide a relatively inexpensive PCB based Rogowski coil like sensor with good rejection of interfering magnetic fields.

Figure 31:
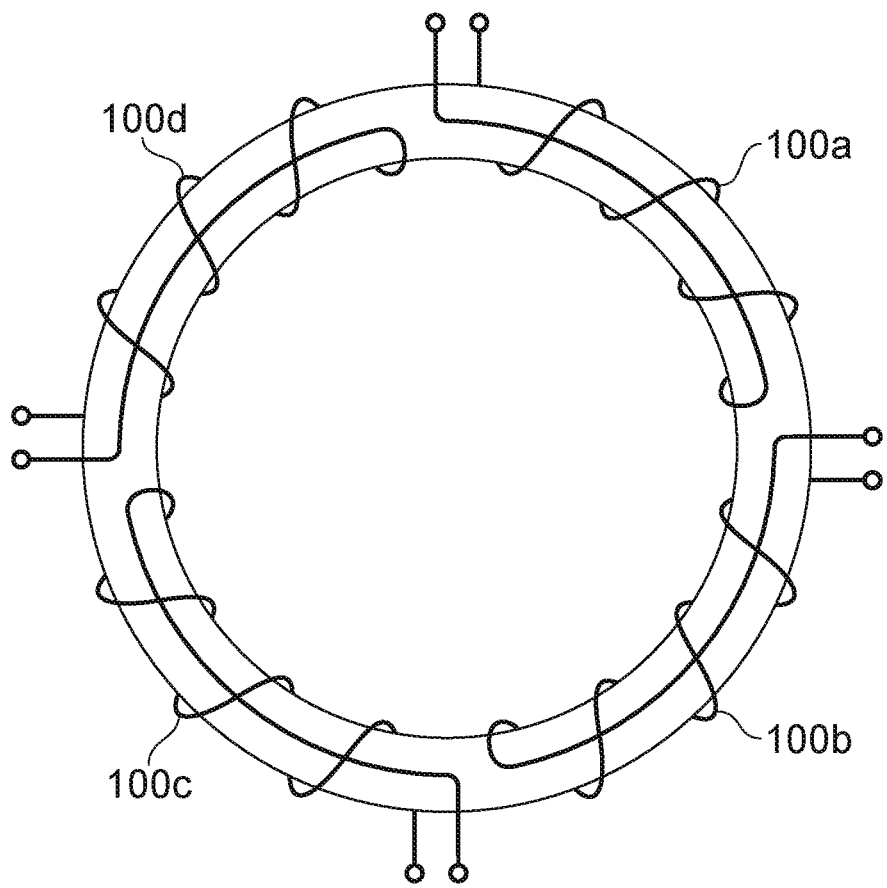
FIG. 31 shows how a Rogowski coil may be further segmented.

FIG. 31 schematically illustrates a Rogowski coil which has been subdivided into four coil segments 100a, 100b, 100c and 100d. Each coil segment comprises a measurement coil and a compensation conductor returning along the path of the measurement coil. This degree of segmentation can be extended to the embodiments described hereinbefore. Thus the printed circuit board Rogowski coil for example as described with respect to FIGS. 4 to 6 can be segmented in the manner shown in FIG. 31. The segmentation allows for gaps in the coil to be provided such that the sensor board 101 may be slid around an existing conductor. A physical gap may be provided in the board such that the conductor can be introduced into the center of the Rogowski-type coil and the corresponding gap in the coil winding may be made opposite the physical gap in order to maintain symmetry. In some embodiments of this disclosure the segments are formed on different boards and are arranged with mechanical features, such as pivots, hinges and/or removable fasteners, such that the boards can be opened or otherwise arranged around the conductor and then closed or fastened together so as form a ring around the conductor carrying the current to be measured. The different boards may be provided on different planes and have features formed there to define their relative positions with respect to one another in the closed position. The relative positions of the boards are advantageously selected so as to minimize the size of any air gaps within the path of the measurement coil. Multiple boards may, for example, be provided in a plurality of planes such that different segments of the Rogowski type sensor have an average position in the same plane.

Figure 32:
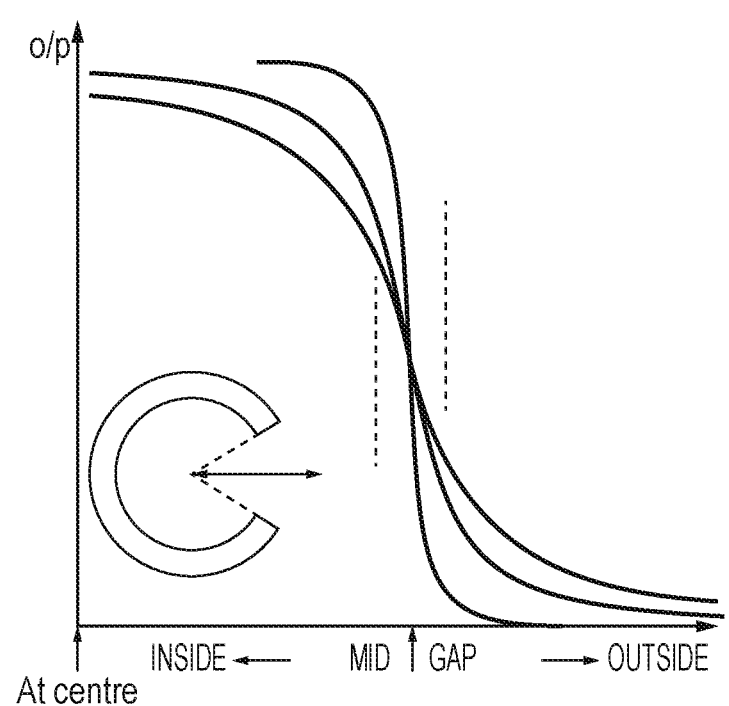
FIG. 32 shows the effect of a gap in the measurement coil.

FIG. 32 schematically illustrates the effect of target conductor positioning with respect to the gap in the measurement coil. It can be seen that as long as the target conductor is introduced to the gap and remains close to the center of the measurement coil then there is little reduction in sensitivity.

Figure 33:
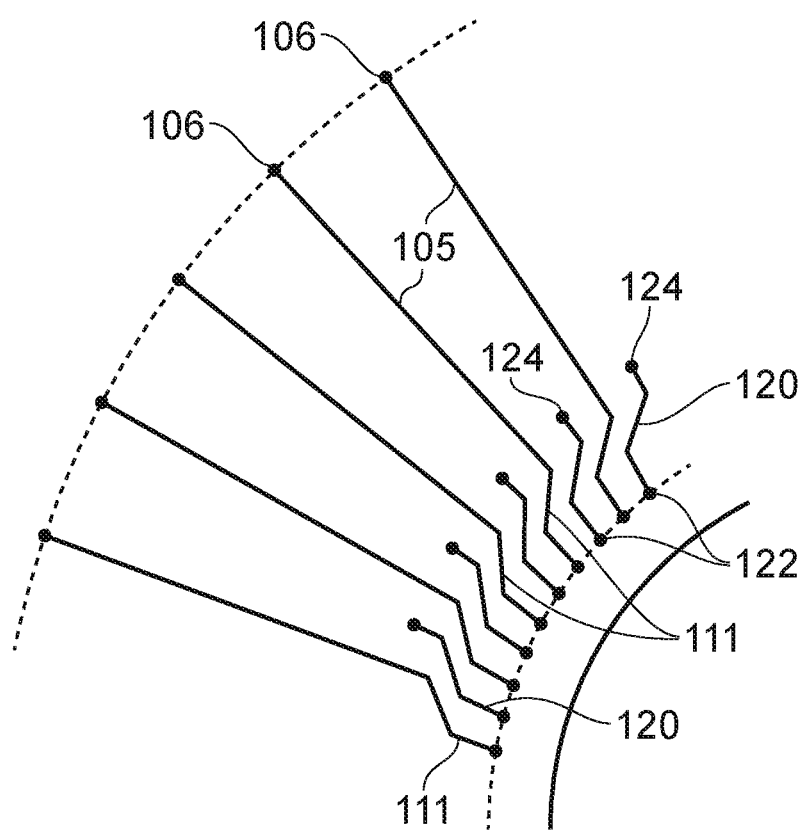
FIG. 33 schematically shows part of an embodiment where the measurement coil advancement and the compensation coil are formed at an innermost end of the radial elements.

As noted hereinbefore, the measurement coil advancement by way of the kinks 111 and the compensation conductor need not be placed at the radially outermost edge of the board. This is often a convenient position when the diameter of the target conductor is small. However, it can also be seen that bringing the advancement radially inwards reduces the size of the parasitic coil and consequently there is some advantage to be gained by moving the advancement away from the outer edge of the Rogowski-type coil and moving it towards the inner edge. The advancement can in fact be placed at any distance along the measurement coil conductors. FIG. 33 schematically illustrates an arrangement in which the advancement conductors 111 have been moved to the radially inward side of the Rogowski style measurement apparatus, as have the compensation conductors 120. The conductors are still associated with their respective vias as hereinbefore described with respect to FIGS. 4 to 6.

Figure 34A:
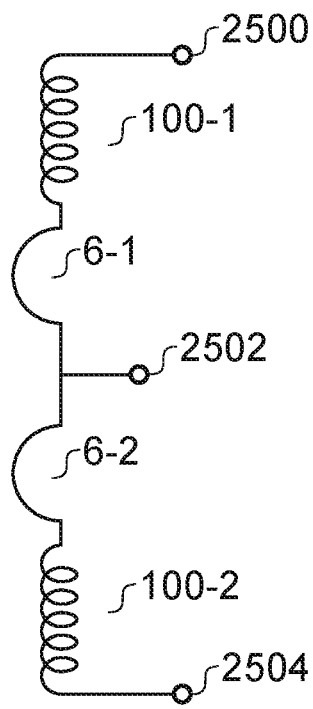
FIGS. 34a and 34b show connection arrangements for a pair of Rogowski type current sensors.
Figure 34B:
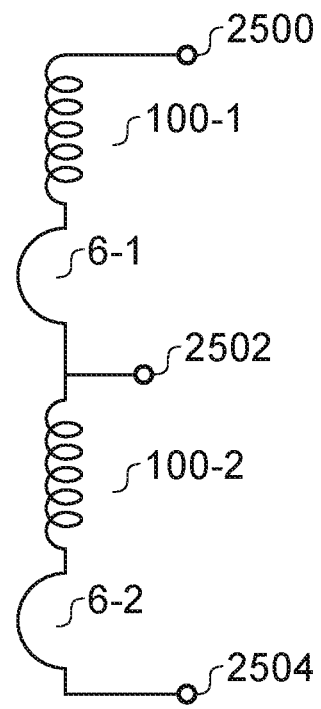

FIGS. 34a and 34b show the electrical interconnections between a pair of Rogowski-type sensors as described hereinbefore provided in a differential output circuit. In each case the Rogowski-type sensors comprise a measurement coil 100 and a compensation coil 6. In FIG. 34a a first coil comprising measurement coil 100-1 and compensation coil 6-1 is connected between a first terminal 2500 and a second terminal 2502. A second sensor comprising a second measurement coil 100-2 and a second compensation coil 6-2 is connected between terminals 2502 and 2504. It can be seen in FIG. 34a that the compensation coils 6-1 and 6-2 are provided in direct connection with node 2502. In contrast and as shown in FIG. 34b both coils may have the same sense in which case node 2502 is directly connected to compensation coil 6-1 but also to measurement coil 100-2.

In a high precision design of a Rogowski coil, it is sensible to take account of changes in the coil response resulting from changes in temperature. For a PCB based coil, the response of a Rogowski type coil changes with temperature. The variation in response depends on the coil design and the materials used to form the coil and the circuit board.

Printed circuit boards can be made from several materials. A common material is a glass-epoxy material known as FR4. Such a materials can have anisotropic properties, for example some sources suggest that the coefficient of thermal expansion in the X-direction is $14 \times 10^{-6}$, in the Y-direction is $12 \times 10^{-6}$ and in the Z direction is $70 \times 10^{-6}$ (unverified Wikipedia page https://en.wikipedia.org/wiki/FR-4). The coefficient of thermal expansion of copper is $17 \times 10^{-6}$ and the thermal coefficient of resistivity of copper is $3.7 \times 10^{-3}$.

The thermal expansion coefficient of copper and FR4 in the plane of the circuit board are very similar and the copper will dominate at $17 \times 10^{-6}$. However in the Z plane the expansion of the circuit board material dominates. This data allows the effective expansion coefficient for the Rogowski coil current sensor to be calculated, based on knowledge of the coil dimensions and the thickness of the circuit board. Assume a circular measurement coil.

Area $A_0$ at nominal working temperature $T_0$, the coil cross section is $A_0 = X_0 \times Z_0$, where $X_0$ represents the effective width of the coil (between the innermost and outermost edges of the coil) and $Z_0$ represents the thickness of the coil (mainly defined by the thickness of the circuit board, but the thickness of the copper track on the circuit board also needs to be taken into account).

After a rise of 1 degree the area $A_1 = X_0(1+17 \times 10^{-6}) \times Z_0 (1+70 \times 10^{-6})$.

However it can be seen than given the dimensions of the coil, an effective coefficient of thermal expansion can be calculated, and it will be in the range of 17 to 70 ppm depending on the aspect ratio of the coil.

For the sake of simplicity we shall assume that the calculation for an example Rogowski style sensor on a PCB has yielded an effective expansion coefficient of 50 ppm.

This increase in area gives an increase in output voltage having an equivalent temperature coefficient of 50 ppm in this example. To counter this, the gain applied to the output needs to decrease by 50 ppm/K.

The copper track forming the coil has a resistance $R_{coil}$. This can be used in combination with another resistor to change the gain of an amplifier such that the gain reduces with increasing temperature so as to wholly or partially compensate for the increase in measurement coil output voltage due to thermal expansion of the measurement coil.

The temperature coefficient of resistance of copper is around +3700 ppm. The inventor realized that compensation for expansion could be achieved as long as the resistors associated with the amplifier has a lower temperature coefficient of resistance. On chip resistors fabricated by Analog Devices can achieve temperature coefficients of +750 ppm but compensation can be achieved with higher or lower values of temperature coefficient of resistance.

Figure 35:
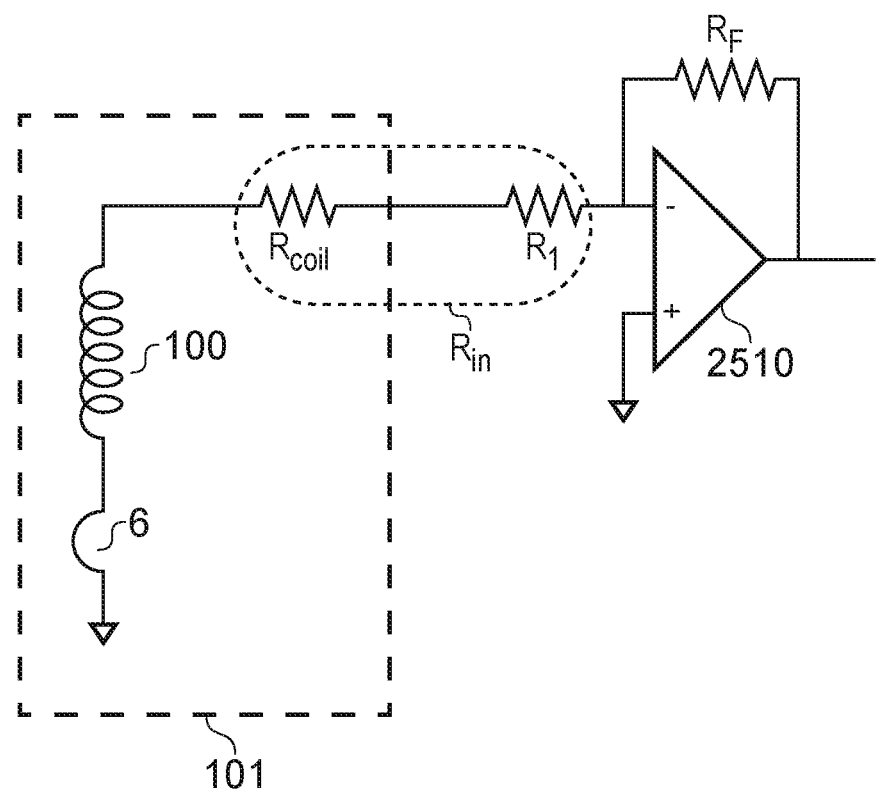
FIG. 35 shows a measurement circuit with temperature correction.

FIG. 35 shows an inverting amplifier configuration. The gain of such an amplifier is $$\text{Gain} = -R_F/R_{IN}$$

Here $R_{IN} = R1 + R_{coil}$

So $\text{gain} = -R/(R1 + R_{coil})$

A 1 degree rise in temperature, assuming a resistor temperature coefficient of 750 ppm, gives a gain G1 of $$G1 = -R_F(1+750 \times 10^{-6})/(R(1+750 \times 10^{-6}) + R_{coil}(1+3700 \times 10^{-6})).$$

The goal is that G1-G is equal to −50 ppm to compensate the coils expansion of +50 ppm, so:

$$(-R_F(1+750\times10^{-6})/(R1(1+750\times10^{-6})+R_{coil}(1+3700\times10^{-6})))-(-R_F/(R1+R_{coil}))=-0.00005$$

To simplify make $R_F=R1$ as the absolute gain does not matter for the purpose of this calculation, so $$(-R1(1+750\times10^{-6})/(R1(1+750\times10^{-6})+R_{coil}(1+3700\times10^{-6})))-(-R1/(R1+R_{coil}))=-0.00005$$

Re-arranging $$R1/(R1+R_{coil})=(-0.00005(R1(1+750\times10^{-6})+R_{coil}(1+3700\times10^{-6}))+(R1(1+750\times10^{-6}))/(R1(1+750\times10^{-6})+R_{coil}(1+3700\times10^{-6})))$$

$$R1/(R1+R_{coil})=(0.99995(R1(1+750\times10^{-6})+R_{coil}(1+3700\times10^{-6}))/(R1(1+750\times10^{-6})+R_{coil}(1+3700\times10^{-6}))$$

If we assume now $R1=K*R_{coil}$ $$K/(K+1)=(0.99995K(1+750\times10^{-6})+(1+3700\times10^{-6}))/(K(1+750\times10^{-6})+(1+3700\times10^{-6}))$$

Solving for K gives $R1 \sim 60*R_{coil}$

The coil resistance is generally low, giving R1 in the range of several hundred to several kilo-ohms. The amplifier 2510 can be differential and may have an output common mode voltage applied if desired to offset the output voltage to facilitate use of single ended supplies. The amplifier may include features such as auto zeroing to reduce the effects of input referred offsets and chopping may also be used for noise shaping. The amplifier may also have an attenuator formed by resistors of differing values and temperature coefficients at the output of the amplifier and preceding other components such as an analog to digital converter to return the signal to a common mode closer to ground. Such an arrangement will be considered with respect to FIG. 36.

Figure 36:
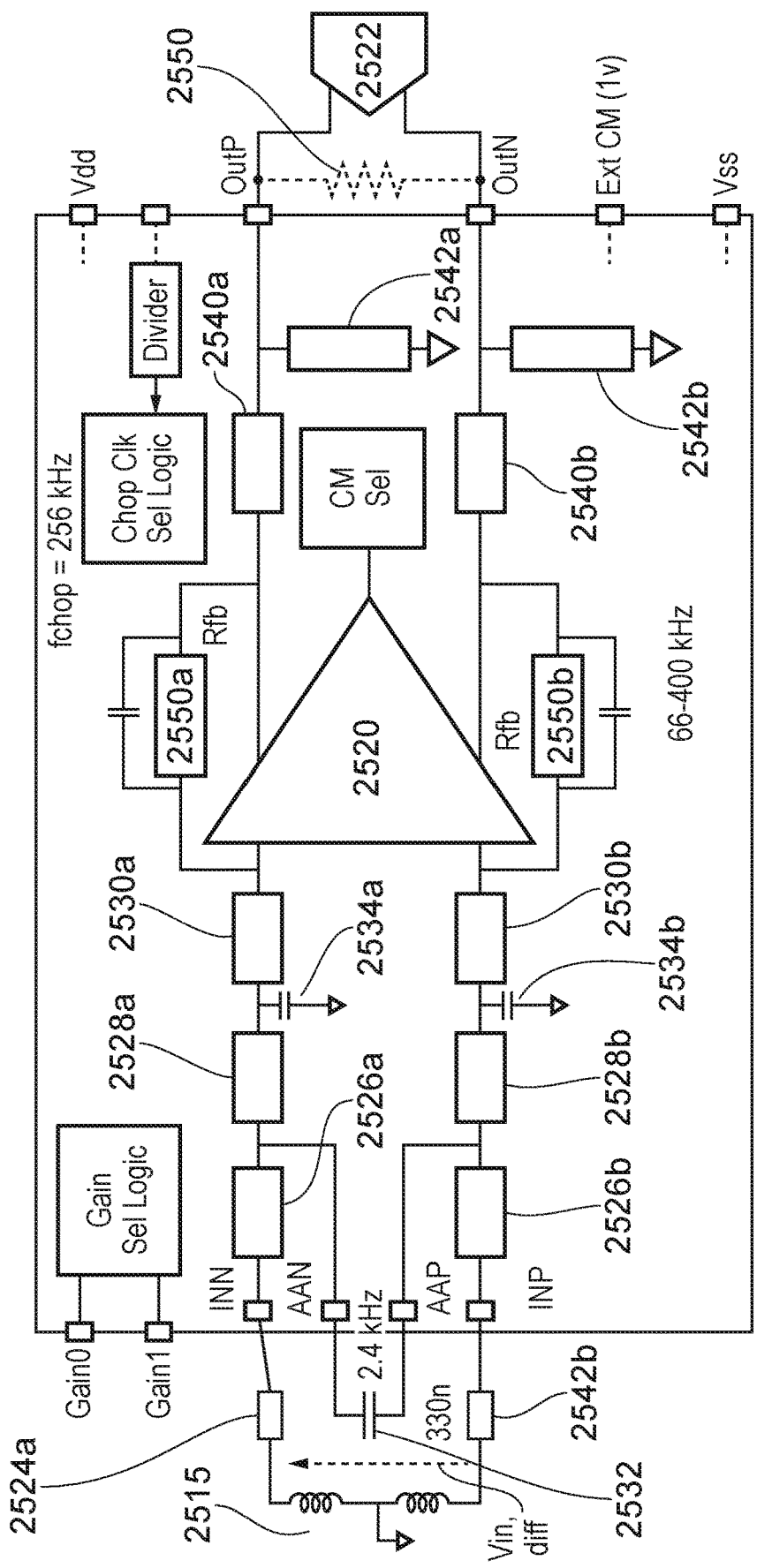
FIG. 36 shows a further embodiment of a measurement circuit in accordance with the teachings of this disclosure.

FIG. 36 shows a differential Rogowski type coil 2515 connected to a differential amplifier 2520 which amplifies the differential signal and supplies it to a differential analog to digital converter 2522. The amplifier 2520 is configured as an inverting amplifier and its gain is set by the ratio of an input resistance and the feedback resistance.

The input resistance comprises at least two resistors, one of which is the resistance $R_C$ of the Rogowski coil sensor. The or each other resistor may be an on chip resistor, or at least a resistor with a lower temperature coefficient of resistance than that of the Rogowski coil. The at least one other resistor has a resistance $R_{IN}$. In the example shown in FIG. 35 the coil resistance is represented by resistors 2524a and 2524b. The on chip input resistance is in this example formed by three series connected resistors 2526a, 2528a and 2530a, with similar resistors designated "b" in the other channel of the differential amplifier. Capacitors 2532, 2534a and 2534b are coupled to the nodes between each pair of resistors so as to provide low pass filtering. The low pass filtering is important because the response of the Rogowski coil depends on dI/dt and hence has a high pass response. Low pass filtering protects the amplifier input stage from being over driven or saturated in the presence of high frequency harmonics in the current being measured. The filters also provide an anti-aliasing function. By way of non-limiting example resistors 2526a, 2526b, 2528a and 2528b may have resistances in the region of 100 ohms. Resistors 2530a and 2530b may have resistances of around 200 ohms. Capacitor 2532 may have a capacitance of around 200 to 500 nF, for example 330 nF, so as to form a low pass filter with −3 db break point at around 2-3 kHz. Capacitors 2534a and 2534b may have capacitances in the region of a few pF to several tens of pF.

If we consider the temperature coefficient of amplifier gain, then as on chip feedback resistance has the same temperature coefficient as the on chip resistors in the signal path from the coil, then we need merely consider the input side components when calculating a temperature coefficient of the gain. If we define the following values:
Coil resistance=$R_C$
PCB metal temperature Coefficient=$B_{TC}$
Amplifier independence=$R_{IN}$
Amplifier resistor temperature coefficient=$R_{ATC}$
Then the temperature coefficient of the gain of the amplifier can be expressed as:

$$\text{Gain}(Tc) = -\frac{(B_{TC} - R_{ATC}) * R_C}{(R_C + R_{IN})}$$

Turning our attention to the output side of the amplifier, the output nodes of the amplifier can be connected to output resistors 2540a and 2540b. The resistors 2540a and 2540b act as the major contribution in defining an amplifier output impedance $R_{OUT}$.

The output resistors can form a potential divider with resistors 2542a and 2542b each connected to ground or alternatively a single resistor can be connected between resistors 2542a and 2542b. These resistors act to define a differential output impedance of the potential divider $R_{DIV}$.

The differential outputs OutP and OutN from the potential dividers are connected to first and second inputs of the differential analog to digital converter 2522. The converter 2522 has an input impedance $R_{ADC}$ and a temperature coefficient of input impedance $R_{ADCTC}$.

If we define the following values:
Output impedance=$R_{OUT}$
Differential output impedance=$R_{DIV}$
Amplifier resistor temperature Coefficient=$R_{ATC}$
Differential input impendence of ADC=$R_{ADC}$
ADC input impedance Temp Coefficient=$R_{ADCTC}$
Then the attenuation temperature coefficient of the attenuator can be expressed as:

$$\text{Attenuator}(Tc) = \frac{(R_{ATC} - R_{ADCTC}) * R_{DIV}}{(R_{DIV} + R_{ADC})}$$

The overall temperature coefficient of the signal processing stage of FIG. 36 can be represented as:

Signal processing stage($T_C$)=Gain($T_C$)+Attenuator($T_C$).

By way of non-limiting example the resistors 2540a and 2540b may have values of several K Ohm, e.g. 3 kOhm, and resistors 2542a and 2542b may have values of a similar order of magnitude as resistors 2540a and 2540b, for example 1 kOhm. The feedback resistors 2550a and 2550b may typically be in a range of 12 k to 72 kOhm. A measurement of the coil resistance and the input resistance of the amplifier, can allow for a suitable value of the load resistor. Additionally a further resistor 2550 may be provided to change the effective impendence of the analog to digital converter 2522. The value of this resistor 2550 can be selected as a function of the values of the other resistors (using the principles underlying the above calculations) to provide further trimming of the circuit as a function of temperature so as to compensate for the expansion of the Rogowski style coil. The resistor 2550 may be a discrete low temperature coefficient component. Where such a component is provided its value is likely to be in the range of 10's of kilo-ohms, although this statement is given by way of guidance only and should not be construed as limiting.

Figure 37:
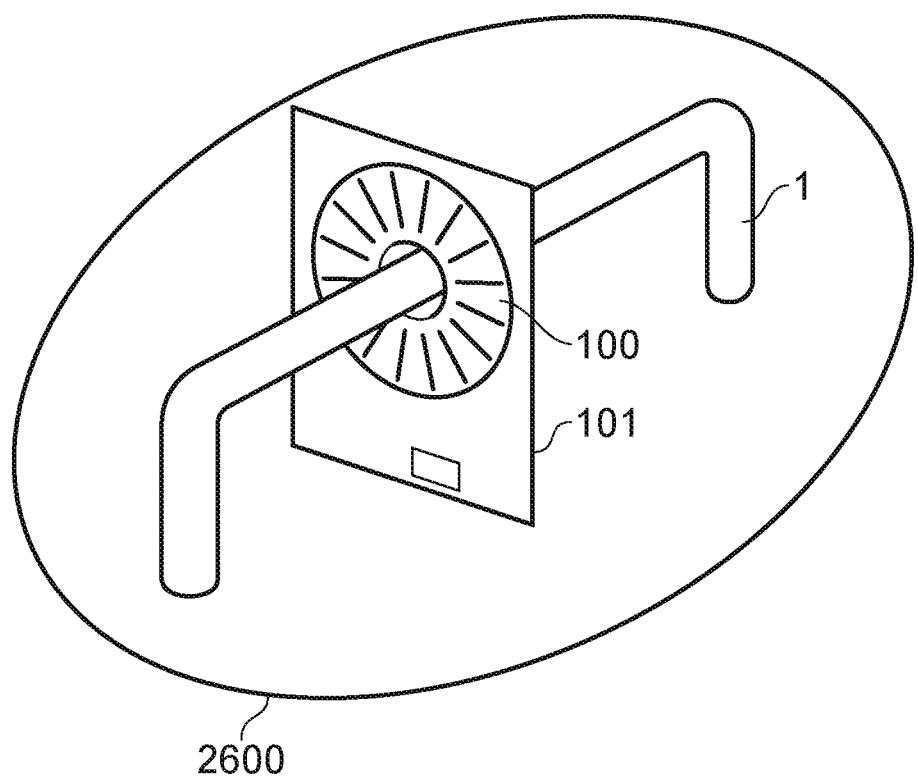
FIG. 37 shows positioning of a sensor in accordance with this disclosure within a first embodiment of a power meter.

FIG. 37 shows a coil board 101 carrying a measurement coil 100 and a compensation coil not shown positioned around a conductor (busbar) 1 in a meter corresponding to an ANSI (American national standards institute) configuration electricity meter 2600.

Figure 38:
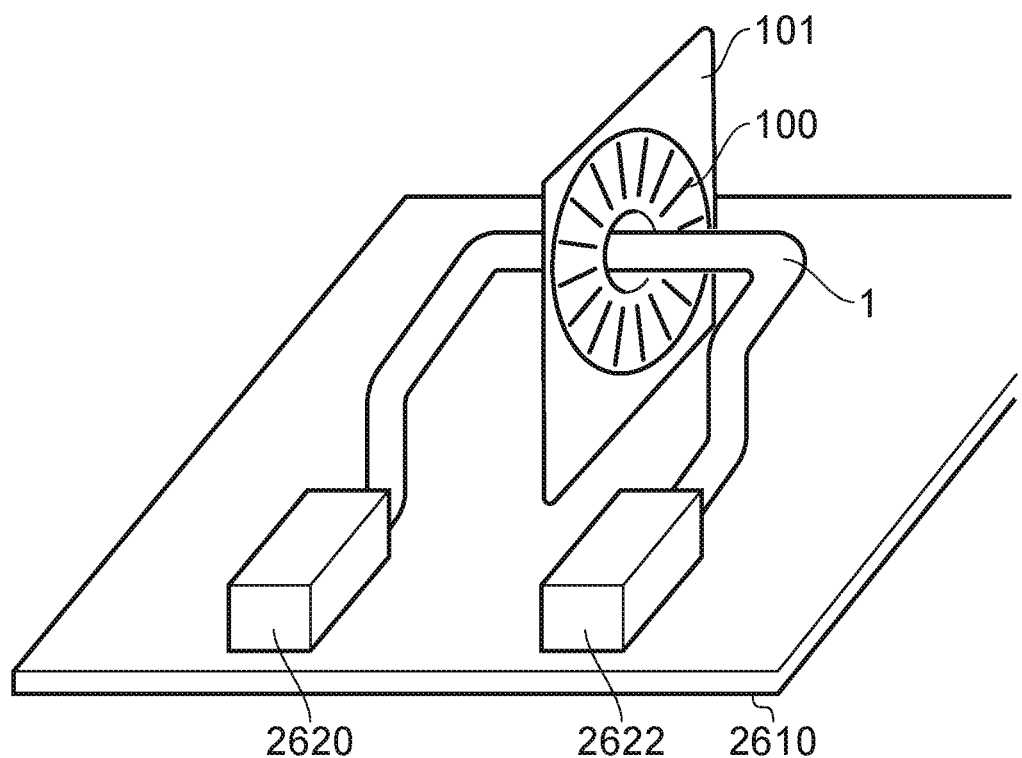
FIG. 38 shows positioning of a sensor in accordance with this disclosure within a second embodiment of a power meter.
Figure 39:
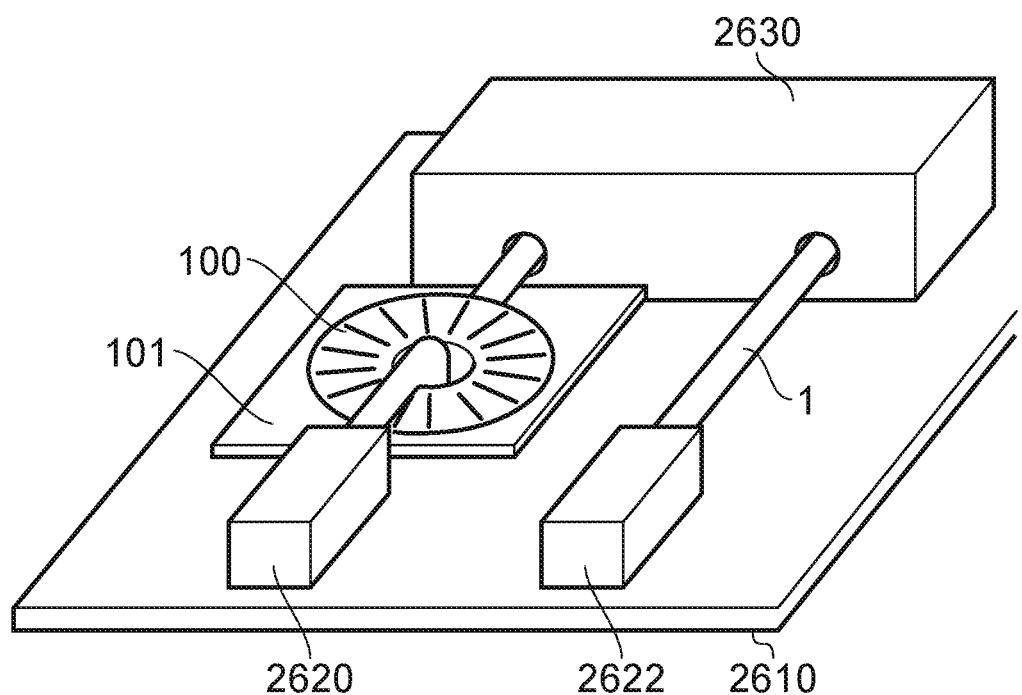
FIG. 39 shows positioning of a sensor in accordance with this disclosure within a third embodiment of a power meter.

FIG. 38 shows a coil board 101 carrying a measurement coil 100 and a compensation coil not shown positioned around a conductor (busbar)1 in a meter corresponding to an IEC (international electrotechnical commission) configuration meter 2610 where the conductor 1 has contacts 2620 and 2622 on the same side of the meter housing. In FIG. 39 the coil board is mounted parallel to the substrate 2610 whereas in the arrangement shown in FIG. 38 it was perpendicular to the substrate. FIG. 39 also includes a controllable disconnection device (relay or circuit breaker) 2630 on the substrate 2610. The arrangement shown in FIG. 39 may be modified to include a second Rogowski type coil sensor around the conductor 1 between the disconnection device 2630 and the contact 2622. The two sensor coils can be connected in series to provide a combined output which is twice as sensitive to the target current compared to the single coil variant shown in FIG. 39.

Figure 40:
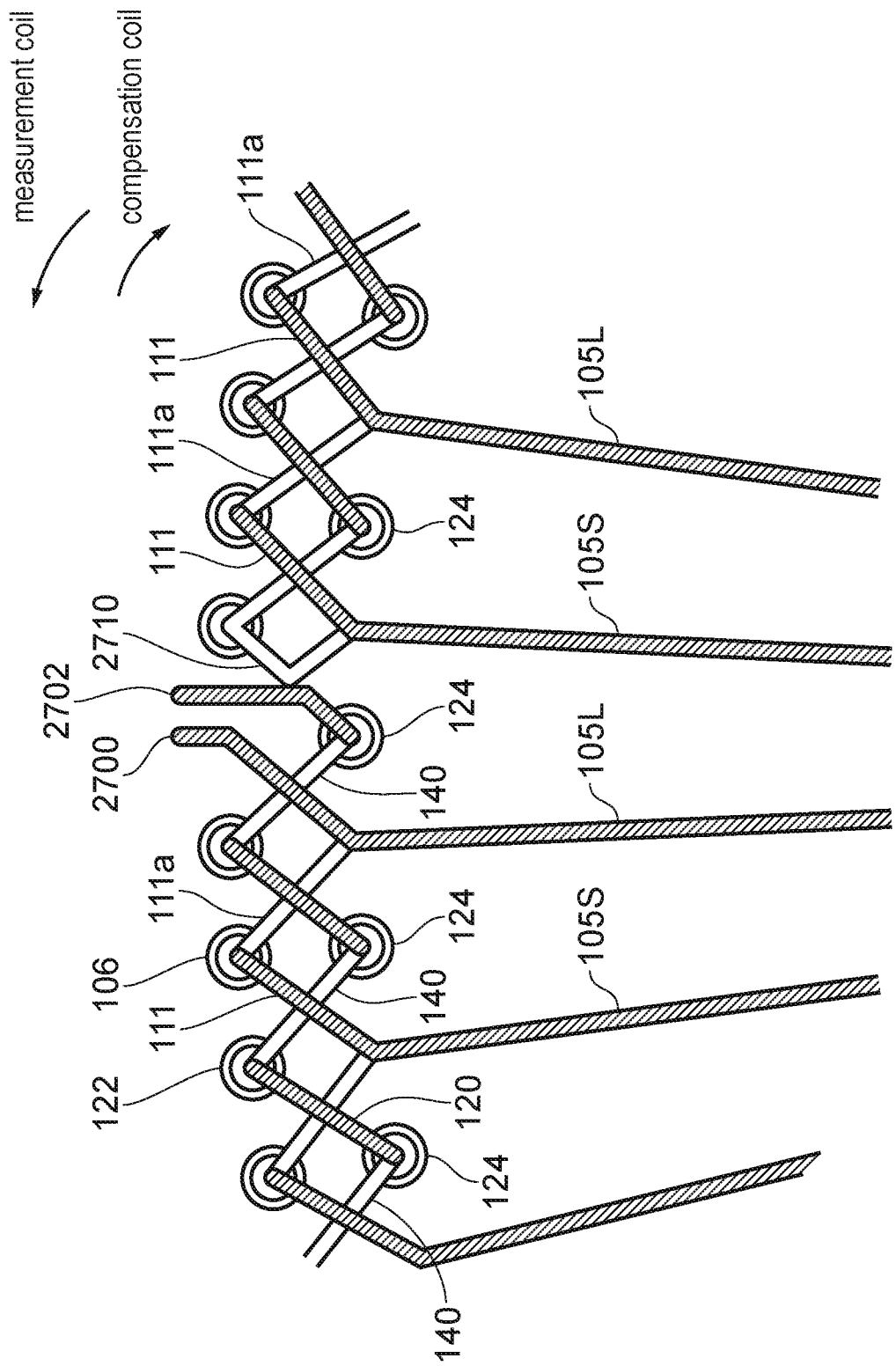
FIG. 40 shows one embodiment of a connection between an end of the measurement coil and the compensation coil.

FIG. 40 shows the connection between the measurement and compensation coils in an embodiment of this disclosure. The same numbering scheme has been used as was used to describe FIG. 8. The connection to the measurement coil 100 is made by way of conductive tracks 2700. From track 2700 the measurement coil advances in an anticlockwise direction by way of a connection portion 111. The path then runs along major portion of a measurement conductor 105L, to a via 107, swaps to the other side of the board, runs back along 105L on the second side of the board, advances along connection portion 111a to via 106, then comes to the top side, connects to connection portion 111, then 105S and so on. As the measurement coil approaches the conductor 2702, in needs to connect with the compensation coil formed by segments 120 and 140 which intertwine with the connection portions 111 and 111a. To do this a linking portion 2710 is provided adjacent the track 2702 and which takes the place of half of one of the conductors 111a and half of one of the conductors 140.

The current sensor described herein can be used in a multitude of supply configurations. In some installations a split single phase is used such that the maximum voltage difference of either of the conductors with respect to ground in reduced. In effect a single phase is provided by way of a center tapped transformer. The current flow paths to a dwelling wired in a single phase 3 wire configuration can be regarded as having first and second Live wires L1 and L2 and a neutral. Typically for such a configuration the neutral conductor is not taken into an electricity consumption meter.

Figure 41:
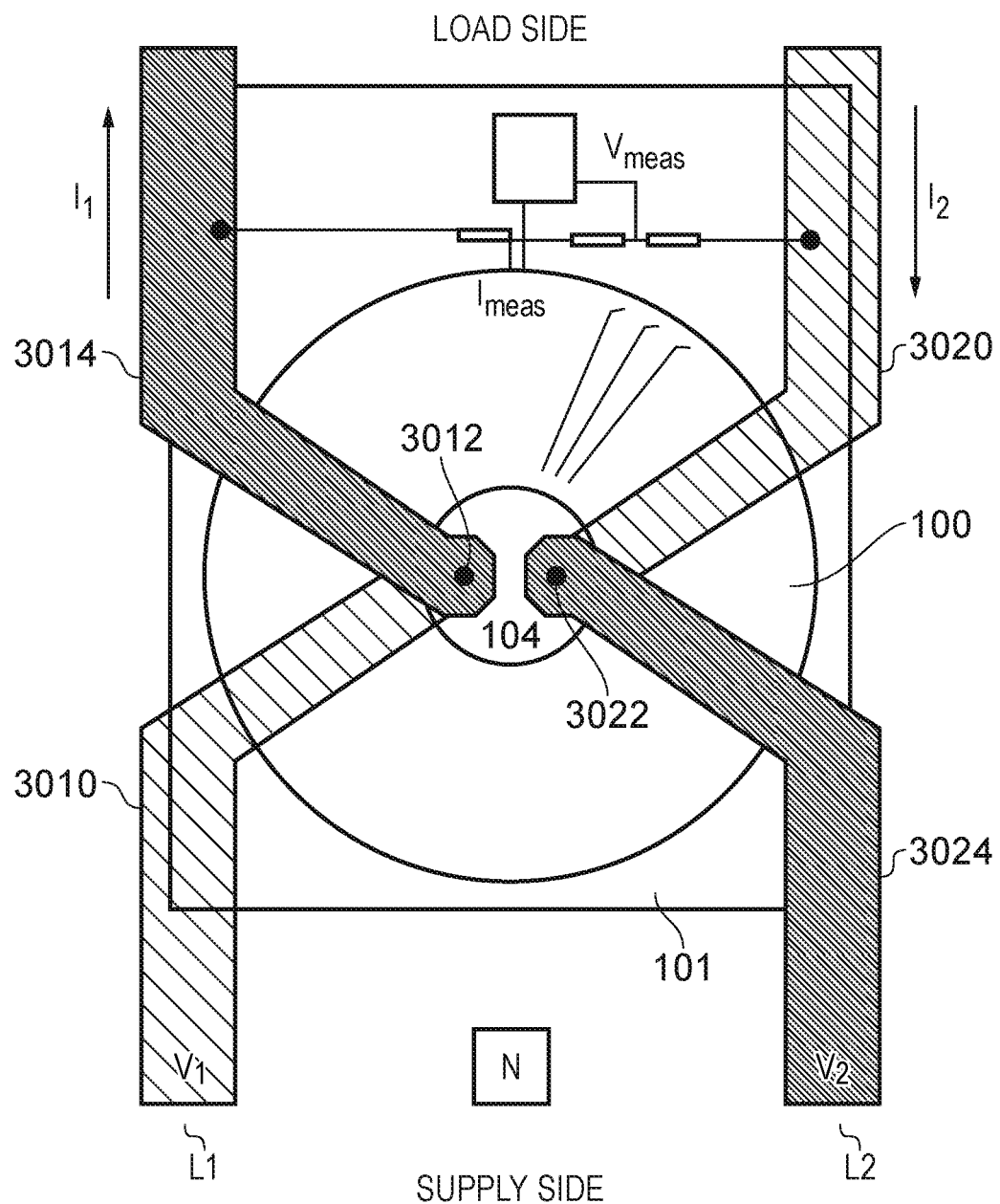
FIG. 41 is a plan view of a further embodiment of this disclosure showing a Rogowski type current sensor suitable for use with US style 3 wire single phase systems.

FIG. 41 shows how a Rogowski type current measurement sensor can be used to measure current in first and second current flow paths. In the arrangement shown a Rogowski type coil 100 in accordance with the teachings of this disclosure is carried on a coil board 100. Two current paths L1 and L2 act to carry currents that are 180 degrees out of phase. The current measurement circuit is typically provided as part of a watt-hour meter that sits between a supply side and a load side of an electrical distribution system, for example where the electricity supply enters a dwelling.

The first conductor is, in this arrangement, formed as a first metallic element 3010 that extends from connector (not shown) that allows the meter to be connected to the mains supply. The first element 3010 passes beneath the board 101 and extends towards the aperture 104 to terminate at a through board connection 3012. The through board connection 3012 forms a current flow path to a second metallic element 3014 which is formed on or passes above the upper surface of the coil board and which extends towards a further connection (not show) to connect with the domestic wiring. Thus the elements 3012 and 3014 form a first path L1 that flows from the underside of the board 101 to the top side of the board. A second current flow path L2 carries a current from the other phase in the opposite direction (it should be noted that the currents may not always be equal). The second current flow path is formed by a third metallic element 3020 which extends from a connector (not shown) beneath or on the lower surface of the coil board 101 towards the aperture 104 where is makes contact with a through board connector 3022. The connector is also in contact with a fourth metallic element 3024 which extends from the aperture 104 over of on an upper surface of the board towards a further connector (not shown).

It can be seen that the magnetic fields from the current flow through the through board connectors 3012 and 3022 are additive. In such an arrangement we only need one current measurement and one voltage measurement to calculate the power consumed.

The conductors L1 and L2 could be arranged to make multiple passes through the Rogowski coil, for example using the approaches described with respect to FIGS. 16 to 18. The conductors L1 and L2 could be formed by insulated wire.

From inspection we can see that the instantaneous power $P_1$ delivered from Line L1 is $$P_1=(V_1-V_n)*I_1$$

and the instantaneous power $P_2$ on Line L2 is $$P_2=(V_2-V_n)*I_2$$

Where
$V_1$ is the instantaneous voltage of L1
$I_1$ is the instantaneous current flowing in L1
$V_2$ is the instantaneous voltage of L2
$I_2$ is the instantaneous current flowing in L2, and
$V_n$ is the neutral voltage.
The total power consumed is $P_{total}=P_1+P_2$ There is no access to the neutral as it typically does not enter the meter so an approximation is used based solely on measuring the potential difference between $V_1$ and $V_2$.

$$V_{meas}=(V_1-V_2)/2=(V1-Vn)=-(V2-Vn)$$

To compensate Current on in L2 (which can be regarded as Phase 2) being 180 Degrees out of phase with the estimated voltage, the current $I_1$ on L1 (which can be regarded as being phase 1) is combined with the inverse of the current $I_2$ on Phase 2.

$$I_{meas}=(I_{L1}-I_{L2})=I_{L1}+(-I_{L2})$$

The voltage and current measurements are multiplied to obtain total the total power $$P_{total} = V_{meas} * I_{meas} = (V1 - V2)/2 * (I_{L1} + (-I_{L2}))$$
$$= (V1 - Vn) * I_{L1} - (V2 - Vn) * (-I_{L2})$$
$$= P_1 + P_2$$

Thus the total power can be calculated by independently measuring the combined current of L1 and L2 (as performed by the single Rogowski coil) and the voltage between them, and then assigning half of the voltage difference to each of the currents. The phase shift can be taken care of, for example, by working with the magnitude of the currents.

The PCB style of Rogowski type current sensor makes matching between sensors formed on the same circuit board relatively easy as it can be achieved by repeating the exact etch pattern for the sensors. As a consequence separate Rogowski type sensors may be provided to measure the currents in L1 and L2. This approach can be used to avoid problems that may result from physically having to route the two phases through the same Rogowski type coil.

Figure 42A:
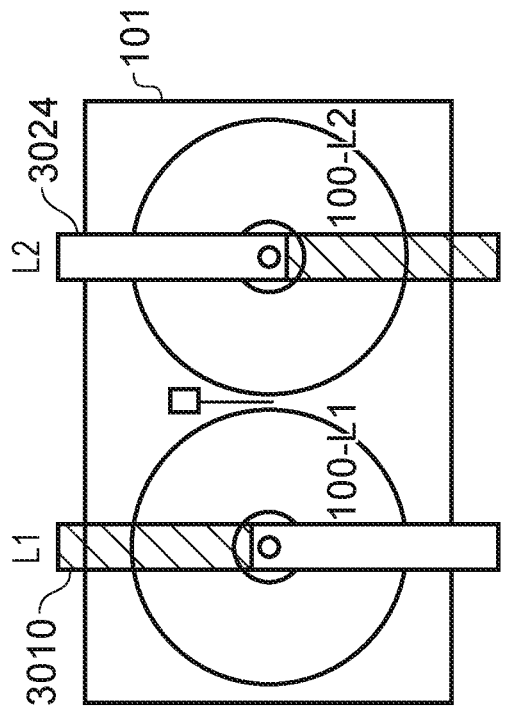
FIGS. 42a and 42b are schematic wiring and layout diagrams, respectively of a two conductor system where the directions of current flow are in antiphase and the compensation for the current flow is performed by the current carrying conductors.
Figure 43A:
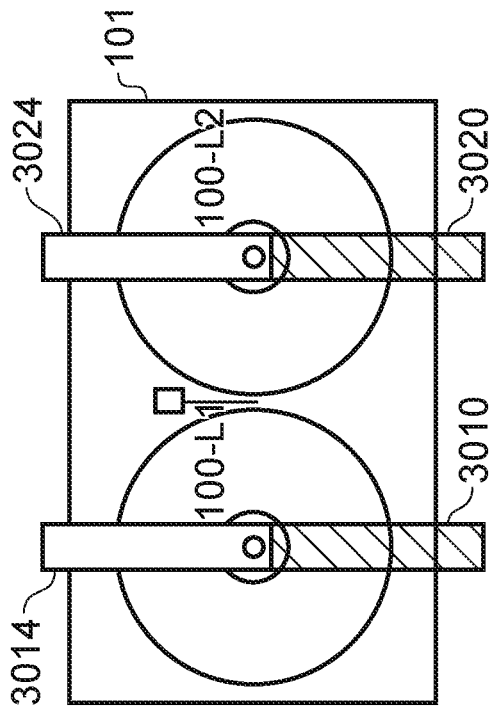
FIGS. 43a and 43b are schematic wiring and layout diagrams, respectively of a two conductor system where the directions of current flow are in antiphase and the compensation for the current flow is performed by the connections between the Rogowski style coils.
Figure 42B:
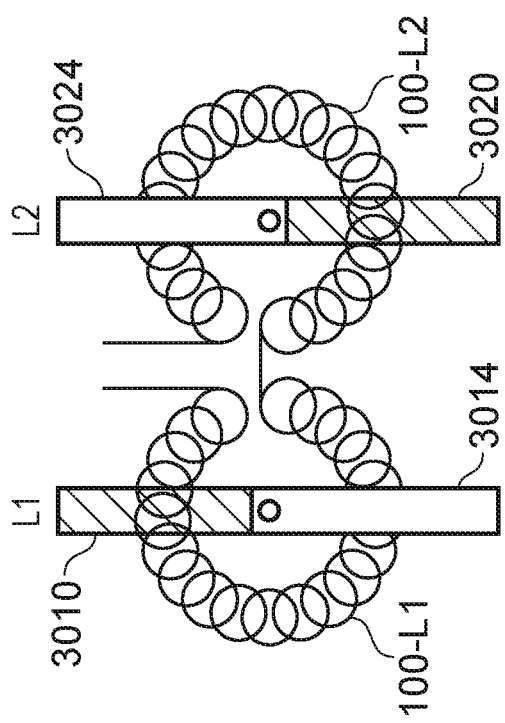
Figure 43B:
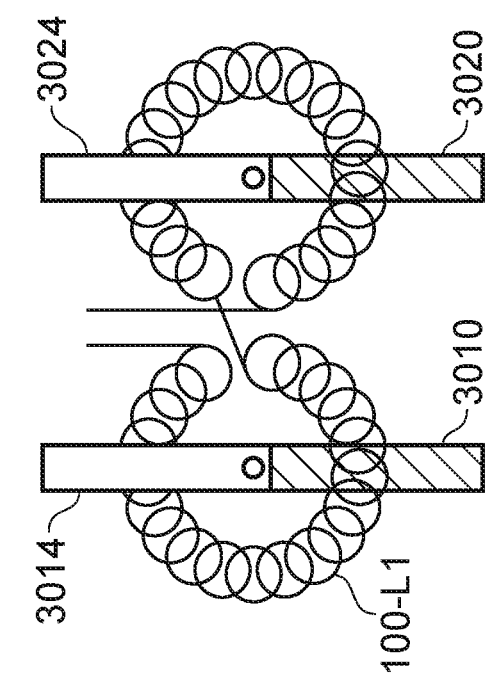

FIG. 42a schematically illustrates an arrangement based on FIG. 41, but where each path L1 and L2 has its own Rogowski coil type current sensor 100-L1 and 100-L2, respectively. FIG. 42b schematically shows the physical layout. The same numbering convention for the conductors has been used as was used in FIG. 41. Conductors 3010 and 3020 pass beneath the coil board 101 and belong to current flow paths L1 and L2, respectively. Conductors 3014 and 3024 pass above the coil board 101 and belong to current flow paths L1 and L2, respectively. In the arrangement shown in FIGS. 42a and 42b the issue of current flow reversal is handled by the through board current flows being reversed between L1 and L2. However an alternative approach is shown in FIGS. 43a and 43b, where the same numbering convention has been used. Here the direction of through board current flow in the same, and the connections between the coils 100-L1 and 100-L2 are reversed such that their outputs still combine additively. This latter approach can be used for measuring the current in first and second conductors forming out and return paths.

Figure 44A:
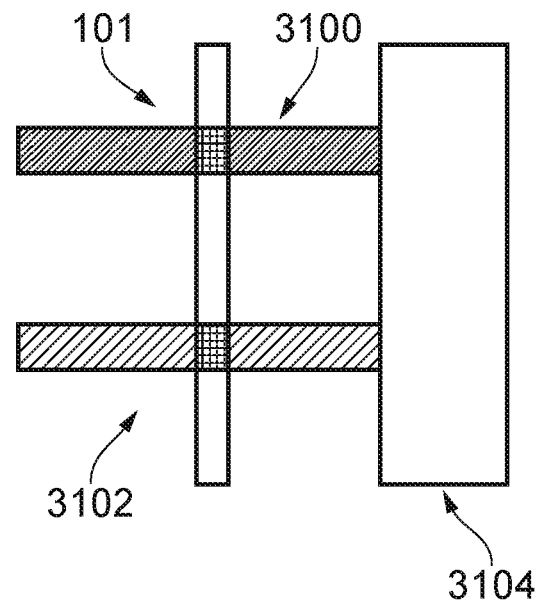
FIGS. 44a and 44b show side and plan views, respectively, of a current measurement sensor constituting a further embodiment of the present invention.
Figure 44B:
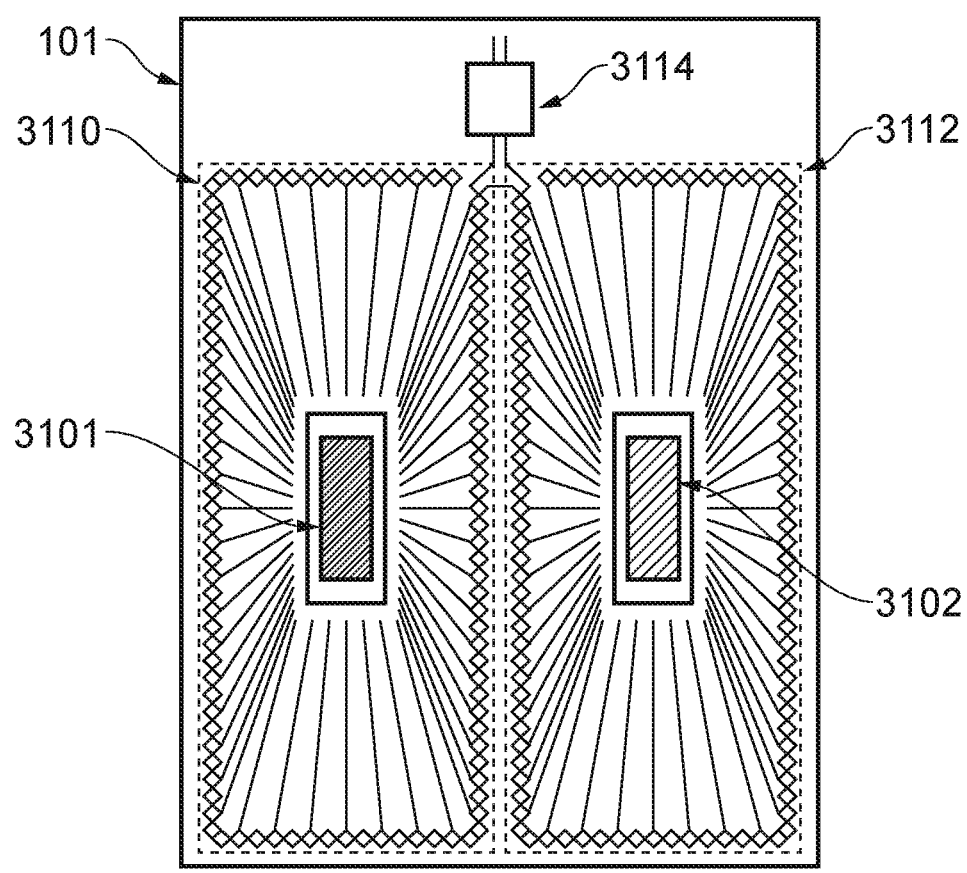

The Rogowski coils do not need to be formed in a circular configuration. Moving away from a circular configuration to a more rectangular one allow the coils to be more densely packed, especially in places where the space is confined. FIGS. 44a and 44b show a coil board 101 measuring the current flow in conductors 3100 and 3102 which supply a device 3104 which might be a load or may be a protection device. FIG. 44b shows the board 101 in plan view. Here two Rogowski coils formed in accordance with the teachings formed hereinbefore are formed as rectangular coils designated 3110 and 3112 respectively. In each case the coil advancement now occurs along a rectangular path and a compensation conductor is intertwined with the coil advancement path and follows the same rectangular path. For diagrammatic ease vias interconnecting the top and bottom sides of the coil boards have been omitted. It can be seen that the major portions of each measurement coil element still extend towards the center portion of the conductor. It can also be seen that the measurement conductors need not be equally spaced around the current carrying conductor and need not be formed of different lengths. Each of the coils 3110 and 3112 is connected to processing electronics 3114.

Figure 45A:
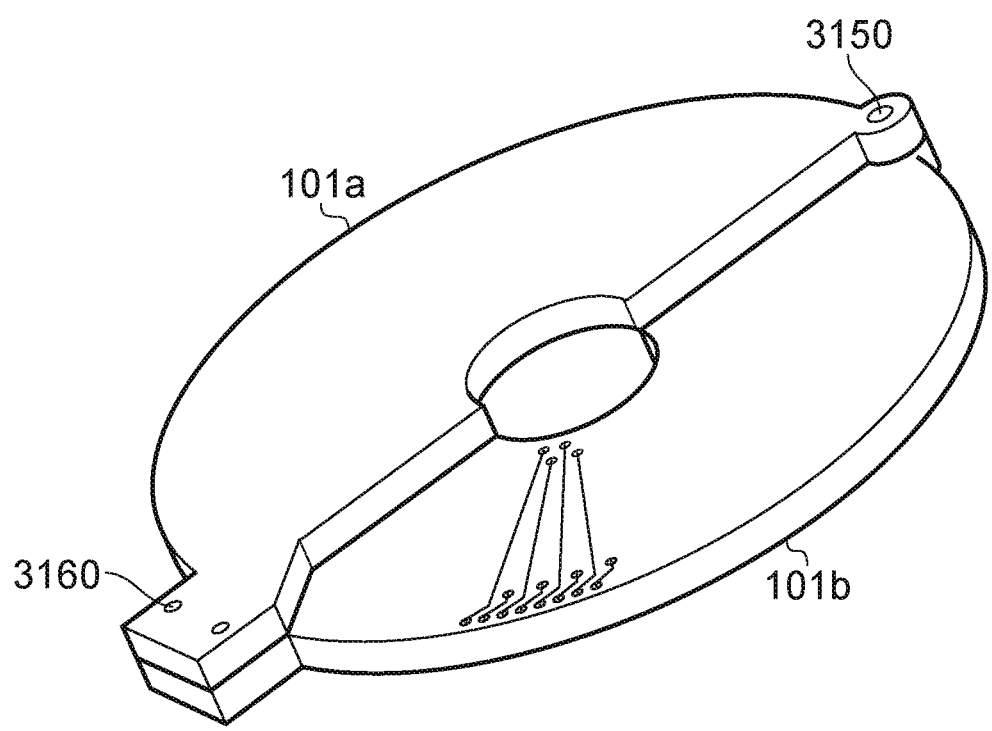
FIGS. 45a and 45b show respective representations of a current sensor formed so as to be retrofittable around an existing target conductor.
Figure 45B:
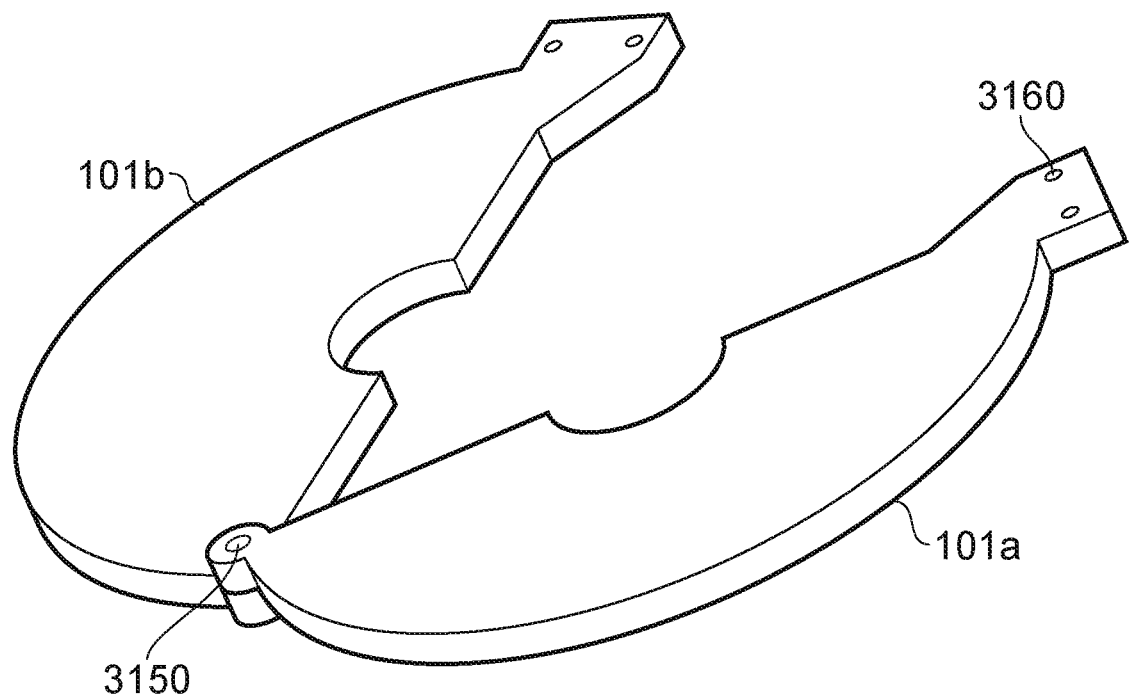

FIGS. 45a and 45b schematically illustrates a Rogowski coil sensor formed of two half boards 101a and 101b each carrying measurement conductors and compensation conductors as described hereinbefore. The boards 101a and 101b are formed in different planes such that they can be pivotably attached to one another by pivot 3150 such that the boards can be moved between a closed position as shown in FIG. 45a and an open position as shown in FIG. 45b. Thus the board can be opened to place it around a target conductor and then closed to commence measurement. The boards may each carry apertures 3160 which line up when the boards are in the closed position. Removable fixings can be placed through the apertures in order to hold the sensor in its closed position. The fixings may mechanically force the boards into contact with one another such that electrical connections can be made between the upper and lower boards. The fixings may themselves be conductive in order to form both mechanical fastening and electrical connection functioning. One of the boards does not have to be half circular as shown here and may have an extension on it to carry further electronic components.

If the circuit carried by the coil board is sufficiently complex that it requires the use of a board with more than two layers then the coils described herein before can be adapted.

Figure 46:
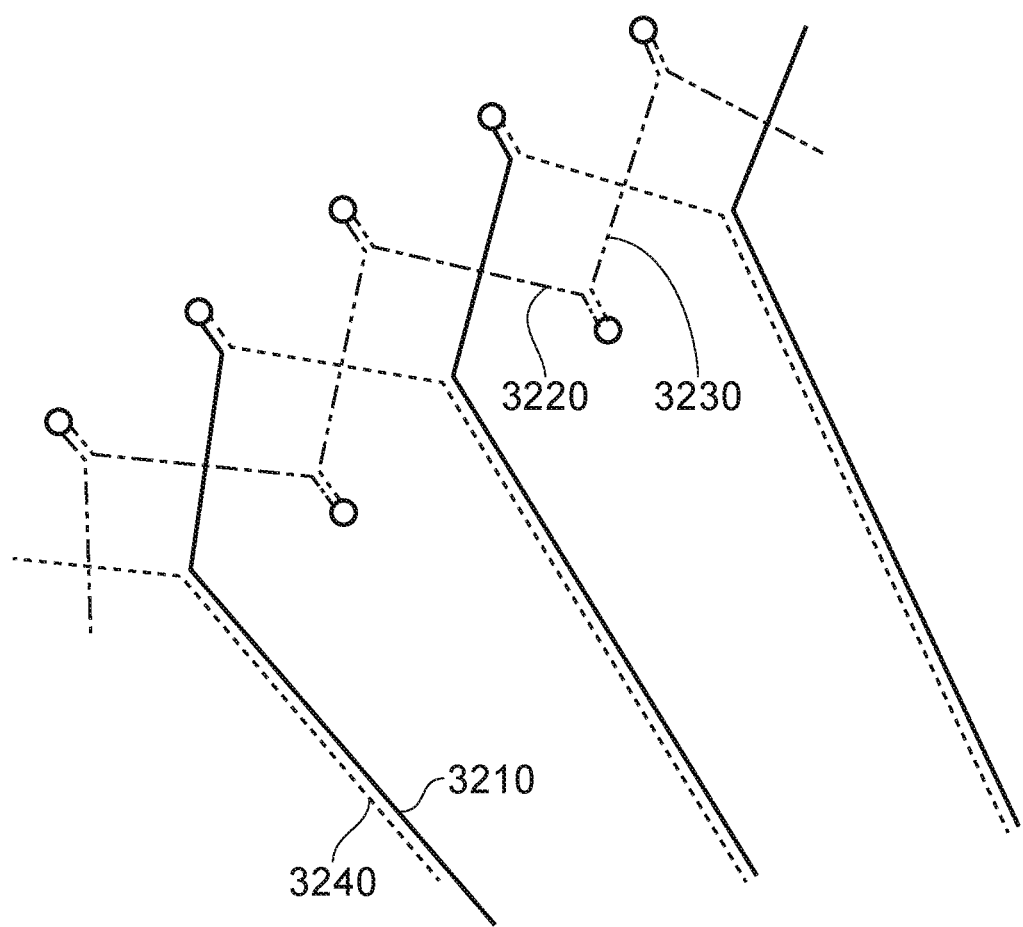
FIG. 46 schematically illustrates the construction of a sensor in accordance with the teachings of this disclosure in a four layer board.

In a four layer board having conductive layers layer 1, layer 2, layer 3 and layer 4, then the measurement conductors 105S, 105L and connecting regions 111 of FIGS. 4 and 5 can be formed in, for example layer 1. The measurement conductors 135S and 135L and their respective connecting regions (as shown in FIG. 6) can be formed in layer 4. In one variation of the conductors 120 and 140 of the compensation conductor can also be formed in layers 1 and 4. In an alternative arrangement they can both be formed in layers 2 and 3. Such an arrangement is shown in FIG. 46 where the pattern of the conductors is schematically shown. For diagrammatic clarity, conductors which would align with each other, such as the major portions of the radial elements are shown slightly offset.

Conductors in layer 1 are represented by solid line 3210. Conductors in layer 2 are represented by chain dot line 3220. Conductors in layer 3 are represented by double chain-double dot line 3230 and conductors in layer 4 are represented by broken line 3240.

In these arrangements the shape, in plan view, of the compensation coil exactly matches the shape of the measurement coil advancement. Consequently and interfering fields should induce the same response in the measurement coil and the compensation coil. Furthermore the effective position of the coils perpendicular to the surface of the board is such that they are effectively coincident.

The current measurement apparatus may be provided in association with a voltage measurement apparatus to provide a power (watt-hour) meter.

The coils described herein can be used in conjunction with tamper checking and calibration systems, for example such as described in WO2013/038176, "Current measurement" the content of which is incorporated by reference.

It is thus possible to provide a robust, accurate and relatively inexpensive rate of change of current detector based around a measurement coil formed on a double sided circuit board. A double sided board can be formed by securing two single sided boards together and such an arrangement is within the teachings of this disclosure.

The sensors have been discloser herein in the context of power metering. However they can also be used circuit breakers and fault detection, (particularly in the transmission and distribution market), were they can be used to sense the overcurrent. Examples of these are MCCB (moulded case circuit breakers) and ACCB (air core circuit breakers), and FCI (Fault Circuit Indicators). The ability to work with high currents and at high frequency are key reasons why Rogowski type sensors are applicable to these applications. Similarly such Rogowski coil type sensors can be used for in building as fault detectors e.g. an Arc Fault Circuit Interrupters (AFCI).

Such Rogowski style sensors can also be used in "internet of things" (IOT) current/energy monitoring. For example for energy usage optimisation or for equipment health detection. In the former example such sensors enable low-cost and easy attachment at multiple measurement points, in the latter case such sensors are useful for electrical signature analysis, which may be indicative either of the equipment performing normally/abnormally, or matching a characteristic that is indicative of a known failure mechanism (eg a spur in the frequency response of the current taken by an induction motor, if in the right place is indicative of a Rotor fault)

Although the claims are presented in single dependency format suitable for use at the USTPO it is to be understood that any claim may depend on any preceding claim except where that is clearly not feasible.

The invention claimed is:

1. A rate of change of current sensor formed on a substrate, the substrate having a first side and a second side and including an aperture or path for at least one current carrying conductor formed within the substrate, the sensor comprising:
   the substrate;
   a plurality of measurement conductors arranged on the first and second sides of the substrate and spaced around the aperture such that each measurement conductor has a major portion that extends away from the aperture or the path for the at least one current carrying conductor from a first end to a second end, wherein the first end is nearer the aperture than the second end, and wherein the major portions of the measurement conductors on the first and second sides are aligned with one another and connected by vias through the substrate so as to form a measurement coil formed into a loop;
   wherein the measurement conductors include a first set of connection portions at the first end and a second set of connection portions at the second end, each connection portion disposed at an angle to the major portion and leading towards a via to make contact with an immediately adjacent measurement conductor on the opposite side of the substrate, and
   wherein the sensor further comprises a compensation conductor following a meandering path adjacent one single set of connection portions of either the first set of connections portions or the second set of connection portions.

2. A sensor as claimed in claim 1, in which the connection portions of the first set of connection portions and the second set of connection portions on the first side of the substrate are disposed at a positive angle with respect to the direction of advancement of the measurement coil, and the one set of connection portions connection portions cross portions of the compensation conductor formed on the second side of the substrate, the portions of the compensation conductor on the second side being disposed at a negative angle with respect to the direction of advancement of the measurement coil.

3. A sensor as claimed in claim 1 in which the connection path between adjacent measurement conductors traverses between the first and second sides of the substrate at a position which is between the pair of measurement conductors.

4. A sensor as claimed in claim 1, in which the compensation conductor comprises an alternating pattern of first conductors on the first side of the substrate and second conductors on the second side of the substrate.

5. A sensor as claimed in claim 1, in which the respective major portions of measurement conductors on the first side align with respective major portions of measurement conductors on the second side.

6. A sensor as claimed in claim 5, in which respective major portions of measurement conductors on the first side overlap with respective major portions of measurement conductors on the second side.

7. A sensor as claimed in claim 1 in which the first ends of adjacent measurement conductors are formed at a plurality of distances from the aperture or the at least one current carrying conductor.

8. A sensor as claimed in claim 1, wherein the sensor comprises a first plurality of vias arranged on a first geometric shape, a second plurality of vias arranged on a second geometric shape, a third plurality of vias arranged on third geometric shape, where the first to third shapes are the same and concentric but of different sizes, and where vias of the first and second groups are closer to the aperture and the first vias are connected to measurement conductors of a first length and the second vias are connected to measurement conductors of a second length.

9. A sensor as claimed in claim 8, where the compensation conductor comprises segments of conductor formed in alternating sequence on the first and second sides of the board, and connected by a first set of compensation conductor vias and a second set of compensation conductor vias; and in which the first set of compensation conductor vias are arranged on a fourth geometric shape and the second set of compensation conductor vias are arranged on a fifth geometric shape, where the fourth geometric shape is smaller than the fifth geometric shape.

10. A sensor as claimed in claim 9, in which the fifth geometric shape is the same size as the third geometric shape.

11. A sensor as claimed in claim 8, in which the geometric shapes are circular.

12. A sensor as claimed in claim 8, where the second set of connection portions meander about a further geometric shape which has the same shape as the third geometric shape.

13. A sensor as claimed in claim 12, in which the compensation conductor meanders about the further geometric path.

14. A sensor as claimed in claim 8, in which the geometric shape is rectangular.

15. A sensor as claimed in claim 1, where the substrate is a double sided printed circuit board.

16. A sensor as claimed, in claim 1, wherein the substrate is coupled to a printed circuit board comprising other components.

17. A sensor as claimed in claim 1 in which the current carrying conductor makes a plurality of loops around the sensor.

18. A sensor as claimed in claim 1 in which a first and a second current carrying conductor pass through a shared, rate-change current sensor, and define current flow paths being in opposition to each other.

19. A sensor as claimed in claim 1 comprising:
at least two measurement coils, each measuring the current through a respective current carrying conductor; and
a circuit for combining the outputs of the measurement coils.

20. A sensor as clamed in claim 1, in which the sensor is formed on a multiple layer board having a first conductive layer and a second conductive layer, where measurement conductors are formed in the first and second conductive layers, and the compensation conductors are formed in the first and second conductive layers.

21. A sensor as clamed in claim 19, in which the sensor is formed on the multiple layer board further including a third conductive layer and a fourth conductive layer, where measurement conductors are formed in the first and fourth conductive layers, and the compensation conductors are formed in the second and third conductive layers, or in the first and fourth conductive layers.

22. The sensor as claimed in claim 1, included in or in combination with a power meter.

23. A sensor as claimed in claim 1, wherein the compensation conductor comprises an alternating pattern of first conductors on the first side of the substrate and second conductors on the second side of the substrate.

24. A sensor as claimed in claim 1, wherein the substrate is formed of two half boards pivotably attached so as to be movable between an open position and a closed position.

25. A sensor as claimed in claim 24, wherein the two halfboards are held in a closed position by a removable fixing placed through apertures through the substrate which line up when the half boards are in the closed position.

26. A sensor as claimed in claim 24, wherein the removable fixing forces the two half boards into contact with each other.

27. A sensor as claimed in claim 26, wherein the removable fixing is conductive.

28. The sensor of claim 1, wherein the sensor is in combination with an amplifier including a gain compensation arrangement for adjusting the gain of the amplifier as a function of temperature to mitigate an effect of thermal expansion of the sensor.

29. The sensor of claim 28, in which the amplifier is provided in a Virtual earth configuration and wherein an input resistor of the amplifier is provided in series with the sensor; the temperature coefficient of resistance of the input resistor being less than the temperature coefficient of resistance of the sensor.

30. The sensor of claim 29, in which the input resistor has a resistance value of between 300 and 1000 ohms.

31. A sensor formed on a substrate, the substrate having a first side and a second side and including an aperture or path for at least one current carrying conductor formed within the substrate, the sensor comprising:
the substrate;
a plurality of measurement conductors arranged on the first and second sides of the substrate and spaced around the aperture such that each measurement conductor has a major portion that extends away from the aperture or the path for the at least one current carrying conductor from a first end to a second end, wherein the first end is nearer the aperture than the second end, and wherein the major portions of the measurement conductors on the first and second sides are aligned with one another and connected by vias through the substrate so as to form a measurement coil formed into a loop;
wherein the measurement conductors include a connection portion disposed at an angle to the major portion and leading towards a via to make contact with an immediately adjacent measurement conductor on the opposite side of the substrate;
wherein the sensor further comprises a compensation conductor following a meandering path adjacent the connection portions; and
wherein the sensor comprises a first plurality of vias arranged on a first geometric shape, a second plurality of vias arranged on a second geometric shape, a third plurality of vias arranged on third geometric shape, where the first, second, and third shapes are the same and concentric but of different sizes, and where vias of the first and second plurality of vias are closer to the aperture than the third plurality of wins and the first vias are connected to measurement conductors and the second vias are connected to measurement conductors.

32. The sensor of claim 31, the compensation conductor is configured to compensate an output of the sensor for one or more parasitic fields perpendicular to the major surface of the substrate of the measurement conductors formed at the connection portion.

33. A method of measuring total power consumed by a supply having at least three wires using a sensor comprising:
a substrate having a first side and a second side and including an aperture or path for at least one current carrying conductor formed within the substrate;
a plurality of measurement conductors arranged on the first and second sides of the substrate and spaced around the aperture such that each measurement conductor has a major portion that extends away hunt the aperture or the path for the at least one current carrying conductor from a first end to a second end, wherein the first end is nearer the aperture than the second end, and wherein the major portions of the measurement conductors on the first and second sides are aligned with one another and connected by vias through the substrate so as to form a measurement coil into a loop;
wherein the measurement conductors include a first set of connection portions at the first end and a second set of connection portions at the second end, each connection portion disposed at an angle to the major portion and leading towards a via to make contact with an immediately adjacent measurement conductor on the opposite side of the substrate, and
wherein the sensor further comprises a compensation conductor following a meandering path adjacent one particular set of connection portions of either the first set of connections portions or the second set of connection portions;
the method comprising :
measuring current and voltage front a first current carrying element extending through the aperture from an underside of the substrate to a topside of the substrate;
measuring current and voltage from a second current carrying element, carrying current that is 180 degrees out of phase from the first current carrying element, extending through the aperture from the underside of the substrate to the to the topside of the substrate;
approximating a voltage on a neutral element based on the measured voltages from the first current carrying element and the second current carrying element; and
calculating total power by using the measured current and voltage measurements from both the first and second current carrying elements along with the approximated voltage from the neutral element.

34. The method of claim 33, wherein the first current carrying element is arranged to make several passes through the sensor.

35. The method of claim 33, wherein the second current carrying element is arranged to make several passes through the sensor.

36. The method of claim 33, wherein the first, and second current carrying elements include insulated wires.

37. A method of measuring total power consumed by a supply having at least three wires using a sensor on each current carrying element, the sensor comprising:
- a substrate having a first side and a second side and including an aperture or path for at least one current carrying conductor formed within the substrate;
- a plurality of measurement conductors arranged on the first and second sides of the substrate and spaced around the aperture such that each measurement conductor has a major portion that extends away hunt the aperture or the path for the at least one current carrying conductor from a first end to a second end wherein the first end is nearer the aperture than the second end, and wherein the major portions of the measurement conductors on the first and, second sides are aligned with one another and connected by vias through the substrate so as to form a measurement coil into a loop;
- wherein the measurement conductors include a first set of connection portions at the first end and a second set of connection portions at the second end, each connection portion disposed at an angle to the major portion and leading towards a via to make contact with an immediately adjacent measurement conductor on the opposite side of the substrate, and
- wherein the sensor further comprises a compensation conductor following a meandering path adjacent one particular set of connection portions of either the first set of connections portions or the second set of connection portions; the method comprising
- measuring current and voltage front a first current carrying element extending through the aperture of a first sensor from an underside of the substrate to a topside of the substrate;
- measuring current and voltage from a second current carrying element extending through the aperture of a second sensor placed on the substrate from underside of the substrate to the to the topside of the substrate;
- approximating a voltage on a neutral element based, on the measured voltage from the first current carrying element and the second current carrying element; and
- calculating total power by using the measured current and voltage measurements from both the first and second current carrying elements along with the approximated voltage from the neutral element.

* * * * *

UNITED STATES PATENT AND TRADEMARK OFFICE
CERTIFICATE OF CORRECTION

PATENT NO. : 10,859,605 B2
APPLICATION NO. : 15/453100
DATED : December 8, 2020
INVENTOR(S) : Jonathan Ephraim David Hurwitz It is certified that error appears in the above-identified patent and that said Letters Patent is hereby corrected as shown below:

In the Claims

In Column 27, Line 25, in Claim 1, delete "rate of change of" and insert --rate-change-- therefor In Column 27, Line 41, in Claim 1, after "coil", delete "formed"

In Column 27, Line 52, in Claim 1, delete "single" and insert --particular-- therefor In Column 27, Line 53, in Claim 1, delete "connections" and insert --connection-- therefor In Column 27, Line 55, in Claim 2, delete "A" and insert --The-- therefor In Column 27, Line 60, in Claim 2, delete "connection portions connection portions" and insert --connection portions-- therefor In Column 27, Line 66, in Claim 3, delete "A" and insert --The-- therefor In Column 28, Line 4, in Claim 4, delete "A" and insert --The-- therefor In Column 28, Line 8, in Claim 5, delete "A" and insert --The-- therefor In Column 28, Line 12, in Claim 6, delete "A" and insert --The-- therefor In Column 28, Line 16, in Claim 7, delete "A" and insert --The-- therefor In Column 28, Line 21, in Claim 8, delete "A" and insert --The-- therefor In Column 28, Line 25, in Claim 8, delete "first to" and insert --first, second, and-- therefor In Column 28, Line 27, in Claim 8, delete "groups" and insert --plurality of vias-- therefor Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,859,605 B2

In Column 28, Line 27, in Claim 8, after "aperture", insert --then the third plurality of vias--

In Column 28, Line 28, in Claim 8, before "vias", insert --plurality of--

In Column 28, Line 29, in Claim 8, before "vias", insert --plurality of--

In Column 28, Line 31, in Claim 9, delete "A" and insert --The-- therefor

In Column 28, Lines 33-34, in Claim 9, delete "board, and connected" and insert --substrate, and where the compensation conductor is respectively connected to the substrate-- therefor In Column 28, Line 42, in Claim 10, delete "A" and insert --The-- therefor In Column 28, Line 45, in Claim 11, delete "A" and insert --The-- therefor In Column 28, Line 47, in Claim 12, delete "A" and insert --The-- therefor In Column 28, Line 51, in Claim 13, delete "A" and insert --The-- therefor In Column 28, Line 54, in Claim 14, delete "A" and insert --The-- therefor In Column 28, Line 56, in Claim 15, delete "A" and insert --The-- therefor In Column 28, Line 56, in Claim 15, delete "claim l," and insert --claim 1,-- therefor In Column 28, Line 58, in Claim 16, delete "A" and insert --The-- therefor In Column 28, Line 58, in Claim 16, delete "claim l," and insert --claim 1,-- therefor In Column 28, Line 61, in Claim 17, delete "A" and insert --The-- therefor In Column 28, Line 61, in Claim 17, delete "claim l" and insert --claim 1,-- therefor In Column 28, Line 64, in Claim 18, delete "A" and insert --The-- therefor In Column 28, Line 65, in Claim 18, delete "shared," and insert --shared-- therefor In Column 29, Line 1, in Claim 19, delete "A" and insert --The-- therefor In Column 29, Line 7, in Claim 20, delete "A" and insert --The-- therefor In Column 29, Line 7, in Claim 20, delete "clamed" and insert --claimed-- therefor In Column 29, Line 13, in Claim 21, delete "A" and insert --The-- therefor In Column 29, Line 13, in Claim 21, delete "clamed" and insert --claimed-- therefor

CERTIFICATE OF CORRECTION (continued)
U.S. Pat. No. 10,859,605 B2

In Column 29, Line 13, in Claim 21, delete "claim 19," and insert --claim 20,-- therefor In Column 29, Line 20, in Claim 22, delete "claim l," and insert --claim 1,-- therefor In Column 29, Line 22, in Claim 23, delete "A" and insert --The-- therefor In Column 29, Line 22, in Claim 23, delete "claim l," and insert --claim 1,-- therefor In Column 29, Line 26, in Claim 24, delete "A" and insert --The-- therefor In Column 29, Line 26, in Claim 24, delete "claim l," and insert --claim 1,-- therefor In Column 29, Line 29, in Claim 25, delete "A" and insert --The-- therefor In Column 29, Line 30, in Claim 25, delete "halfboards" and insert --half boards-- therefor In Column 29, Line 33, in Claim 26, delete "A" and insert --The-- therefor In Column 29, Line 36, in Claim 27, delete "A" and insert --The-- therefor In Column 29, Line 44, in Claim 29, delete "Virtual" and insert --virtual-- therefor In Column 29, Line 46, in Claim 29, delete "sensor;" and insert --sensor,-- therefor In Column 29, Line 50, in Claim 30, delete "300" and insert --100-- therefor In Column 30, Line 16, in Claim 31, delete "wins" and insert --vias-- therefor In Column 30, Line 32, in Claim 33, delete "hunt" and insert --from-- therefor In Column 30, Line 50, in Claim 33, delete "connections" and insert --connection-- therefor In Column 30, Line 52, in Claim 33, delete "comprising :" and insert --comprising:-- therefor In Column 30, Line 53, in Claim 33, delete "front" and insert --from-- therefor In Column 30, Line 60, in Claim 33, delete "to the to the" and insert --to the-- therefor In Column 31, Line 7, in Claim 36, delete "first," and insert --first-- therefor In Column 31, Line 18, in Claim 37, delete "hunt" and insert --from-- therefor In Column 31, Line 20, in Claim 37, delete "end" and insert --end,-- therefor In Column 31, Line 23, in Claim 37, delete "and," and insert --and-- therefor

CERTIFICATE OF CORRECTION (continued)
U.S. Pat. No. 10,859,605 B2

In Column 32, Line 9, in Claim 37, delete "connections" and insert --connection-- therefor In Column 32, Line 10, in Claim 37, after "portions;" insert a line break In Column 32, Line 10, in Claim 37, delete "comprising" and insert --comprising:-- therefor In Column 32, Line 11, in Claim 37, delete "front" and insert --from-- therefor In Column 32, Line 18, in Claim 37, delete "to the to the" and insert --to the-- therefor In Column 32, Line 19, in Claim 37, delete "based," and insert --based-- therefor